(12) United States Patent
Wang et al.

(10) Patent No.: US 9,507,887 B1
(45) Date of Patent: Nov. 29, 2016

(54) ADAPTIVE TECHNIQUES FOR WORKLOAD DISTRIBUTION ACROSS MULTIPLE STORAGE TIERS

(71) Applicant: EMC Corporation, Hopkinton, MA (US)

(72) Inventors: Hui Wang, Upton, MA (US); Marik Marshak, Newton, MA (US); Sean C. Dolan, Southborough, MA (US); Xiaomei Liu, Natick, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 863 days.

(21) Appl. No.: 13/798,225

(22) Filed: Mar. 13, 2013

(51) Int. Cl.
*G06F 9/45* (2006.01)
*G06F 17/50* (2006.01)

(52) U.S. Cl.
CPC .................................. *G06F 17/5009* (2013.01)

(58) Field of Classification Search
CPC ....................... G06F 17/5004; G06F 17/5009
See application file for complete search history.

(56) References Cited

U.S. PATENT DOCUMENTS

| | | | |
|---|---|---|---|
| 7,356,452 B1 * | 4/2008 | Naamad | G06F 11/3433 703/21 |
| 7,822,939 B1 | 10/2010 | Veprinsky et al. | |
| 7,949,637 B1 * | 5/2011 | Burke | G06F 3/0605 707/655 |
| 8,095,764 B1 * | 1/2012 | Bauer | G06F 3/0605 711/162 |
| 8,239,584 B1 * | 8/2012 | Rabe | G06F 3/0605 710/8 |
| 8,433,848 B1 | 4/2013 | Naamad et al. | |
| 8,566,546 B1 | 10/2013 | Marshak et al. | |
| 8,566,553 B1 | 10/2013 | Marshak et al. | |
| 8,583,838 B1 | 11/2013 | Marshak et al. | |
| 8,688,878 B1 | 4/2014 | Dolan et al. | |
| 8,838,931 B1 | 9/2014 | Marshak et al. | |
| 8,862,837 B1 | 10/2014 | Marshak et al. | |
| 8,868,797 B1 | 10/2014 | Kirac et al. | |
| 8,868,798 B1 | 10/2014 | Marshak et al. | |
| 8,935,493 B1 | 1/2015 | Dolan et al. | |
| 8,949,483 B1 | 2/2015 | Martin | |
| 8,972,694 B1 | 3/2015 | Dolan et al. | |
| 9,003,157 B1 | 4/2015 | Marshak et al. | |
| 9,026,765 B1 | 5/2015 | Marshak et al. | |
| 9,047,017 B1 | 6/2015 | Dolan et al. | |

(Continued)

OTHER PUBLICATIONS

John Harker, "Tiered Storage Design Guide," 2010, Hitachi Data Systems Corporation, pp. 1-20.*

(Continued)

*Primary Examiner* — Aniss Chad
*Assistant Examiner* — Russ Guill
(74) *Attorney, Agent, or Firm* — Muirhead and Saturnelli, LLC

(57) ABSTRACT

Described are techniques for performing data storage optimizations. A reserved workload for a first of a plurality of storage tiers is determined. Each of the plurality of storage tiers is characterized by a set of one or more attributes. The first storage tier includes performance characteristics which are any of incomplete, unknown, and unable to be predictively modeled for various workloads. The plurality of storage tiers includes the first tier and a remaining set of additional storage tier(s). Performance is modeled of a first workload distributed among the remaining set of storage tiers. The first workload represents a total workload less the reserved workload. One or more data movements are determined in accordance with the modeling. Each data movement moves a data portion from a first physical device of one of the plurality of storage tiers to a second physical device of another of the plurality of storage tiers.

19 Claims, 40 Drawing Sheets

(56) References Cited

U.S. PATENT DOCUMENTS

| | | | |
|---|---|---|---|
| 9,052,830 B1 | 6/2015 | Marshak et al. | |
| 2004/0172220 A1* | 9/2004 | Prekeges | G06F 11/3452 702/186 |
| 2007/0198797 A1* | 8/2007 | Kavuri | G06F 3/061 711/165 |
| 2007/0234365 A1* | 10/2007 | Savit | G06F 9/505 718/104 |
| 2009/0070541 A1 | 3/2009 | Yochai | |
| 2012/0197624 A1* | 8/2012 | Hawargi | G06F 3/0604 703/21 |

OTHER PUBLICATIONS

"EMC FAST for CLARiiON," 2011, EMC Corporation, pp. 1-13.*

Suzhen Wu et al., "WorkOut: I/O Workload Outsourcing for Boost[ing RAID Reconstruction Performance," 2009, FAST 09 7th Usenix Conference on File and Storage Technologies, pp. 239-252.*

Irfan Ahmad, "Easy and efficient disk i/o workload characterization in vmware esx server," 2007, IEEE International Symposium on Workload Characterization, pp. 149-158.*

Terence Kelly et al., "Inducing models of black-box storage arrays," 2004, Hewlett-Packard Company, pp. 1-14.*

Sahin, et al., "Indentifying Data for Placement in a Storage System," U.S. Appl. No. 13/135,261, filed Jun. 30, 2011.

Sahin, et al., "Location of Data Among Storage Tiers," U.S. Appl. No. 13/135,265, filed Jun. 30, 2011.

Dolan, et al., "Data Storage System Modeling," U.S. Appl. No. 13/729,680, filed Dec. 28, 2012.

Martin, "Using Response Time Objectives in a Storage System," U.S. Appl. No. 13/729,618, filed Dec. 28, 2012.

Marshak, et al., Automatic Adjustment of Capacity Usage by Data Storage Optimizer for Data Migration, U.S. Appl. No. 13/611,868, filed Sep. 12, 2012.

* cited by examiner

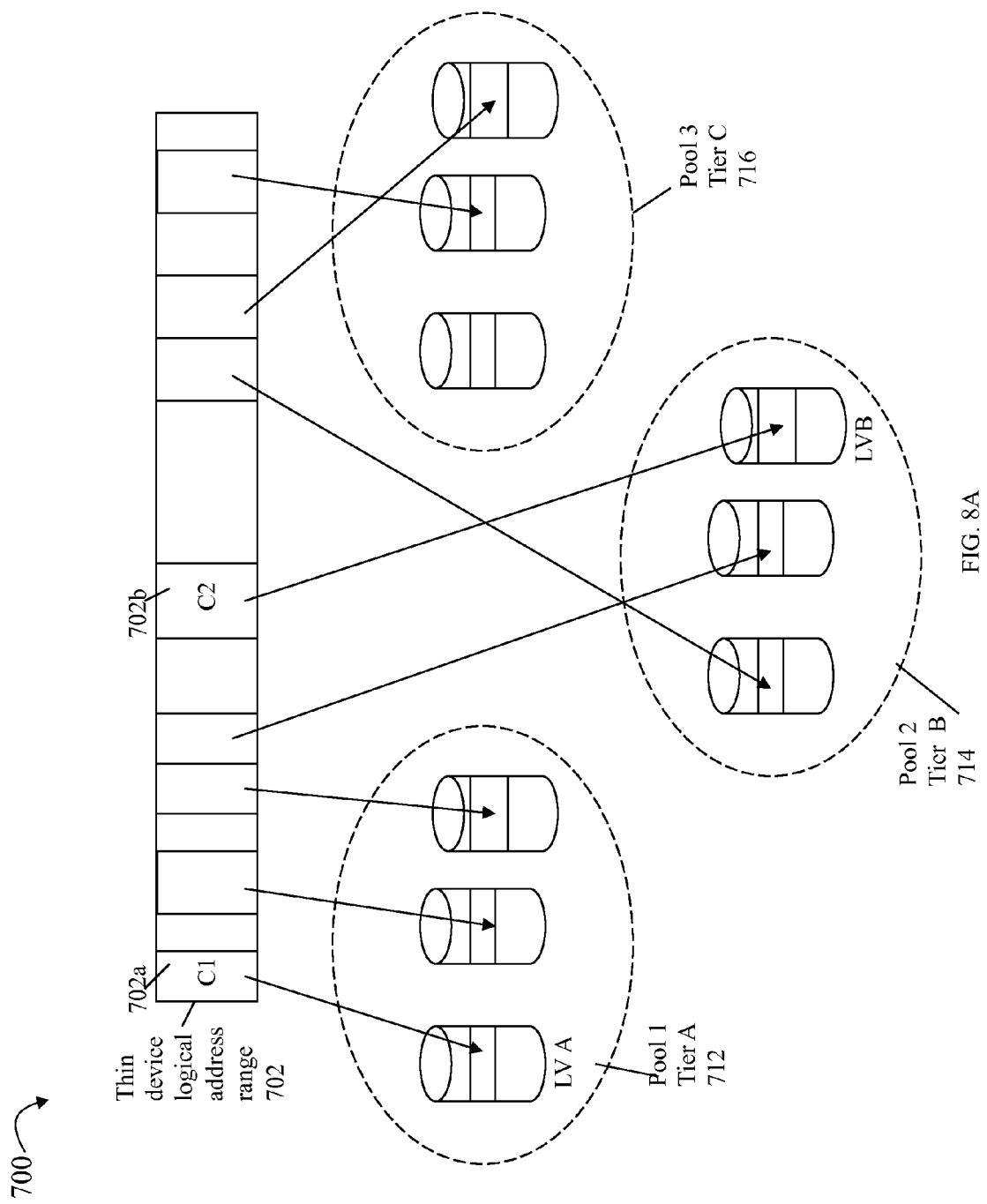

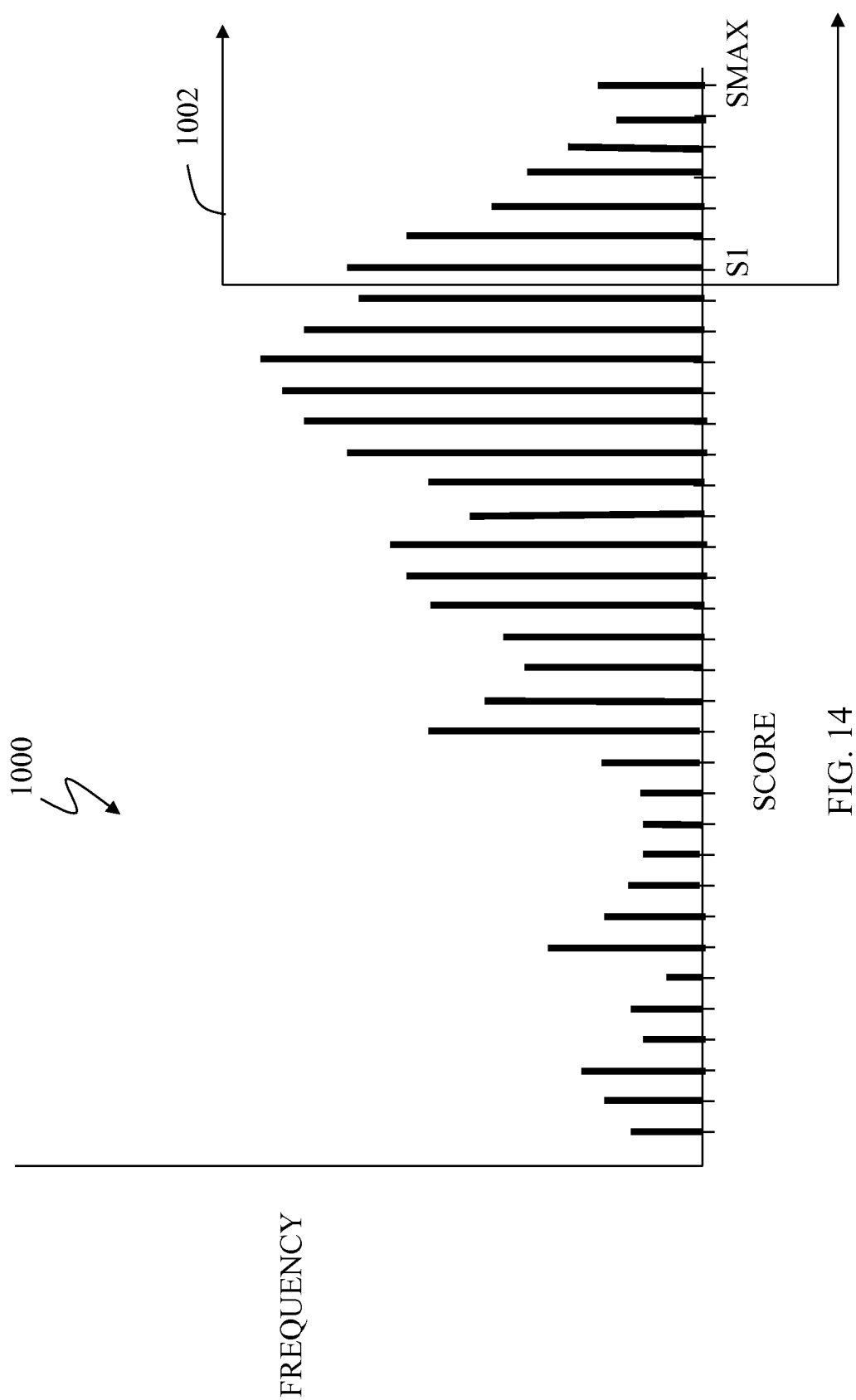

Row 1610 → 0, 1, 2
Column 1612 ↓

| | 0 | 1 | 2 |
|---|---|---|---|
| 0 | (Pos, sign, A, B, P)<br>(0,  1, 0, 0, 0)<br>(1,  1, 0, 0, 0)<br>(2,  1, 0, 0, 0) | (Pos, sign, A, B, P)<br>(0,  1, .01, .5, .1)<br>(1,  1, .06, .3, .08)<br>(2,  1, .03, .1, .06) | (Pos, sign, A, B, P)<br>(0,  1, .1, .5, .1)<br>(1,  1, .06, .3, .08)<br>(2,  1, .03, .1, .06) |
| 1 | (Pos, sign, A, B, P)<br>(0, -1, .1, .5, .1)<br>(1, -1, .06, .3, .08)<br>(2, -1, .03, .1, .06) | (Pos, sign, A, B, P)<br>(0, -1, 0, .5, 0)<br>(1, -1, 0, .3, 0)<br>(2, -1, 0, .1, 0) | (Pos, sign, A, B, P)<br>(0, -1, .1, .5, .1)<br>(1, -1, .06, .3, .08)<br>(2, -1, .03, .1, .06) |
| 2 | (Pos, sign, A, B, P)<br>(0, 0, 0, .5, .01)<br>(1, 0, 0, .3, .01)<br>(2, 0, 0, .1, .01) | (Pos, sign, A, B, P)<br>(0,  1, .1, .5, .1)<br>(1,  1, .06, .3, .08)<br>(2,  0, .03, .1, .06) | (Pos, sign, A, B, P)<br>(0, 0, 0, .5, .01)<br>(1, 0, 0, .3, .01)<br>(2, 0, 0, .1, .01) |

ADAPTIVE TECHNIQUES FOR WORKLOAD DISTRIBUTION ACROSS MULTIPLE STORAGE TIERS

BACKGROUND

1. Technical Field

This application generally relates to data storage, and more particularly to techniques used in connection with data storage optimizations.

2. Description of Related Art

Computer systems may include different resources used by one or more host processors. Resources and host processors in a computer system may be interconnected by one or more communication connections. These resources may include, for example, data storage devices such as those included in the data storage systems manufactured by EMC Corporation. These data storage systems may be coupled to one or more host processors and provide storage services to each host processor. Multiple data storage systems from one or more different vendors may be connected and may provide common data storage for one or more host processors in a computer system.

A host processor may perform a variety of data processing tasks and operations using the data storage system. For example, a host processor may perform basic system I/O operations in connection with data requests, such as data read and write operations.

Host processor systems may store and retrieve data using a storage device containing a plurality of host interface units, disk drives, and disk interface units. Such storage devices are provided, for example, by EMC Corporation of Hopkinton, Mass. The host systems access the storage device through a plurality of channels provided therewith. Host systems provide data and access control information through the channels to the storage device and storage device provides data to the host systems also through the channels. The host systems do not address the disk drives of the storage device directly, but rather, access what appears to the host systems as a plurality of logical disk units, logical devices, or logical volumes (LVs). The logical disk units may or may not correspond to the actual disk drives. Allowing multiple host systems to access the single storage device unit allows the host systems to share data stored therein.

In connection with data storage, a variety of different technologies may be used. Data may be stored, for example, on different types of disk devices and/or flash memory devices. The data storage environment may define multiple storage tiers in which each tier includes physical devices or drives of varying technologies, performance characteristics, and the like. The physical devices of a data storage system, such as a data storage array, may be used to store data for multiple applications.

SUMMARY OF THE INVENTION

In accordance with one aspect of the invention is a method for performing data storage optimizations comprising: determining a reserved workload for a first of a plurality of storage tiers, each of the plurality of storage tiers characterized by a set of one or more attributes, wherein said first storage tier includes performance characteristics which are any of incomplete, unknown, and unable to be predictively modeled for various workloads, said plurality of storage tiers including the first tier and a remaining set of one or more additional storage tiers; modeling performance of a first workload distributed among the remaining set of storage tiers, wherein said first workload represents a total workload less the reserved workload; and determining one or more data movements in accordance with said modeling, each of said one or more data movements moving a data portion from a first physical device of one of the plurality of storage tiers to a second physical device of another of the plurality of storage tiers. Response time performance of the first tier may be unable to be predictively modeled for various I/O workloads and response time performance of each storage tier in the remaining set may be predictively modeled for various I/O workloads in said modeling. The step of determining the reserved workload may further include selecting a second storage tier from the remaining set, wherein said second storage tier is ranked as having a minimum classification ranking of all storage tiers in the remaining set; and determining a difference between a first average observed response time for the first storage tier and a modeled average response time for the second storage tier. The reserved workload may be determined in accordance with one or more criteria including said difference. The reserved workload for a current processing iteration may be equal to a previous reserved workload and a delta amount. The previous reserved workload may have be determined for the first storage tier at a second processing iteration performed prior to the current processing iteration and a previous delta amount being determined in the second processing iteration. The criteria may include the previous delta amount. The criteria may include any of a total workload running in the first storage tier and a total workload running in the second storage tier. The method may include modeling performance of the total workload distributed among the remaining set of storage tiers. The step of modeling performance of the total workload may be performed prior to the steps of determining a reserved workload for a first of a plurality of storage tiers, modeling performance of a first workload distributed among the remaining set of storage tiers, and determining one or more data movements in accordance with said modeling. Each of the one or more data movements may move a data portion from a first physical device of one of the plurality of storage tiers to a second physical device of another of the plurality of storage tiers. The modeled average response time may be determined in the step of modeling performance of the total workload. The minimum classification ranking may represent that the second storage tier includes physical devices which are expected to have lower response time performance characteristics for a given workload than any other storage tier in the remaining set. The modeling performance of a first workload may include using a histogram of scores representing modeled activity levels of data portions of the remaining set of storage tiers. The one or more data movements may be data movement optimizations. One of the data movement optimizations may be a promotion if a data portion is moved from the first physical device to the second physical device and the second physical device has a second performance classification denoting a higher level of expected response time performance than a first performance classification associated with the first physical device, and the one data movement optimization may otherwise a demotion if the first performance classification is associated with a higher level of performance than said second performance classification. One or more thresholds may identify performance score thresholds and may be dynamically determined using any of a capacity limit and a performance limit. The step of determining the reserved workload may further comprise determining a column index of an entry in a matrix using said previous delta amount;

determining a row index of an entry in a matrix based on said difference; and accessing an entry of the matrix identified by the column index and said row index. The entry may include a plurality of values including constants used in determining said delta amount. Each of the plurality of storage tiers may be characterized by a unique set of one or more properties different from any other unique set of one or more properties characterizing another of the plurality of storage tiers. At least one of the properties of the unique set may relate to a physical device characteristic of physical devices of one of the plurality of storage tiers characterized by said unique set. The step of modeling uses performance curves to model response time performance of storage tiers in the remaining set for various I/O workloads.

In accordance with another aspect of the invention is a computer readable medium comprising code for performing data storage optimizations, the computer readable medium comprising code for: determining a reserved workload for a first of a plurality of storage tiers, each of the plurality of storage tiers characterized by a set of one or more attributes, wherein said first storage tier includes performance characteristics which are any of incomplete, unknown, and unable to be predictively modeled for various workloads, said plurality of storage tiers including the first tier and a remaining set of one or more additional storage tiers; modeling performance of a first workload distributed among the remaining set of storage tiers, wherein said first workload represents a total workload less the reserved workload; and determining one or more data movements in accordance with said modeling, each of said one or more data movements moving a data portion from a first physical device of one of the plurality of storage tiers to a second physical device of another of the plurality of storage tiers.

In accordance with another aspect of the invention is a system comprising: a host which sends I/O requests to a first data storage system; said first data storage system comprising a memory including code stored therein that performs processing comprising: determining a reserved workload for a first of a plurality of storage tiers, each of the plurality of storage tiers characterized by a set of one or more attributes, wherein said first storage tier includes performance characteristics which are any of incomplete, unknown, and unable to be predictively modeled for various workloads, said plurality of storage tiers including the first tier and a remaining set of one or more additional storage tiers; and modeling performance of a first workload distributed among the remaining set of storage tiers, wherein said first workload represents a total workload less the reserved workload; and determining one or more data movements in accordance with said modeling, each of said one or more data movements moving a data portion from a first physical device of one of the plurality of storage tiers to a second physical device of another of the plurality of storage tiers; and a second data storage system including physical devices of the first storage tier, wherein a first I/O request sent from the host to the first data storage system accesses data stored on a physical device of the first storage tier.

BRIEF DESCRIPTION OF THE DRAWINGS

Features and advantages of the present invention will become more apparent from the following detailed description of exemplary embodiments thereof taken in conjunction with the accompanying drawings in which:

FIGS. 8A and 8B are examples illustrating thin devices and associated structures that may be used in an embodiment in accordance with techniques herein;

FIGS. 14, 14A and 16 illustrate histograms that may be used in threshold selection in accordance with techniques herein;

FIG. 26 is an example of a matrix of values that may be used in an embodiment in accordance with techniques herein.

DETAILED DESCRIPTION OF EMBODIMENT(S)

Figure 1:
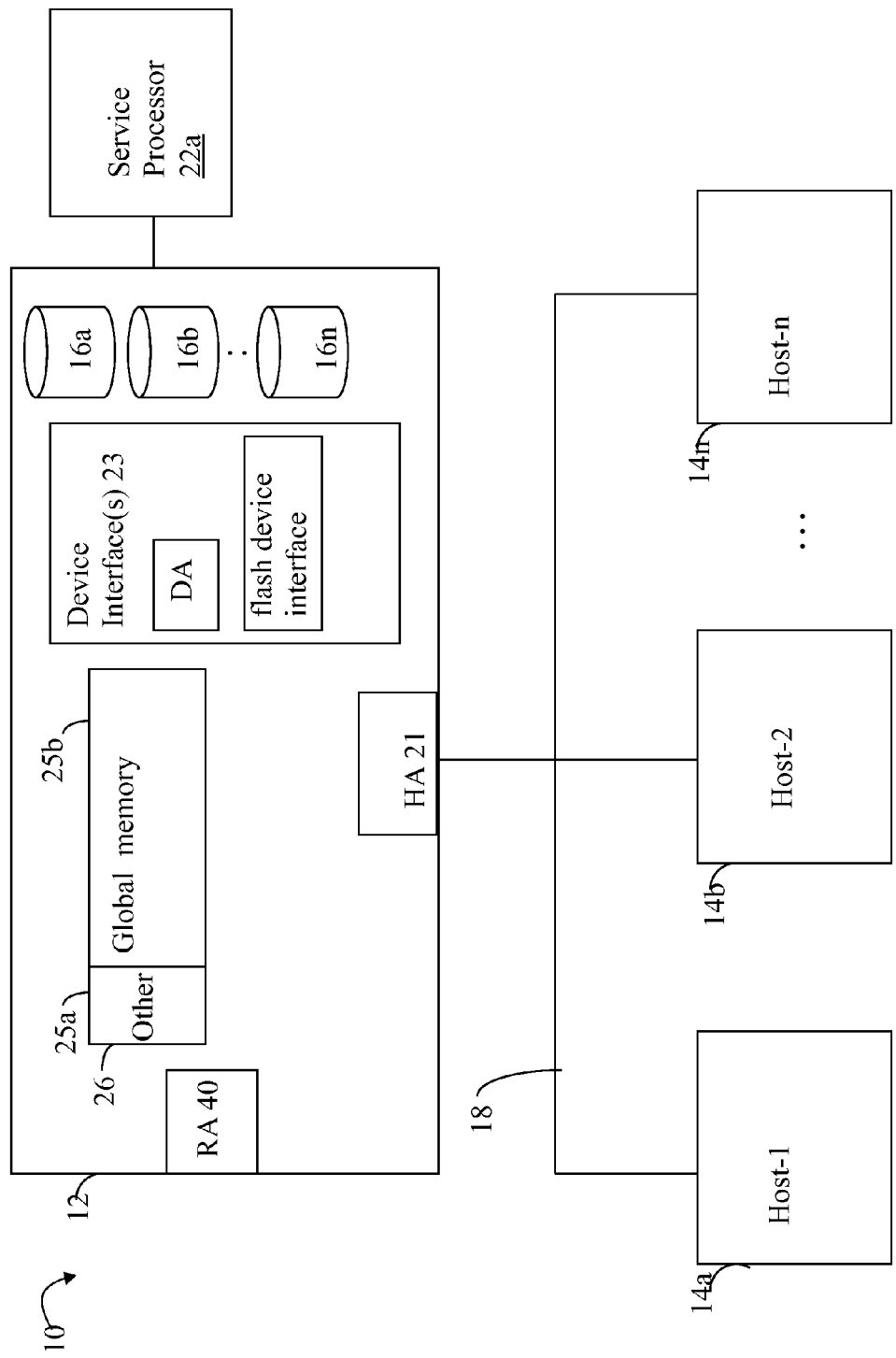
FIG. 1 is an example of an embodiment of a system that may utilize the techniques described herein.

Referring to FIG. 1, shown is an example of an embodiment of a system that may be used in connection with performing the techniques described herein. The system 10 includes a data storage system 12 connected to host systems 14a-14n through communication medium 18. In this embodiment of the computer system 10, and the n hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network (including a Storage Area Network (SAN)) or other wireless or other hardwired connection(s) by which the host systems 14a-14n may access and communicate with the data storage system 12, and may also communicate with other components included in the system 10.

Each of the host systems 14a-14n and the data storage system 12 included in the system 10 may be connected to the communication medium 18 by any one of a variety of connections as may be provided and supported in accordance with the type of communication medium 18. The processors included in the host computer systems 14a-14n may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage system 12 are described herein in more detail, and may vary with each particular embodiment. Each of the host computers 14a-14n and data storage system may all be located at the same physical site, or, alternatively, may also be located in different physical locations. Examples of the communication medium that may be used to provide the different types of connections between the host computer systems and the data storage system of the system 10 may use a variety of different communication protocols such as SCSI, Fibre Channel, iSCSI, and the like. Some or all of the connections by which the hosts and data storage system may be connected to the communication medium may pass through other communication devices, such switching equipment that may exist such as a phone line, a repeater, a multiplexer or even a satellite.

Each of the host computer systems may perform different types of data operations in accordance with different types of tasks. In the embodiment of FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12.

It should be noted that although element 12 is illustrated as a single data storage system, such as a single data storage array, element 12 may also represent, for example, multiple data storage arrays alone, or in combination with, other data storage devices, systems, appliances, and/or components having suitable connectivity, such as in a SAN, in an embodiment using the techniques herein. It should also be noted that an embodiment may include data storage arrays or other components from one or more vendors. In subsequent examples illustrated the techniques herein, reference may be made to a single data storage array by a vendor, such as by EMC Corporation of Hopkinton, Mass. However, as will be appreciated by those skilled in the art, the techniques herein are applicable for use with other data storage arrays by other vendors and with other components than as described herein for purposes of example.

The data storage system 12 may be a data storage array including a plurality of data storage devices 16a-16n. The data storage devices 16a-16n may include one or more types of data storage devices such as, for example, one or more disk drives and/or one or more solid state drives (SSDs). An SSD is a data storage device that uses solid-state memory to store persistent data. An SSD using SRAM or DRAM, rather than flash memory, may also be referred to as a RAM drive. SSD may refer to solid state electronics devices as distinguished from electromechanical devices, such as hard drives, having moving parts. Flash devices or flash memory-based SSDs are one type of SSD that contains no moving parts. As described in more detail in following paragraphs, the techniques herein may be used in an embodiment in which one or more of the devices 16a-16n are flash drives or devices. More generally, the techniques herein may also be used with any type of SSD although following paragraphs may make reference to a particular type such as a flash device or flash memory device.

The data storage array may also include different types of adapters or directors, such as an HA 21 (host adapter), RA 40 (remote adapter), and/or device interface 23. Each of the adapters may be implemented using hardware including a processor with local memory with code stored thereon for execution in connection with performing different operations. The HAs may be used to manage communications and data operations between one or more host systems and the global memory (GM). In an embodiment, the HA may be a Fibre Channel Adapter (FA) or other adapter which facilitates host communication. The HA 21 may be characterized as a front end component of the data storage system which receives a request from the host. The data storage array may include one or more RAs that may be used, for example, to facilitate communications between data storage arrays. The data storage array may also include one or more device interfaces 23 for facilitating data transfers to/from the data storage devices 16a-16n. The data storage interfaces 23 may include device interface modules, for example, one or more disk adapters (DAs) (e.g., disk controllers), adapters used to interface with the flash drives, and the like. The DAs may also be characterized as back end components of the data storage system which interface with the physical data storage devices.

One or more internal logical communication paths may exist between the device interfaces 23, the RAs 40, the HAs 21, and the memory 26. An embodiment, for example, may use one or more internal busses and/or communication modules. For example, the global memory portion 25b may be used to facilitate data transfers and other communications between the device interfaces, HAs and/or RAs in a data storage array. In one embodiment, the device interfaces 23 may perform data operations using a cache that may be included in the global memory 25b, for example, when communicating with other device interfaces and other components of the data storage array. The other portion 25a is that portion of memory that may be used in connection with other designations that may vary in accordance with each embodiment.

The particular data storage system as described in this embodiment, or a particular device thereof, such as a disk or particular aspects of a flash device, should not be construed as a limitation. Other types of commercially available data storage systems, as well as processors and hardware controlling access to these particular devices, may also be included in an embodiment.

Host systems provide data and access control information through channels to the storage systems, and the storage systems may also provide data to the host systems also through the channels. The host systems do not address the drives or devices 16a-16n of the storage systems directly, but rather access to data may be provided to one or more host systems from what the host systems view as a plurality of logical devices or logical volumes (LVs) which are sometimes also referred to as logical units (e.g., LUNs) or more generally logical devices as exposed by the data storage system to the host. The LVs may or may not correspond to the actual physical devices or drives 16a-16n. For example, one or more LVs may reside on a single physical drive or multiple drives. Data in a single data storage system, such as a single data storage array, may be accessed by multiple hosts allowing the hosts to share the data residing therein. The HAs may be used in connection with communications between a data storage array and a host system. The RAs may be used in facilitating communications between two data storage arrays. The DAs may be one type of device interface used in connection with facilitating data transfers to/from the associated disk drive(s) and LV(s) residing thereon. A flash device interface may be another type of device interface used in connection with facilitating data transfers to/from the associated flash devices and LV(s) residing thereon. It should be noted that an embodiment may use the same or a different device interface for one or more different types of devices than as described herein.

The device interface, such as a DA, performs I/O operations on a drive 16a-16n. In the following description, data residing on an LV may be accessed by the device interface following a data request in connection with I/O operations that other directors originate. Data may be accessed by LV in which a single device interface manages data requests in connection with the different one or more LVs that may reside on a drive 16a-16n. For example, a device interface may be a DA that accomplishes the foregoing by creating job records for the different LVs associated with a particular device. These different job records may be associated with the different LVs in a data structure stored and managed by each device interface.

Also shown in FIG. 1 is a service processor 22a that may be used to manage and monitor the system 12. In one embodiment, the service processor 22a may be used in collecting performance data, for example, regarding the I/O performance in connection with data storage system 12. This performance data may relate to, for example, performance measurements in connection with a data request as may be made from the different host computer systems 14a 14n. This performance data may be gathered and stored in a storage area. Additional detail regarding the service processor 22a is described in following paragraphs.

It should be noted that a service processor 22a may exist external to the data storage system 12 and may communicate with the data storage system 12 using any one of a variety of communication connections. In one embodiment, the service processor 22a may communicate with the data storage system 12 through three different connections, a serial port, a parallel port and using a network interface card, for example, with an Ethernet connection. Using the Ethernet connection, for example, a service processor may communicate directly with DAs and HAs within the data storage system 12.

Figure 2:
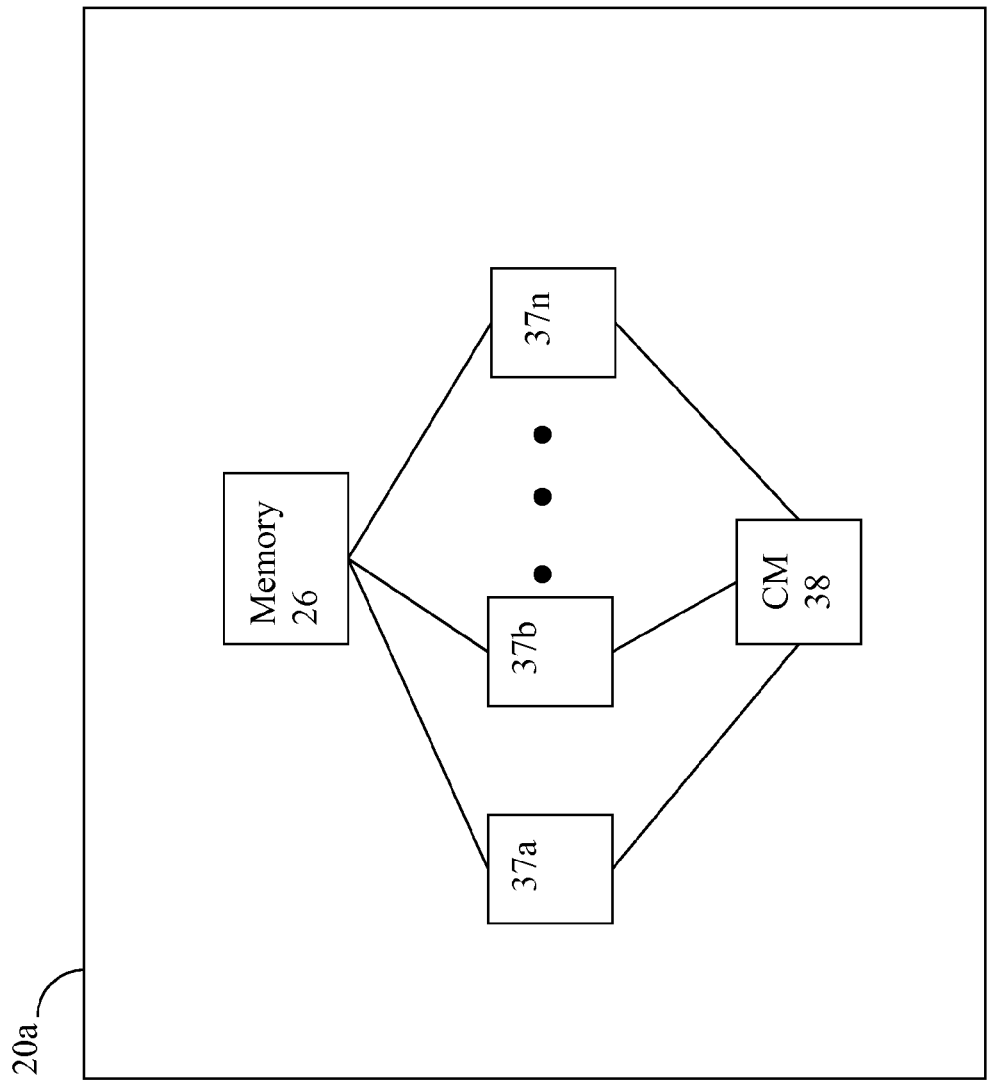
FIG. 2 is a representation of the logical internal communications between the directors and memory included in one embodiment of a data storage system of FIG. 1.

Referring to FIG. 2, shown is a representation of the logical internal communications between the directors and memory included in a data storage system. Included in FIG. 2 is a plurality of directors 37a-37n coupled to the memory 26. Each of the directors 37a-37n represents one of the HAs, RAs, or device interfaces that may be included in a data storage system. In an embodiment disclosed herein, there may be up to sixteen directors coupled to the memory 26. Other embodiments may allow a maximum number of directors other than sixteen as just described and the maximum number may vary with embodiment.

The representation of FIG. 2 also includes an optional communication module (CM) 38 that provides an alternative communication path between the directors 37a-37n. Each of the directors 37a-37n may be coupled to the CM 38 so that any one of the directors 37a-37n may send a message and/or data to any other one of the directors 37a-37n without needing to go through the memory 26. The CM 38 may be implemented using conventional MUX/router technology where a sending one of the directors 37a-37n provides an appropriate address to cause a message and/or data to be received by an intended receiving one of the directors 37a-37n. In addition, a sending one of the directors 37a-37n may be able to broadcast a message to all of the other directors 37a-37n at the same time.

With reference back to FIG. 1, components of the data storage system may communicate using GM 25b. For example, in connection with a write operation, an embodiment may first store the data in cache included in a portion of GM 25b, mark the cache slot including the write operation data as write pending (WP), and then later de-stage the WP data from cache to one of the devices 16a-16n. In connection with returning data to a host from one of the devices as part of a read operation, the data may be copied from the device by the appropriate device interface, such as a DA servicing the device. The device interface may copy the data read into a cache slot included in GM which is, in turn, communicated to the appropriate HA in communication with the host.

As described above, the data storage system 12 may be a data storage array including a plurality of data storage devices 16a-16n in which one or more of the devices 16a-16n are flash memory devices employing one or more different flash memory technologies. In one embodiment, the data storage system 12 may be a Symmetrix® DMX™ or VMAX™ data storage array by EMC Corporation of Hopkinton, Mass. In the foregoing data storage array, the data storage devices 16a-16n may include a combination of disk devices and flash devices in which the flash devices may appear as standard Fibre Channel (FC) drives to the various software tools used in connection with the data storage array. The flash devices may be constructed using nonvolatile semiconductor NAND flash memory. The flash devices may include one or more SLC (single level cell) devices and/or MLC (multi level cell) devices.

It should be noted that the techniques herein may be used in connection with flash devices comprising what may be characterized as enterprise-grade or enterprise-class flash drives (EFDs) with an expected lifetime (e.g., as measured in an amount of actual elapsed time such as a number of years, months, and/or days) based on a number of guaranteed write cycles, or program cycles, and a rate or frequency at which the writes are performed. Thus, a flash device may be expected to have a usage measured in calendar or wall clock elapsed time based on the amount of time it takes to perform the number of guaranteed write cycles. The techniques herein may also be used with other flash devices, more generally referred to as non-enterprise class flash devices, which, when performing writes at a same rate as for enterprise class drives, may have a lower expected lifetime based on a lower number of guaranteed write cycles.

The techniques herein may be generally used in connection with any type of flash device, or more generally, any SSD technology. The flash device may be, for example, a flash device which is a NAND gate flash device, NOR gate flash device, flash device that uses SLC or MLC technology, and the like, as known in the art. In one embodiment, the one or more flash devices may include MLC flash memory devices although an embodiment may utilize MLC, alone or in combination with, other types of flash memory devices or other suitable memory and data storage technologies. More generally, the techniques herein may be used in connection with other SSD technologies although particular flash memory technologies may be described herein for purposes of illustration.

An embodiment in accordance with techniques herein may have one or more defined storage tiers. Each tier may generally include physical storage devices or drives having one or more attributes associated with a definition for that tier. For example, one embodiment may provide a tier definition based on a set of one or more attributes. The attributes may include any one or more of a storage type or storage technology, a type of data protection, device performance characteristic(s), storage capacity, and the like. The storage type or technology may specify whether a physical storage device is an SSD drive (such as a flash drive), a particular type of SSD drive (such using flash or a form of RAM), a type of magnetic disk or other non-SSD drive (such as an FC disk drive, a SATA (Serial Advanced Technology Attachment) drive), and the like. Data protection may specify a type or level of data storage protection such, for example, as a particular RAID level (e.g., RAID1, RAID-5 3+1, RAID5 7+1, and the like). Performance characteristics may relate to different performance aspects of the physical storage devices of a particular type or technology. For example, there may be multiple types of FC disk drives based on the RPM characteristics of the FC disk drives (e.g., 10K RPM FC drives and 15K RPM FC drives) and FC disk drives having different RPM characteristics may be included in different storage tiers. Storage capacity may specify the amount of data, such as in bytes, that may be stored on the drives. An embodiment may allow a user to define one or more such storage tiers. For example, an embodiment in accordance with techniques herein may define two storage tiers including a first tier of all SSD drives and a second tier of all non-SSD drives. As another example, an embodiment in accordance with techniques herein may define three storage tiers including a first tier of all SSD drives which are flash drives, a second tier of all FC drives, and a third tier of all SATA drives. The foregoing are some examples of tier definitions and other tier definitions may be specified in accordance with techniques herein.

Figure 3:
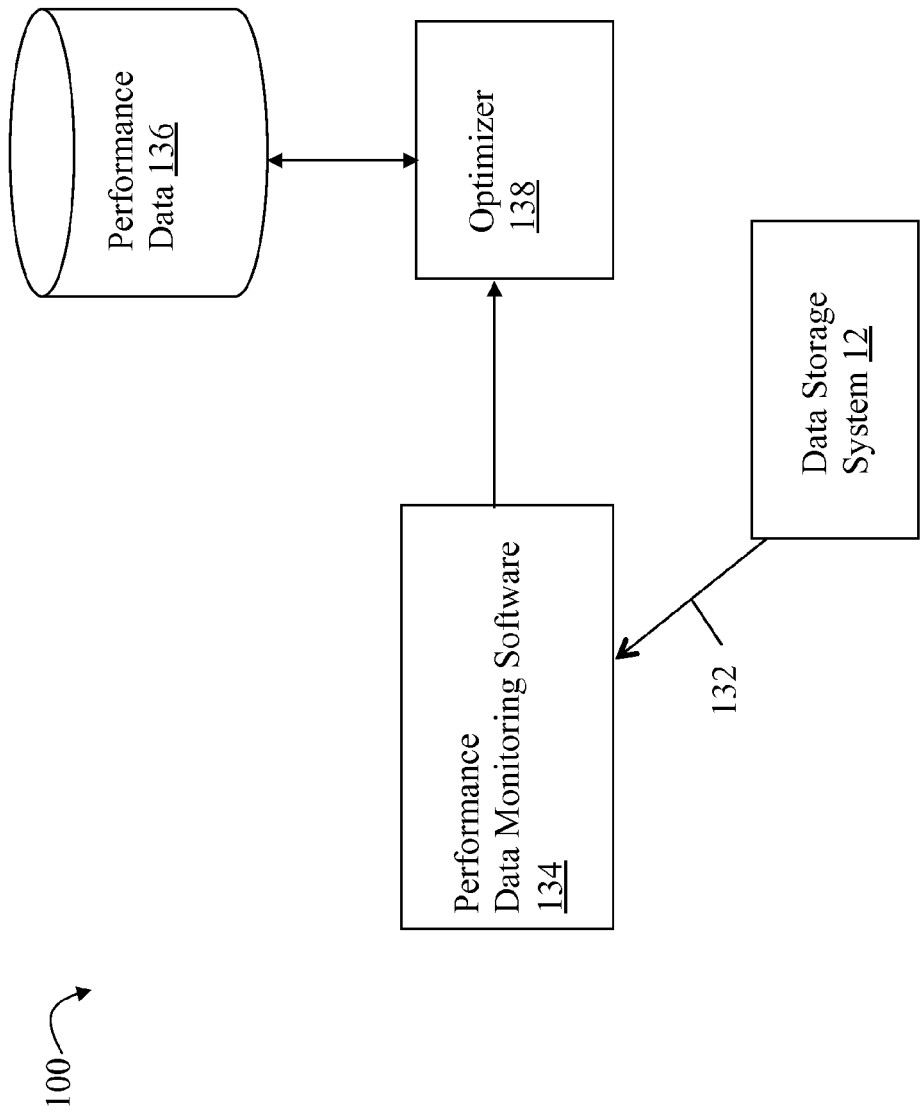
FIG. 3 is an example representing components that may be included in a service processor in an embodiment in accordance with techniques herein.

Referring to FIG. 3, shown is an example 100 of software that may be included in an embodiment in accordance with techniques herein. The example 100 includes performance data monitoring software 123, optimizer 138, performance data 138 and data storage system 12. As described herein, any of 134, 136 and/or 138 may be included in a service processor such as 22a of FIG. 1. It should be noted that the service processor may be any one of a variety of commercially available processors, such as an Intel-based processor, and the like. Although what is described herein shows details of software that may reside in the service processor 22a, all or portions of the illustrated components may also reside elsewhere such as, for example, on any of the host systems 14a 14n.

Included in the service processor 22a is performance data monitoring software 134 which gathers performance data about the data storage system 12 through the connection 132. The performance data monitoring software 134 gathers and stores performance data and forwards this to the optimizer 138 which further stores the data in the performance data file 136. This performance data 136 may also serve as an input to the optimizer 138 which attempts to enhance the performance of I/O operations, such as those I/O operations associated with data storage devices 16a-16n of the system 12. The optimizer 138 may take into consideration various types of parameters and performance data 136 in an attempt to optimize particular metrics associated with performance of the data storage system 12. The performance data 136 may be used by the optimizer to determine metrics described and used in connection with techniques herein. The optimizer may access the performance data, for example, collected for a plurality of LVs when performing a data storage optimization. The performance data 136 may be used in determining a workload for one or more physical devices, logical devices or volumes (LVs) serving as data devices, thin devices (described in more detail elsewhere herein) or other virtually provisioned devices, portions of thin devices, and the like. The workload may also be a measurement or level of "how busy" a device is, for example, in terms of I/O operations (e.g., I/O throughput such as number of I/Os/second, response time (RT), and the like).

The response time for a storage device or volume may be based on a response time associated with the storage device or volume for a period of time. The response time may based on read and write operations directed to the storage device or volume. Response time represents the amount of time it takes the storage system to complete an I/O request (e.g., a read or write request). Response time may be characterized as including two components: service time and wait time. Service time is the actual amount of time spent servicing or completing an I/O request after receiving the request from a host via an HA 21, or after the storage system 12 generates the I/O request internally. The wait time is the amount of time the I/O request spends waiting in line or queue waiting for service (e.g., prior to executing the I/O operation).

It should be noted that the operations of read and write with respect to an LV, thin device, and the like, may be viewed as read and write requests or commands from the DA 23, controller or other backend physical device interface. Thus, these are operations may also be characterized as a number of operations with respect to the physical storage device (e.g., number of physical device reads, writes, and the like, based on physical device accesses). This is in contrast to observing or counting a number of particular types of I/O requests (e.g., reads or writes) as issued from the host and received by a front end component such as an HA 21. To illustrate, a host read request may not result in a read request or command issued to the DA if there is a cache hit and the requested data is in cache. The host read request results in a read request or command issued to the DA 23 to retrieve data from the physical drive only if there is a read miss. Furthermore, when writing data of a received host I/O request to the physical device, the host write request may result in multiple reads and/or writes by the DA 23 in addition to writing out the host or user data of the request. For example, if the data storage system implements a RAID data protection technique, such as RAID-5, additional reads and writes may be performed such as in connection with writing out additional parity information for the user data. Thus, observed data gathered to determine workload, such as observed numbers of reads and writes, may refer to the read and write requests or commands performed by the DA. Such read and write commands may correspond, respectively, to physical device accesses such as disk reads and writes that may result from a host I/O request received by an HA 21.

The optimizer 138 may perform processing of the techniques herein set forth in following paragraphs to determine how to allocate or partition physical storage in a multi-tiered environment for use by multiple applications. The optimizer 138 may also perform other processing such as, for example, to determine what particular portions of thin devices to store on physical devices of a particular tier, evaluate when to migrate or move data between physical drives of different tiers, and the like. It should be noted that the optimizer 138 may generally represent one or more components that perform processing as described herein as well as one or more other optimizations and other processing that may be performed in an embodiment.

Described in following paragraphs are techniques that may be performed to determine promotion and demotion thresholds (described below in more detail) used in determining what data portions of thin devices to store on physical devices of a particular tier in a multi-tiered storage environment. Such data portions of a thin device may be automatically placed in a storage tier where the techniques herein have determined the storage tier is best to service that data in order to improve data storage system performance. The data portions may also be automatically relocated or migrated to a different storage tier as the work load and observed performance characteristics for the data portions change over time. In accordance with techniques herein, analysis of performance data for data portions of thin devices may be performed in order to determine whether particular data portions should have their data contents stored on physical devices located in a particular storage tier. The techniques herein may take into account how "busy" the data portions are in combination with defined capacity limits and defined performance limits (e.g., such as I/O throughput or I/Os per unit of time, response time, utilization, and the like) associated with a storage tier in order to evaluate which data to store on drives of the storage tier. The foregoing defined capacity limits and performance limits may be used as criteria to determine promotion and demotion thresholds based on projected or modeled I/O workload of a storage tier. Different sets of performance limits, also referred to as comfort performance zones or performance zones, may be evaluated in combination with capacity limits based on one or more overall performance metrics (e.g., average response time across all storage tiers for one or more storage groups) in order to select the promotion and demotion thresholds for the storage tiers.

Promotion may refer to movement of data from a first storage tier to a second storage tier where the second storage tier is characterized as having devices of higher performance than devices of the first storage tier. Demotion may refer generally to movement of data from a first storage tier to a second storage tier where the first storage tier is characterized as having devices of higher performance than devices of the second storage tier. As such, movement of data from a first tier of flash devices to a second tier of FC devices and/or SATA devices may be characterized as a demotion and movement of data from the foregoing second tier to the first tier a promotion. The promotion and demotion thresholds refer to thresholds used in connection with data movement.

As described in following paragraphs, one embodiment may use an allocation policy specifying an upper limit or maximum threshold of storage capacity for each of one or more tiers for use with an application. The partitioning of physical storage of the different storage tiers among the applications may be initially performed using techniques herein in accordance with the foregoing thresholds of the application's allocation policy and other criteria. In accordance with techniques herein, an embodiment may determine amounts of the different storage tiers used to store an application's data, and thus the application's storage group, subject to the allocation policy and other criteria. Such criteria may also include one or more performance metrics indicating a workload of the application. For example, an embodiment may determine one or more performance metrics using collected or observed performance data for a plurality of different logical devices, and/or portions thereof, used by the application. Thus, the partitioning of the different storage tiers among multiple applications may also take into account the workload or how "busy" an application is. Such criteria may also include capacity limits specifying how much of each particular storage tier may be used to store data for the application's logical devices. As described in various embodiments herein, the criteria may include one or more performance metrics in combination with capacity limits, performance metrics alone without capacity limits, or capacity limits alone without performance metrics. Of course, as will be appreciated by those of ordinary skill in the art, such criteria may include any of the foregoing in combination with other suitable criteria.

As an example, the techniques herein may be described with reference to a storage environment having three storage tiers—a first tier of only flash drives in the data storage system, a second tier of only FC disk drives, and a third tier of only SATA disk drives. In terms of performance, the foregoing three tiers may be ranked from highest to lowest as follows: first, second, and then third. The lower the tier ranking, the lower the tier's performance characteristics (e.g., longer latency times, capable of less I/O throughput/second/GB (or other storage unit), and the like). Generally, different types of physical devices or physical drives have different types of characteristics. There are different reasons why one may want to use one storage tier and type of drive over another depending on criteria, goals and the current performance characteristics exhibited in connection with performing I/O operations. For example, flash drives of the first tier may be a best choice or candidate for storing data which may be characterized as I/O intensive or "busy" thereby experiencing a high rate of I/Os to frequently access the physical storage device containing the LV's data. However, flash drives tend to be expensive in terms of storage capacity. SATA drives may be a best choice or candidate for storing data of devices requiring a large storage capacity and which are not I/O intensive with respect to access and retrieval from the physical storage device. The second tier of FC disk drives may be characterized as "in between" flash drives and SATA drives in terms of cost/GB and I/O performance. Thus, in terms of relative performance characteristics, flash drives may be characterized as having higher performance than both FC and SATA disks, and FC disks may be characterized as having a higher performance than SATA.

Since flash drives of the first tier are the best suited for high throughput/sec/GB, processing may be performed to determine which of the devices, and portions thereof, are characterized as most I/O intensive and therefore may be good candidates to have their data stored on flash drives. Similarly, the second most I/O intensive devices, and portions thereof, may be good candidates to store on FC disk drives of the second tier and the least I/O intensive devices may be good candidates to store on SATA drives of the third tier. As such, workload for an application may be determined using some measure of I/O intensity, performance or activity (e.g., I/O throughput/second, percentage of read operation, percentage of write operations, response time, etc.) of each device used for the application's data. Some measure of workload may be used as a factor or criterion in combination with others described herein for determining what data portions are located on the physical storage devices of each of the different storage tiers.

Figure 4:
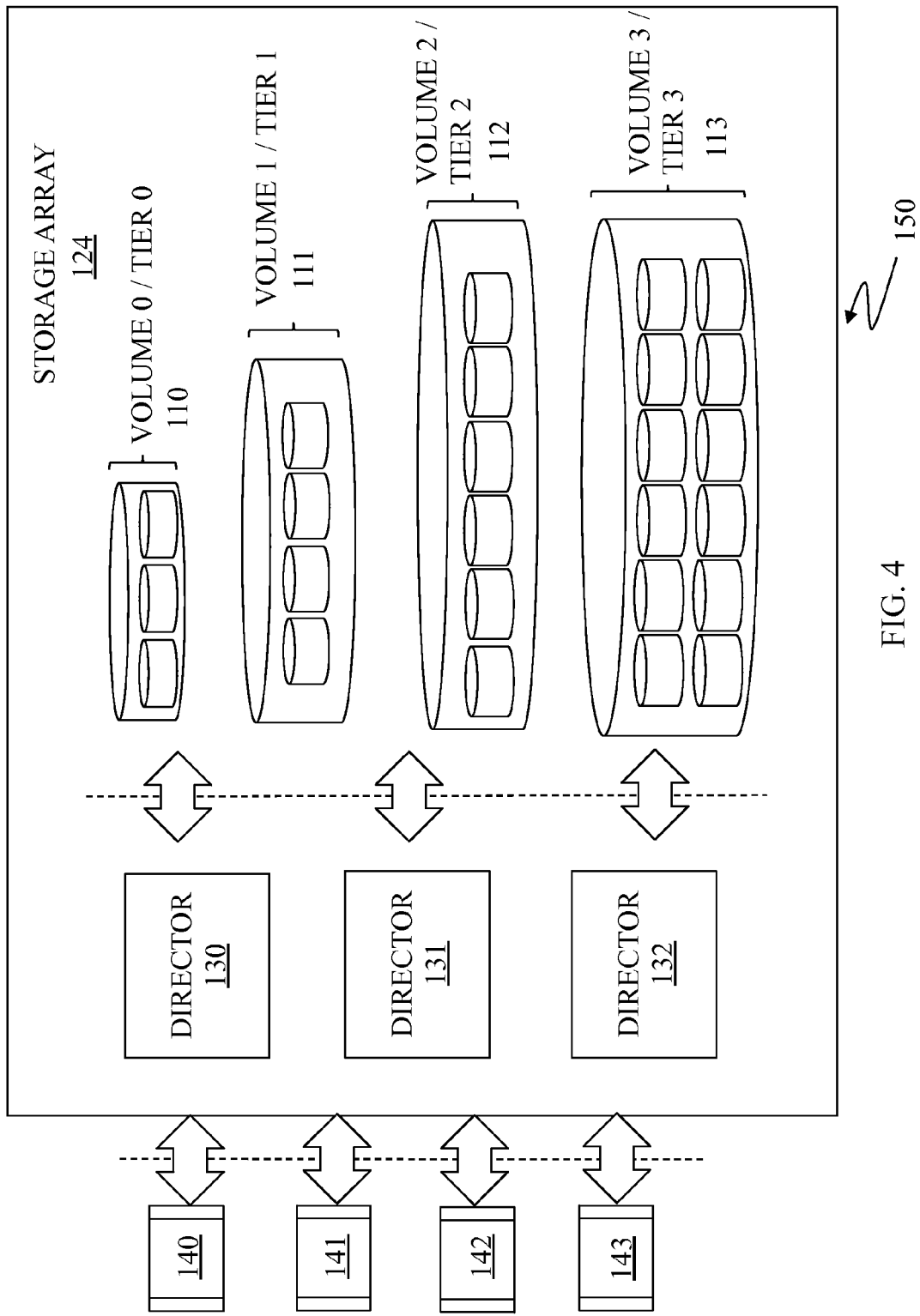
FIGS. 4, 5A and 5B are examples illustrating a data storage system, such as data storage array, including a plurality of storage tiers in an embodiment in accordance with techniques herein.

FIG. 4 is a schematic illustration showing a storage system 150 that may be used in connection with an embodiment of the system described herein. The storage system 150 may include a storage array 124 having multiple directors 130-132 and multiple storage volumes (LVs, logical devices or VOLUMES 0-3) 110-113. Host applications 140-144 and/or other entities (e.g., other storage devices, SAN switches, etc.) request data writes and data reads to and from the storage array 124 that are facilitated using one or more of the directors 130-132. The storage array 124 may include similar features as that discussed above.

The volumes 110-113 may be provided in multiple storage tiers (TIERS 0-3) that may have different storage characteristics, such as speed, cost, reliability, availability, security and/or other characteristics. As described above, a tier may represent a set of storage resources, such as physical storage devices, residing in a storage platform. Examples of storage disks that may be used as storage resources within a storage array of a tier may include sets SATA disks, FC disks and/or EFDs, among other known types of storage devices.

According to various embodiments, each of the volumes 110-113 may be located in different storage tiers. Tiered storage provides that data may be initially allocated to a particular fast volume/tier, but a portion of the data that has not been used over a period of time (for example, three weeks) may be automatically moved to a slower (and perhaps less expensive) tier. For example, data that is expected to be used frequently, for example database indices, may be initially written directly to fast storage whereas data that is not expected to be accessed frequently, for example backup or archived data, may be initially written to slower storage. In an embodiment, the system described herein may be used in connection with a Fully Automated Storage Tiering (FAST) product produced by EMC Corporation of Hopkinton, Mass., that provides for the optimization of the use of different storage tiers including the ability to easily create and apply tiering policies (e.g., allocation policies, data movement policies including promotion and demotion thresholds, and the like) to transparently automate the control, placement, and movement of data within a storage system based on business needs. The techniques herein may be used to determine amounts or allocations of each storage tier used by each application based on capacity limits in combination with performance limits.

Figure 5A:
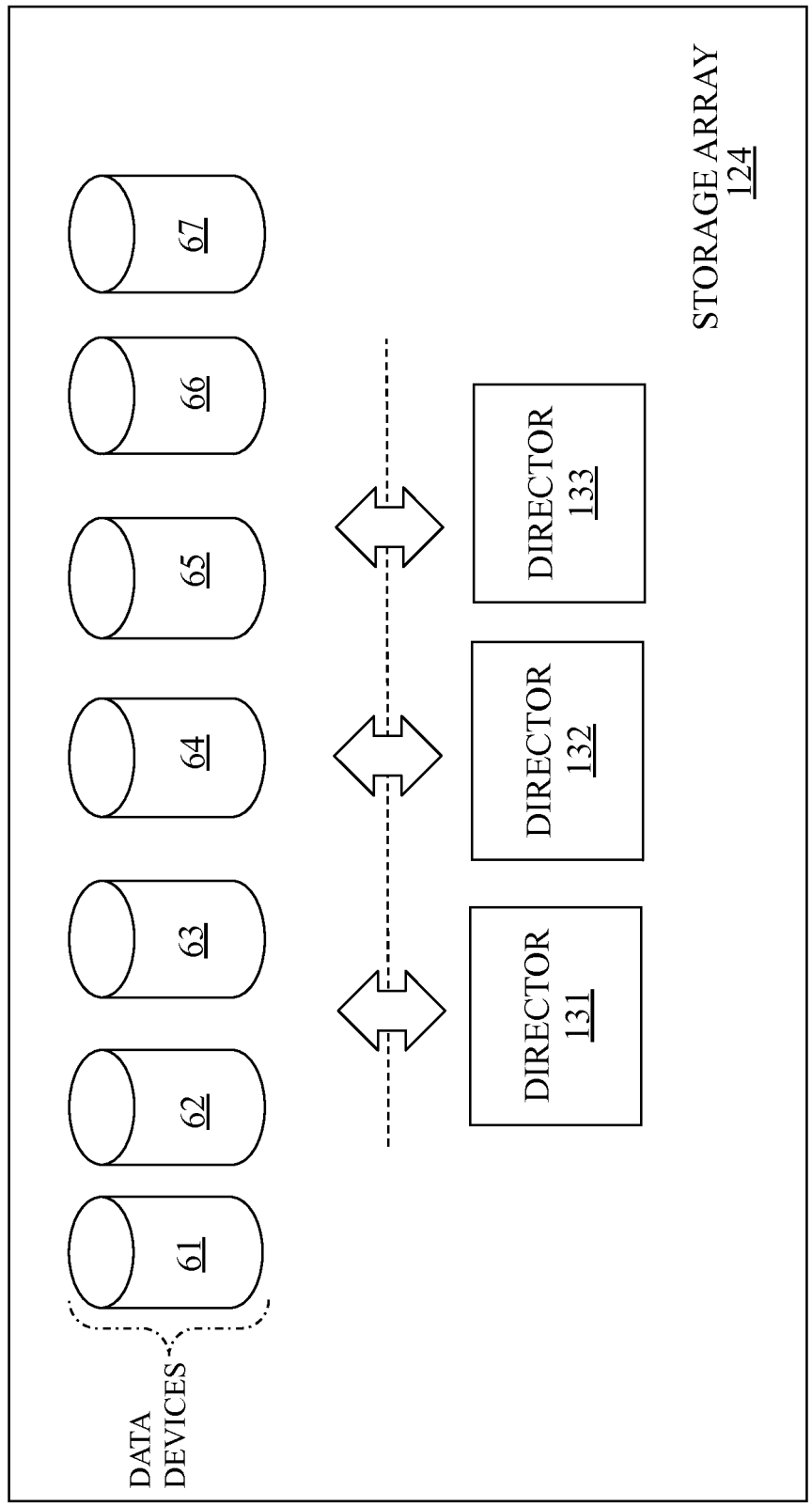

Referring to FIG. 5A, shown is a schematic diagram of the storage array 124 as including a plurality of data devices 61-67 communicating with directors 131-133. The data devices 61-67 may be implemented as logical devices like standard logical devices (also referred to as thick devices) provided in a Symmetrix® data storage device produced by EMC Corporation of Hopkinton, Mass., for example. In some embodiments, the data devices 61-67 may not be directly useable (visible) to hosts coupled to the storage array 124. Each of the data devices 61-67 may correspond to a portion (including a whole portion) of one or more of the disk drives 16a-16n of FIG. 1 (or more generally physical devices). Thus, for example, the data device section 61 may correspond to the disk drive 16a, may correspond to a portion of the disk drive 16a, or may correspond to a portion of the disk drive 16a and a portion of the disk drive 16b. The data devices 61-67 may be designated as corresponding to different classes, so that different ones of the data devices 61-67 correspond to different physical storage having different relative access speeds or RAID protection type (or some other relevant distinguishing characteristic or combination of characteristics), as further discussed elsewhere herein. Alternatively, in other embodiments that may be used in connection with the system described herein, instead of being separate devices, the data devices 61-67 may be sections of one data device.

Figure 5B:
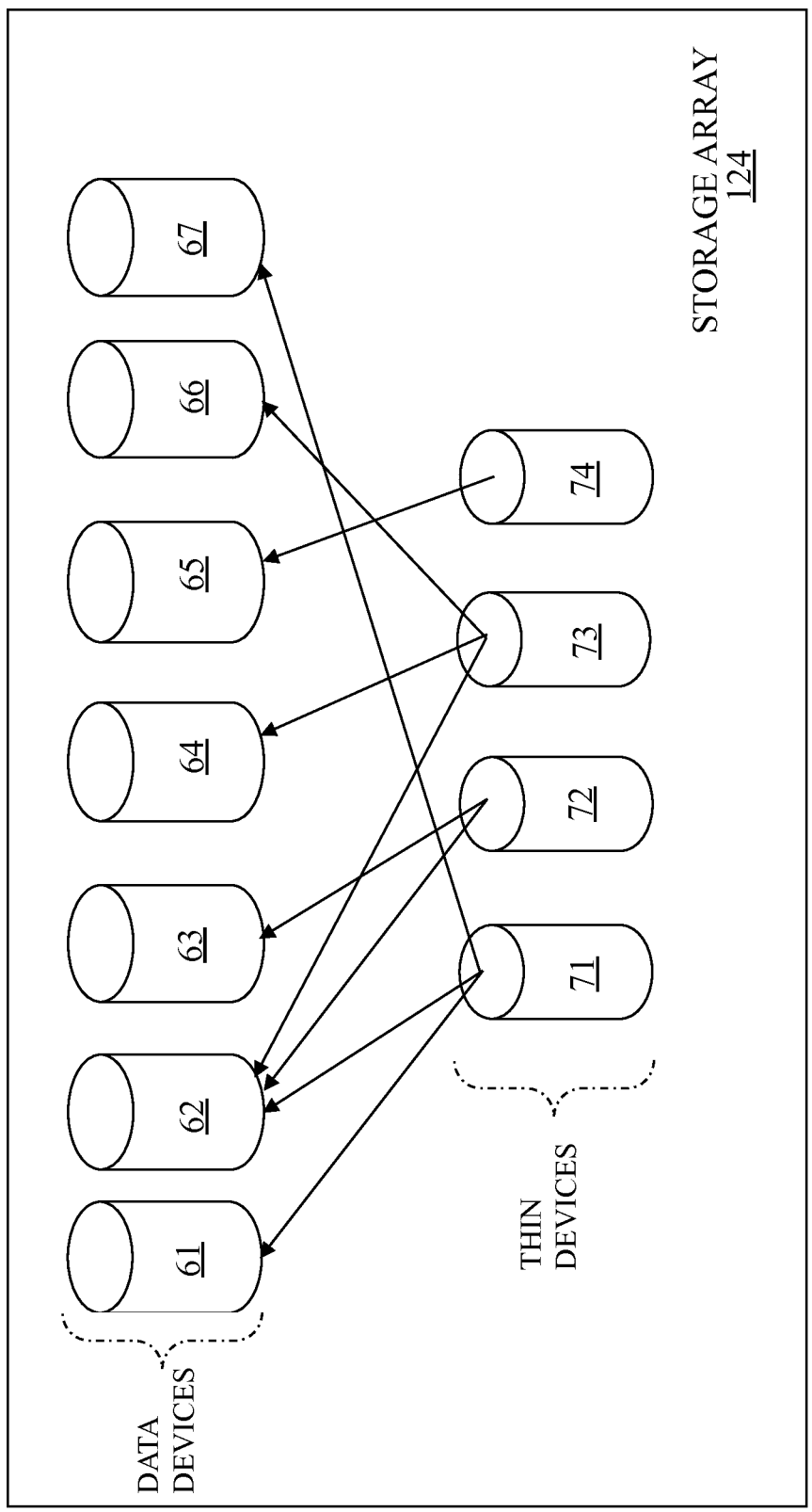

As shown in FIG. 5B, the storage array 124 may also include a plurality of thin devices 71-74 that may be adapted for use in connection with the system described herein when using thin provisioning. In a system using thin provisioning, the thin devices 71-74 may appear to a host coupled to the storage array 124 as one or more logical volumes (logical devices) containing contiguous blocks of data storage. Each of the thin devices 71-74 may contain pointers to some or all of the data devices 61-67 (or portions thereof). As described in more detail elsewhere herein, a thin device may be virtually provisioned in terms of its allocated physical storage in physical storage for a thin device presented to a host as having a particular capacity is allocated as needed rather than allocate physical storage for the entire thin device capacity upon creation of the thin device. As such, a thin device presented to the host as having a capacity with a corresponding LBA (logical block address) range may have portions of the LBA range for which storage is not allocated.

Figure 5C:
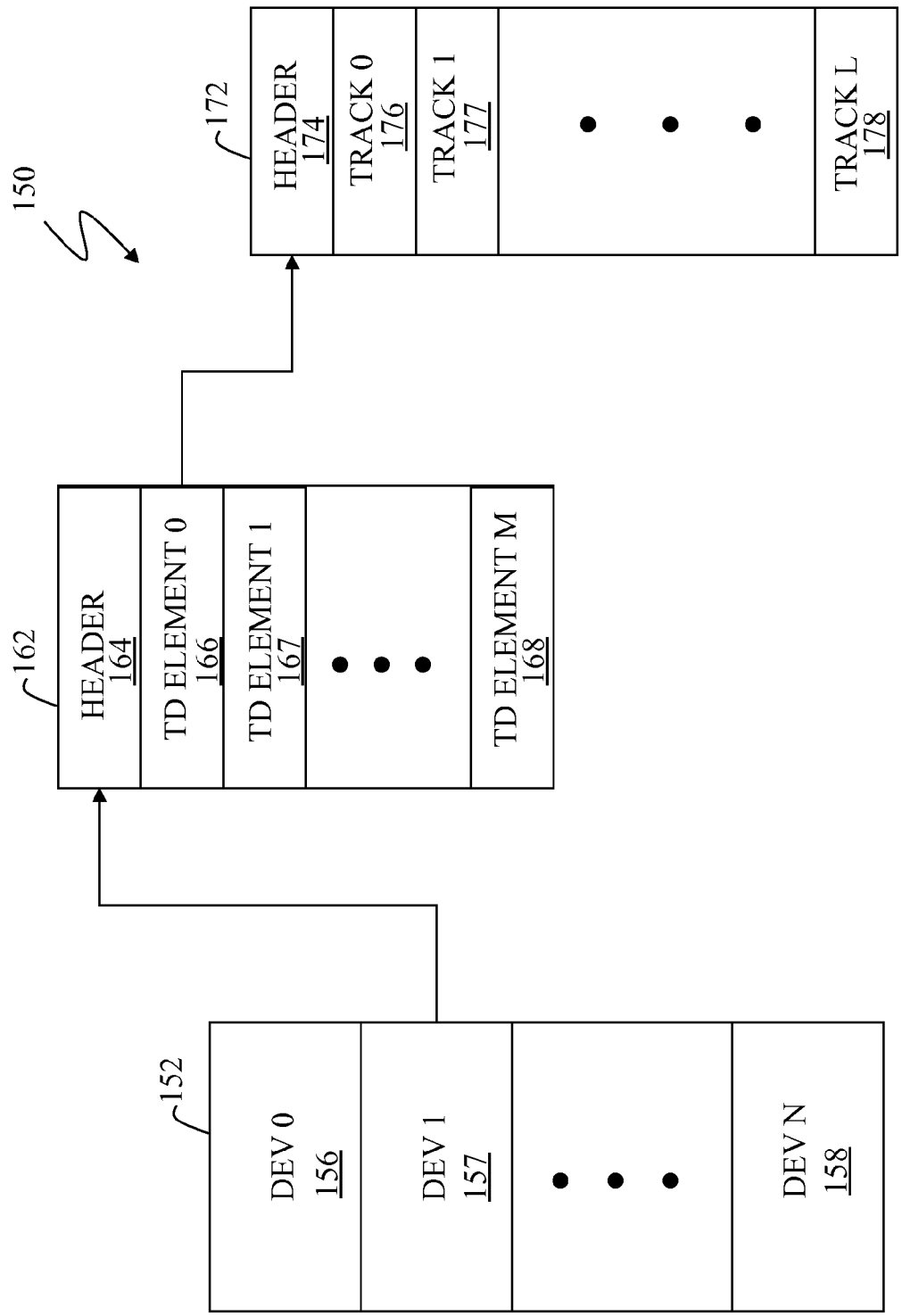
FIG. 5C is a schematic diagram illustrating tables that are used to keep track of device information in connection with an embodiment of the system described herein.

Referring to FIG. 5C, shown is a diagram 150 illustrating tables that are used to keep track of device information. A first table 152 corresponds to all of the devices used by a data storage system or by an element of a data storage system, such as an HA 21 and/or a DA 23. The table 152 includes a plurality of logical device (logical volume) entries 156-158 that correspond to all the logical devices used by the data storage system (or portion of the data storage system). The entries in the table 152 may include information for thin devices, for data devices (such as logical devices or volumes), for standard logical devices, for virtual devices, for BCV devices, and/or any or all other types of logical devices used in connection with the system described herein.

Each of the entries 156-158 of the table 152 correspond to another table that may contain information for one or more logical volumes, such as thin device logical volumes. For example, the entry 157 may correspond to a thin device table 162. The thin device table 162 may include a header 164 that contains overhead information, such as information identifying the corresponding thin device, information concerning the last used data device and/or other information including counter information, such as a counter that keeps track of used group entries (described below). The header information, or portions thereof, may be available globally to the data storage system.

The thin device table 162 may include one or more group elements 166-168, that contain information corresponding to a group of tracks on the data device. A group of tracks may include one or more tracks, the number of which may be configured as appropriate. In an embodiment herein, each group has sixteen tracks, although this number may be configurable.

One of the group elements 166-168 (for example, the group element 166) of the thin device table 162 may identify a particular one of the data devices 61-67 having a track table 172 that contains further information, such as a header 174 having overhead information and a plurality of entries 176-178 corresponding to each of the tracks of the particular one of the data devices 61-67. The information in each of the entries 176-178 may include a pointer (either direct or indirect) to the physical address on one of the physical disk drives of the data storage system that maps to the logical address(es) of the particular one of the data devices 61-67. Thus, the track table 162 may be used in connection with mapping logical addresses of the logical devices corresponding to the tables 152, 162, 172 to physical addresses on the disk drives or other physical devices of the data storage system.

The tables 152, 162, 172 may be stored in the global memory 25b of the data storage system. In addition, the tables corresponding to particular logical devices accessed by a particular host may be stored (cached) in local memory of the corresponding one of the HA's. In addition, an RA and/or the DA's may also use and locally store (cache) portions of the tables 152, 162, 172.

Figure 5D:
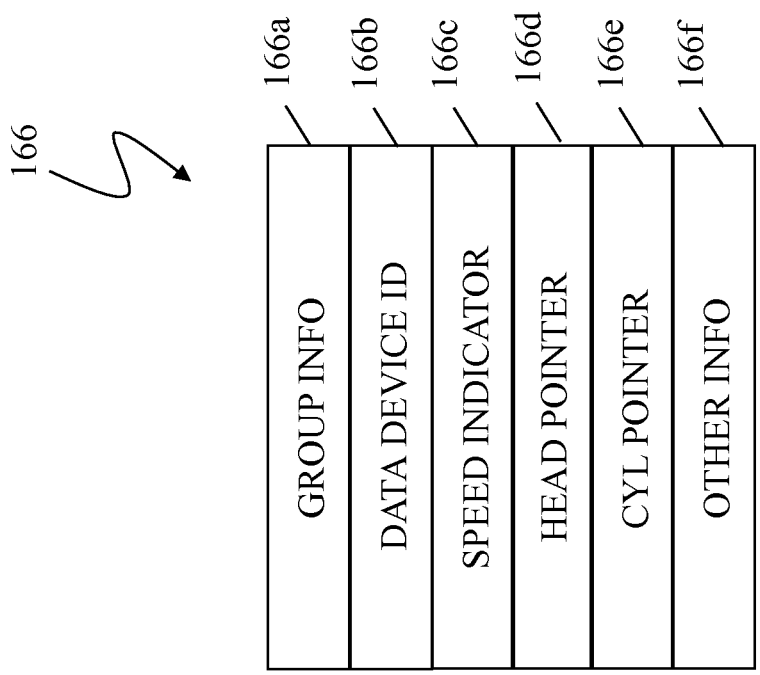
FIG. 5D is a schematic diagram showing a group element of a thin device table in connection with an embodiment of the system described herein.

Referring to FIG. 5D, shown is a schematic diagram illustrating a group element 166 of the thin device table 162 in connection with an embodiment of the system described herein. The group element 166 may includes a plurality of entries 166a-166f. The entry 166a may provide group information, such as a group type that indicates whether there has been physical address space allocated for the group. The entry 166b may include information identifying one (or more) of the data devices 61-67 that correspond to the group (i.e., the one of the data devices 61-67 that contains pointers for physical data for the group). The entry 166c may include other identifying information for the one of the data devices 61-67, including a speed indicator that identifies, for example, if the data device is associated with a relatively fast access physical storage (disk drive) or a relatively slow access physical storage (disk drive). Other types of designations of data devices are possible (e.g., relatively expensive or inexpensive). The entry 166d may be a pointer to a head of the first allocated track for the one of the data devices 61-67 indicated by the data device ID entry 166b. Alternatively, the entry 166d may point to header information of the data device track table 172 immediately prior to the first allocated track. The entry 166e may identify a cylinder of a first allocated track for the one the data devices 61-67 indicated by the data device ID entry 166b. The entry 166f may contain other information corresponding to the group element 166 and/or the corresponding thin device. In other embodiments, entries of the group table 166 may identify a range of cylinders of the thin device and a corresponding mapping to map cylinder/track identifiers for the thin device to tracks/cylinders of a corresponding data device. In an embodiment, the size of table element 166 may be eight bytes.

Accordingly, a thin device presents a logical storage space to one or more applications running on a host where different portions of the logical storage space may or may not have corresponding physical storage space associated therewith. However, the thin device is not mapped directly to physical storage space. Instead, portions of the thin storage device for which physical storage space exists are mapped to data devices, which are logical devices that map logical storage space of the data device to physical storage space on the disk drives or other physical storage devices. Thus, an access of the logical storage space of the thin device results in either a null pointer (or equivalent) indicating that no corresponding physical storage space has yet been allocated, or results in a reference to a data device which in turn references the underlying physical storage space.

Thin devices and thin provisioning are described in more detail in U.S. patent application Ser. No. 11/726,831, filed Mar. 23, 2007 (U.S. Patent App. Pub. No. 2009/0070541 A1), AUTOMATED INFORMATION LIFE-CYCLE MANAGEMENT WITH THIN PROVISIONING, Yochai, and U.S. Pat. No. 7,949,637, Issued May 24, 2011, Storage Management for Fine Grained Tiered Storage with Thin Provisioning, to Burke, both of which are incorporated by reference herein.

As discussed elsewhere herein, the data devices 61-67 (and other logical devices) may be associated with physical storage areas (e.g., disk drives, tapes, solid state storage, etc.) having different characteristics. In various embodiments, the physical storage areas may include multiple tiers of storage in which each sub-tier of physical storage areas and/or disk drives may be ordered according to different characteristics and/or classes, such as speed, technology and/or cost. The devices 61-67 may appear to a host coupled to the storage device 24 as a logical volume (logical device) containing a contiguous block of data storage, as discussed herein. Accordingly, each of the devices 61-67 may map to storage areas across multiple physical storage drives. The granularity at which the storage system described herein operates may be smaller than at the file level, for example potentially as small as a single byte, but more practically at the granularity of a single logical block or collection of sequential data blocks. A data block may be of any size including file system or database logical block size, physical block, track or cylinder and/or other size. Multiple data blocks may be substantially the same size or different sizes, such as different size data blocks for different storage volumes or different sized data blocks within a single storage volume.

In accordance with techniques herein, an embodiment may allow for locating all of the data of a single logical portion or entity in a same tier or in multiple different tiers depending on the logical data portion or entity. In an embodiment including thin devices, the techniques herein may be used where different portions of data of a single thin device may be located in different storage tiers. For example, a thin device may include two data portions and a first of these two data portions may be identified as a "hot spot" of high I/O activity (e.g., having a large number of I/O accesses such as reads and/or writes per unit of time) relative to the second of these two portions. As such, an embodiment in accordance with techniques herein may have added flexibility in that the first portion of data of the thin device may be located in a different higher performance storage tier than the second portion. For example, the first portion may be located in a tier comprising flash devices and the second portion may be located in a different tier of FC or SATA drives.

Figure 6:
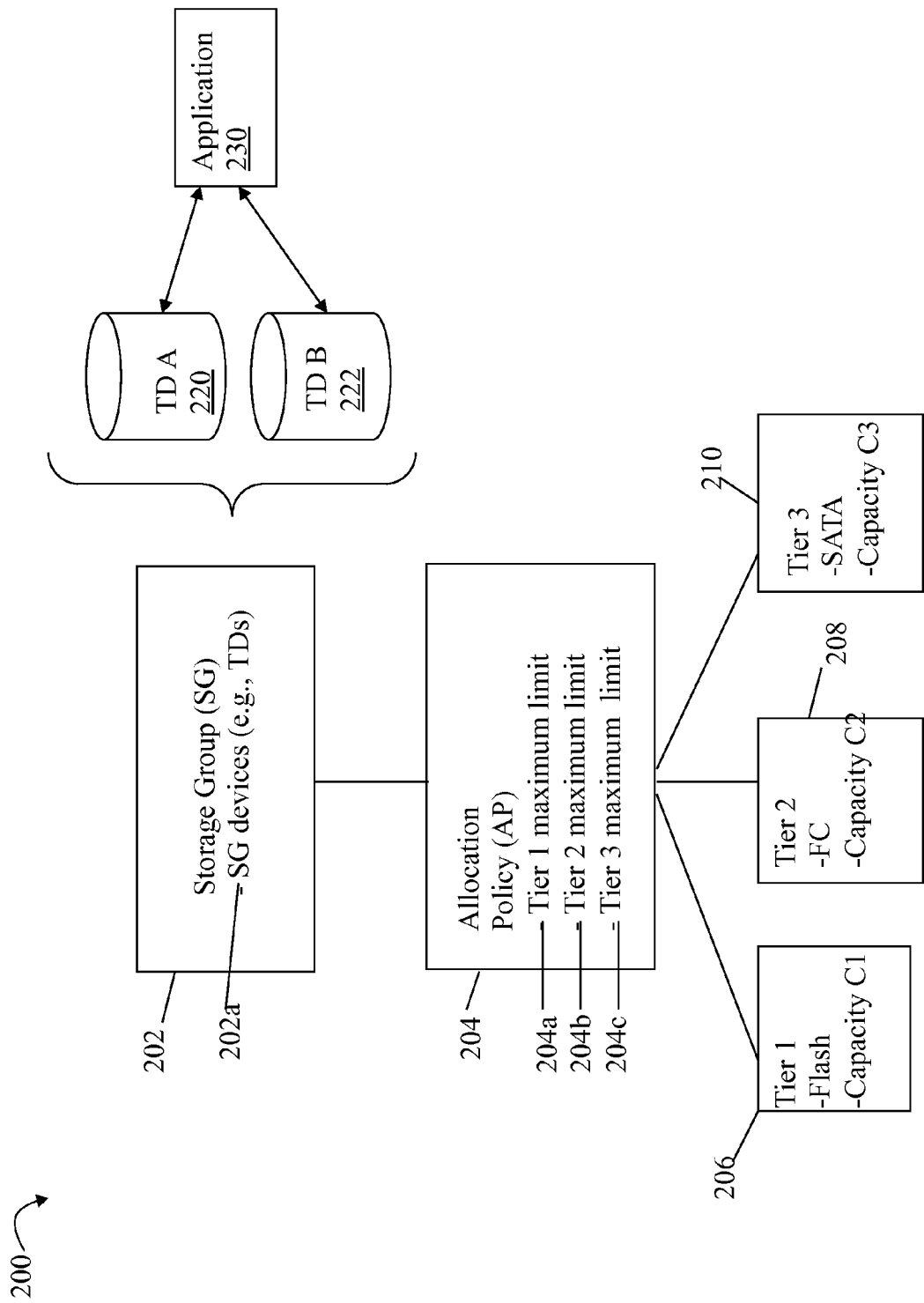
FIGS. 6 and 7 are examples illustrating a storage group, allocation policy and associated storage tiers in an embodiment in accordance with techniques herein.

Referring to FIG. 6, shown is an example illustrating information that may be defined and used in connection with techniques herein. The example 200 includes multiple storage tiers 206, 208, and 210, an allocation policy (AP) 204, and storage group (SG) 202. The SG 202 may include one or more thin devices (TDs), such as TD A 220 and TD B 222, used by an application 230. The application 230 may execute, for example, on one of the hosts of FIG. 1. The techniques herein may be used to determine how to partition physical storage of the multiple storage tiers 206, 208 and 210 for use in storing or locating the application's data, such as data of the TDs 220 and 222. It should be noted that the particular number of tiers, TDs, and the like, should not be construed as a limitation. An SG may represent a logical grouping of TDs used by a single application although an SG may correspond to other logical groupings for different purposes. An SG may, for example, correspond to TDs used by multiple applications.

Each of 206, 208 and 210 may correspond to a tier definition as described elsewhere herein. Element 206 represents a first storage tier of flash drives having a tier capacity limit C1. Element 208 represents a first storage tier of FC drives having a tier capacity limit C2. Element 210 represents a first storage tier of SATA drives having a tier capacity limit C3. Each of C1, C2 and C3 may represent an available or maximum amount of storage capacity in the storage tier that may be physical available in the system. The AP 204 may be associated with one of more SGs such as SG 202. The AP 204 specifies, for an associated SG 202, a capacity upper limit or maximum threshold for one or more storage tiers. Each such limit may identify an upper bound regarding an amount of storage that may be allocated for use by the associated SG. The AP 204 may be associated with one or more of the storage tiers 206, 208 and 210 that may be defined in a multi-tier storage environment. The AP 204 in this example 200 includes limit 204a identifying a maximum or upper limit of storage for tier1, limit 204b identifying a maximum or upper limit of storage for tier2, and limit 204c identifying a maximum or upper limit of storage for tier3. The SG 202 may be based on an SG definition identifying 202a the logical devices, such as TDs included in the SG.

In connection with techniques herein, the maximum limits 204a, 204b and 204c each represent an upper bound of a storage capacity to which an associated SG is subjected to. The techniques herein may be used to partition less than the amount or capacity represented by such limits. An amount of physical storage of a tier allocated for use by an application is allowed to vary up to the tier limit as defined in the AP 204 in accordance with other criteria associated with the application such as, for example, varying application workload. The optimizer may vary the amount of storage in each tier used by an SG202, and thus an application, based on workload and possibly other criteria when performing a cost benefit analysis, where such amounts are subject to the limits of the SG's AP and also performance limits described in more detail elsewhere herein. At a second point in time, the workloads and possibly other criteria for the applications may change and the optimizer may reparation the storage capacity used by each application subject to the capacity limits of APs and performance limits.

Figure 7:
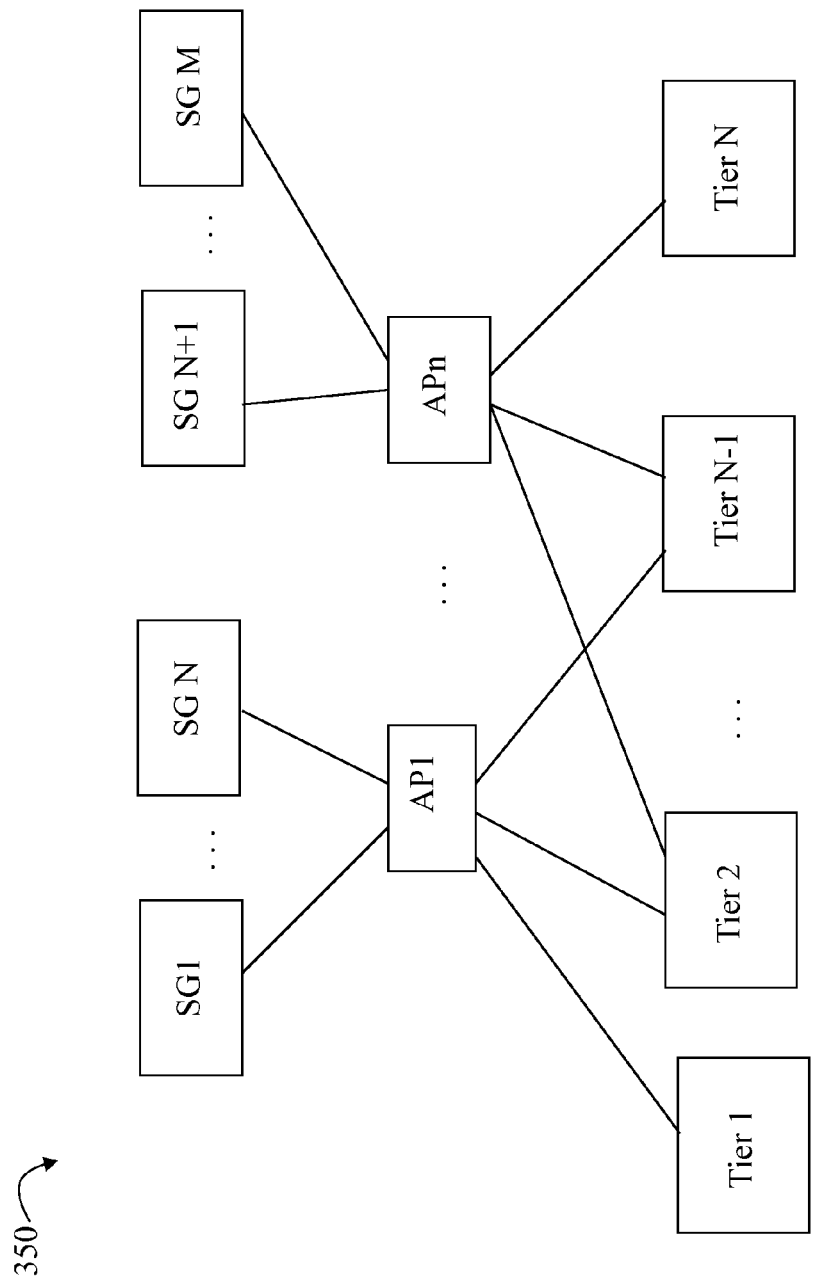

Referring to FIG. 7, shown is an example which more generally illustrates different associations between SGs, APs and tiers in an embodiment in accordance with techniques herein. The example 350 illustrates that an embodiment may have multiple storage tiers (e.g., tiers 1-N), multiple APs (e.g., AP1-N), and multiple SGs (e.g., SG 1-M). Each AP may be associated with one or more of the storage tiers. Each AP may also be associated with different tiers than other APs. For example, APn is associated with Tier N but AP1 is not. For each tier associated with an AP, the AP may define a maximum capacity limit as described in connection with FIG. 6. Each AP may be associated with one or more SGs. For example SGs1-N may be associated with a same AP1, and SGs N+1 through M may be associated with a same APn.

With reference back to FIG. 6, each of the maximum capacity limits may have any one of a variety of different forms. For example, such limits may be expressed as a percentage or portion of tier total storage capacity (e.g., such as a percentage of C1, C2, or C3), as an integer indicating an amount or quantity of storage 410c (e.g., indicating a number of bytes or other number of storage units), and the like.

Data used in connection with techniques herein, such as the performance data of FIG. 3 used in determining device and SG workloads, may be obtained through observation and monitoring actual performance. Data may also be determined in other suitable ways such as, for example, through simulation, estimation, and the like. Observed or collected data may be obtained as described in connection with FIG. 3 by monitoring and recording one or more aspects of I/O activity for each TD, and portions thereof. For example, for each TD, and/or portions thereof, an average number of reads occurring within a given time period may be determined, an average number of writes occurring within a given time period may be determined, an average number of read misses occurring within a given time period may be determined, and the like. It should be noted that the operations of read and write with respect to a TD may be viewed as read and write requests or commands from the DA, controller or other backend physical device interface. Thus, these are operations may also be characterized as an average number of operations with respect to the physical storage device (e.g., average number of physical device reads, writes, and the like, based on physical device accesses). This is in contrast to observing or counting a number of particular types of I/O requests (e.g., reads or writes) as issued from the host and received by a front end component such as an FA. To illustrate, a host read request may not result in a read request or command issued to the DA if there is a cache hit and the requested data is in cache. The host read request results in a read request or command issued to the DA to retrieve data from the physical drive only if there is a read miss. Furthermore, when writing data of a received host I/O request to the physical device, the host write request may result in multiple reads and/or writes by the DA in addition to writing out the host or user data of the request. For example, if the data storage system implements a RAID data protection technique, such as RAID-5, additional reads and writes may be performed such as in connection with writing out additional parity information for the user data. Thus, observed data gathered to determine workload, such as observed numbers of reads and writes, may refer to the read and write requests or commands performed by the DA. Such read and write commands may correspond, respectively, to physical device accesses such as disk reads and writes that may result from a host I/O request received by an FA.

It should be noted that movement of data between tiers from a source tier to a target tier may include determining free or unused storage device locations within the target tier.

In the event there is an insufficient amount of free of unused storage in the target tier, processing may also include displacing or relocating other data currently stored on a physical device of the target tier. An embodiment may perform movement of data to and/or from physical storage devices using any suitable technique. Also, any suitable technique may be used to determine a target storage device in the target tier where the data currently stored on the target is relocated or migrated to another physical device in the same or a different tier.

One embodiment in accordance with techniques herein may include multiple storage tiers including a first tier of flash devices and one or more other tiers of non-flash devices having lower performance characteristics than flash devices. The one or more other tiers may include, for example, one or more types of disk devices. The tiers may also include other types of SSDs besides flash devices.

As described above, a thin device (also referred to as a virtually provisioned (VP) device) is a device that represents a certain capacity having an associated address range. Storage may be allocated for thin devices in chunks or data portions of a particular size as needed rather than allocate all storage necessary for the thin device's entire capacity. Therefore, it may be the case that at any point in time, only a small number of portions or chunks of the thin device actually are allocated and consume physical storage on the back end (on physical disks, flash or other physical storage devices). A thin device may be constructed of chunks having a size that may vary with embodiment. For example, in one embodiment, a chunk may correspond to a group of 12 tracks (e.g., 12 tracks*64 Kbytes/track=768 Kbytes/chunk). As also noted with a thin device, the different chunks may reside on different data devices in one or more storage tiers. In one embodiment, as will be described below, a storage tier may consist of one or more storage pools. Each storage pool may include multiple LVs and their associated physical devices. With thin devices, a system in accordance with techniques herein has flexibility to relocate individual chunks as desired to different devices in the same as well as different pools or storage tiers. For example, a system may relocate a chunk from a flash storage pool to a SATA storage pool. In one embodiment using techniques herein, a thin device can be bound to a particular storage pool of a storage tier at a point in time so that any chunks requiring allocation of additional storage, such as may occur when writing data to the thin device, result in allocating storage from this storage pool. Such binding may change over time for a thin device.

A thin device may contain thousands and even hundreds of thousands of such chunks. As such, tracking and managing performance data such as one or more performance statistics for each chunk, across all such chunks, for a storage group of thin devices can be cumbersome and consume an excessive amount of resources. Described in following paragraphs are techniques that may be used in connection with collecting performance data about thin devices where such information may be used to determine which chunks of thin devices are most active relative to others. Such evaluation may be performed in connection with determining promotion/demotion thresholds use in evaluating where to locate and/or move data of the different chunks with respect to the different storage tiers in a multi-storage tier environment. In connection with examples in following paragraphs, details such as having a single storage pool in each storage tier, a single storage group, and the like, are provided for purposes of illustration. Those of ordinary skill in the art will readily appreciate the more general applicability of techniques herein in other embodiments such as, for example, having a storage group including a plurality of storage pools, and the like.

Referring to FIG. 8A, shown is an example 700 illustrating use of a thin device in an embodiment in accordance with techniques herein. The example 700 includes three storage pools 712, 714 and 716 with each such pool representing a storage pool of a different storage tier. For example, pool 712 may represent a storage pool of tier A of flash storage devices, pool 714 may represent a storage pool of tier B of FC storage devices, and pool 716 may represent a storage pool of tier C of SATA storage devices. Each storage pool may include a plurality of logical devices and associated physical devices (or portions thereof) to which the logical devices are mapped. Element 702 represents the thin device address space or range including chunks which are mapped to different storage pools. For example, element 702a denotes a chunk C1 which is mapped to storage pool 712 and element 702b denotes a chunk C2 which is mapped to storage pool 714. Element 702 may be a representation for a first thin device which is included in a storage group of one or more thin devices.

It should be noted that although the example 700 illustrates only a single storage pool per storage tier, an embodiment may also have multiple storage pools per tier.

Figure 8B:
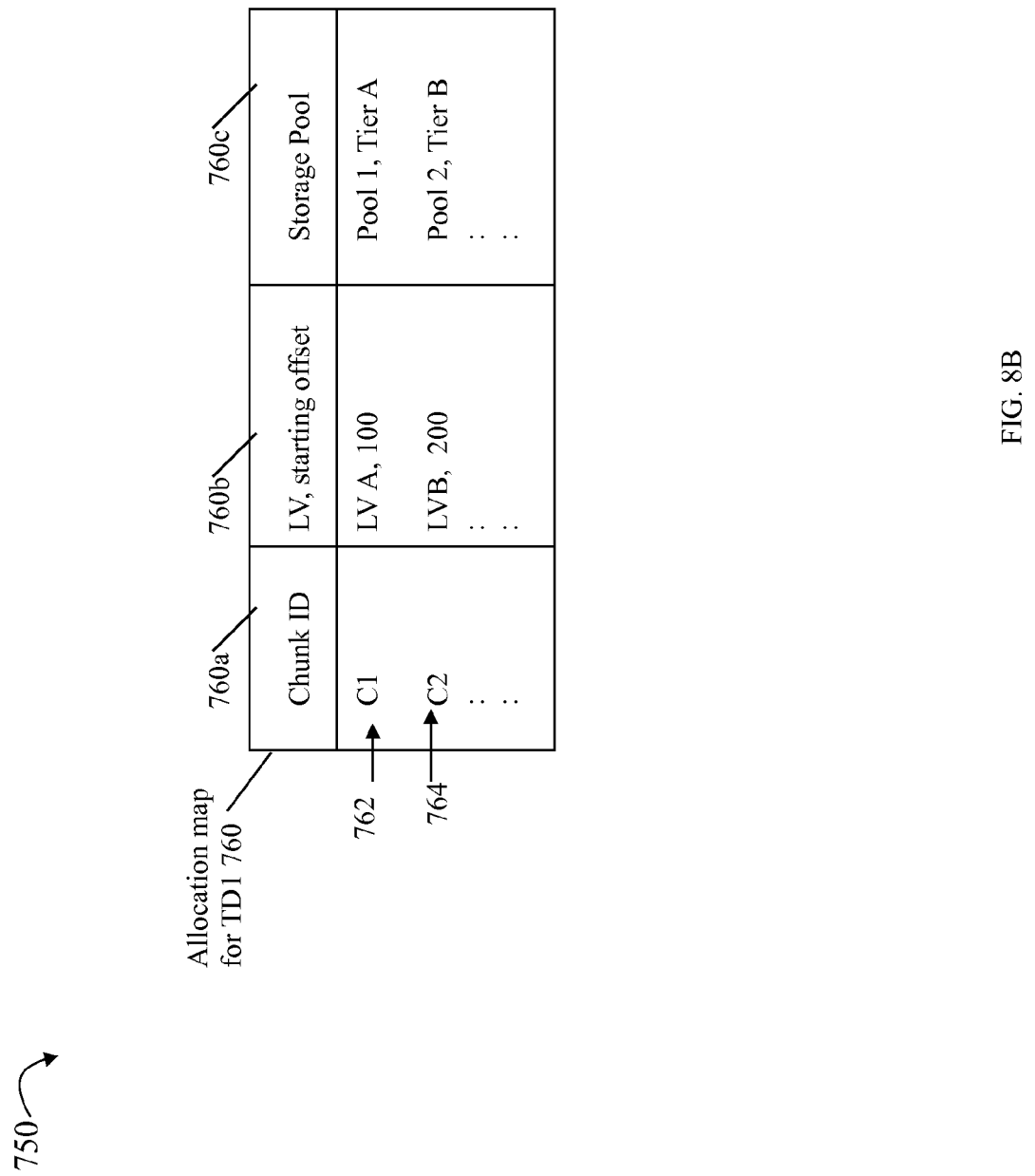

Referring to FIG. 8B, shown is an example representation of information that may be included in an allocation map in an embodiment in accordance with techniques herein. An allocation map may be used to identify the mapping for each thin device (TD) chunk (e.g. where each chunk is physically located). Element 760 represents an allocation map that may be maintained for each TD. In this example, element 760 represents information as may be maintained for a single TD although another allocation map may be similarly used and maintained for each other TD in a storage group. Element 760 may represent mapping information as illustrated in FIG. 8A such as in connection the mapping of 702 to different storage pool devices. The allocation map 760 may contain an entry for each chunk and identify which LV and associated physical storage is mapped to the chunk. For each entry or row of the map 760 corresponding to a chunk, a first column 760a, Chunk ID, denotes an identifier to uniquely identify the chunk of the TD, a second column 760b, indicates information about the LV and offset to which the chunk is mapped, and a third column storage pool 760c denotes the storage pool and tier including the LV of 760b. For example, entry 762 represents chunk C1 illustrated in FIG. 8A as 702a and entry 764 represents chunk C2 illustrated in FIG. 8A as 702b. It should be noted that although not illustrated, the allocation map may include or otherwise use other tables and structures which identify a further mapping for each LV such as which physical device locations map to which LVs. This further mapping for each LV is described and illustrated elsewhere herein such as, for example, with reference back to FIG. 5B. Such information as illustrated and described in connection with FIG. 8B may be maintained for each thin device in an embodiment in accordance with techniques herein.

In connection with collecting statistics characterizing performance, workload and/or activity for a thin device, one approach may be to collect the information per chunk or, more generally, for the smallest level of granularity associated with allocation and de-allocation of storage for a thin device. Such statistics may include, for example, a number of reads/unit of time, #writes/unit of time, a number of pre-fetches/unit of time, and the like. However, collecting such information at the smallest granularity level does not scale upward as number of chunks grows large such as for a single thin device which can have up to, for example 300,000 chunks.

Therefore, an embodiment in accordance with techniques herein may collect statistics on a grouping of "N" chunks also referred to as an extent, where N represents an integer number of chunks, N>0. N may be, for example, 480 in one embodiment. Each extent may represent a consecutive range or portion of the thin device in terms of thin device locations (e.g., portion of the address space or range of the thin device). Note that the foregoing use of consecutive does not refer to physical storage locations on physical drives but rather refers to consecutive addresses with respect to a range of addresses of the thin device which are then mapped to physical device locations which may or may not be consecutive, may be on the same or different physical drives, and the like. For example, in one embodiment, an extent may be 480 chunks (N=480) having a size of 360 MBs (megabytes).

An extent may be further divided into sub extents, where each sub extent is a collection of M chunks. M may be, for example 10 in one embodiment. In one embodiment, the sub-extent size may correspond to the smallest granularity of data movement. In other words, the sub extent size represents the atomic unit or minimum amount of data that can be operated upon when performing a data movement such as between storage tiers.

Figure 9:
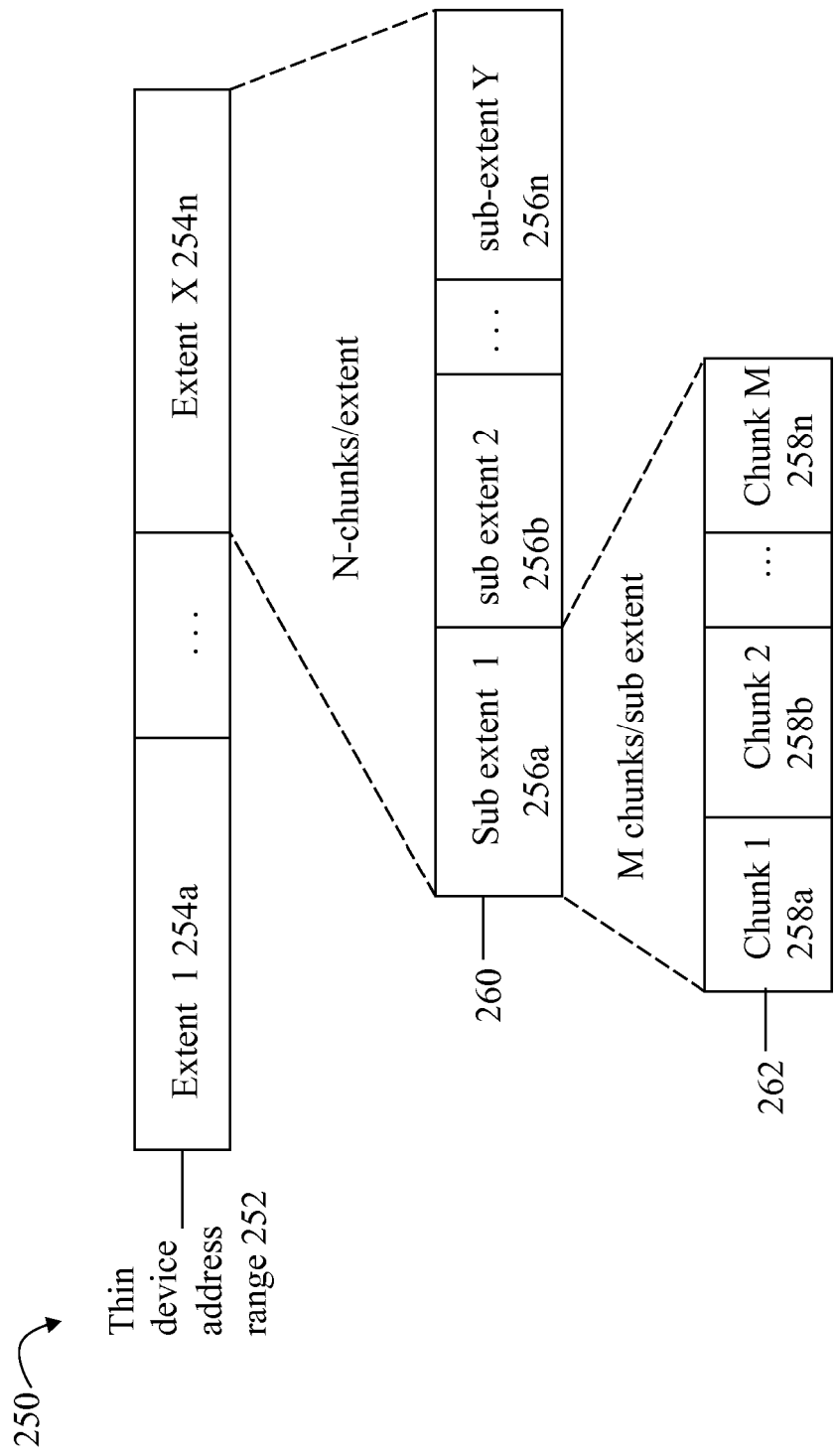
FIG. 9 is an example illustrating data portions comprising a thin device's logical address range.

Referring to FIG. 9, shown is an example illustrating partitioning of a thin device's address space or range in an embodiment in accordance with techniques herein. The example 250 includes a thin device address space or range 252 which, as described elsewhere herein, includes chunks mapped to physical storage locations. The thin device address space or range 252 may be partitioned into one or more extents 254a-254n. Each of the extents 254a-254n may be further partitioned into sub-extents. Element 260 illustrates that extent X 254n may include sub extents 256a-256n. Although only detail is illustrated for extent 254n, each of the other extents of the thin device also includes a same number of sub extents as illustrated for 254n. Each of the sub extents 256a-256n may represent a grouping of "M" chunks. Element 262 illustrates that sub extent 1 256a may include chunks 258a-258n. Although only detail is illustrated for sub extent 256a, each of the other sub extents 256b-256n also includes a same number of "M" chunks as illustrated for 256a. Thus, each of the extents 254a-254n may represent an grouping of "N" chunks, where $$N=\text{\# sub extents/extent}*M \text{ chunks/sub extent} \quad \text{EQUATION 1}$$

An embodiment in accordance with techniques herein may collect statistics for each extent and also other information characterizing activity of each sub extent of a thin device. Statistics for each extent may be characterized as either long term or short term. Short term refers to statistics which may reflect performance, workload, and/or I/O activity of an extent with respect to a relatively short window of time. Thus, short term statistics may reflect recent extent activity for such a short time period. In contrast and relative to short term, long term refers to statistics reflecting performance, workload and/or I/O activity of an extent with respect to a longer period of time. Depending on the evaluation being performed, such as by the optimizer, it may be desirable to place greater weight on short term information than long term, or vice versa. Furthermore, the information maintained per sub extent may be used as needed once particular extents of interest have been identified.

Figure 10:
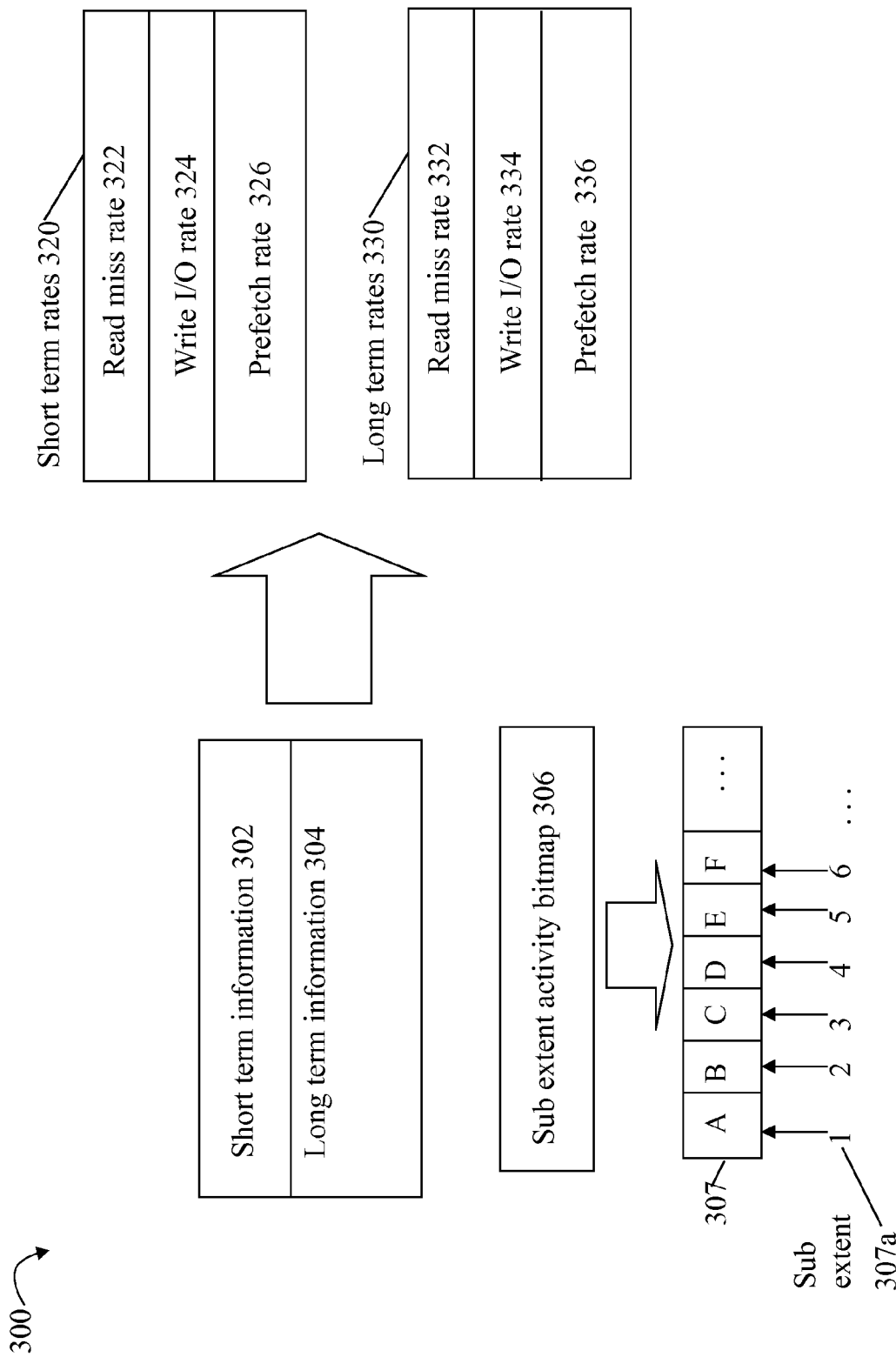
FIG. 10 is an example of performance information that may be determined in connection with thin devices in an embodiment in accordance with techniques herein.

Referring to FIG. 10, shown is an example of information that may be collected and used in connection each extent in an embodiment in accordance with techniques herein. The example 300 illustrates that short term information 302, long term information 304 and a sub extent activity bitmap 306 may be collected for each extent. The short term information 302 and long term information 304 may be used in connection with determining short term rates 320 and long term rates 330 for each extent. The statistics included in 302, 304, 320 and 330 may reflect activity with respect to the entire extent. The activity bitmap 306 is illustrated in further detail by element 307 as including an entry for each sub extent in the associated extent. Entries of 307 are denoted by A, B, C, and the like. Each of the entries of 307 represents aggregated or collective activity information for a corresponding sub extent denoted by the numeric identifiers 307a of 1, 2, 3, etc. Each entry of 307 may include one or more bits used to encode an activity level with respect to all chunks of a corresponding sub-extent. For example, the entry of 307 denoted as A represents an activity level for all chunks in sub extent 1. An embodiment may use any number of bits for each entry of the activity bitmap 306, 307. For example, in one embodiment, each entry of the activity bitmap may be 2 bits capable of representing any of 4 integer values—0, 1, 2, and 3.

As will be described in following paragraphs, the short term rates 320, long term rates 330 and sub extent activity bitmap 306 may be used in connection with a variety of different evaluations such as by the optimizer 138. Generally, the activity level information or data for an extent such as illustrated in FIG. 10 may be referred to as extent activity level information including one or more metrics indicating an activity level for the extent. The extent activity level information may comprise short term activity information (e.g., such as 302 and/or 320) and long term activity information (e.g., such as 304 and 330).

In one embodiment, the short term rates 320 for an extent may include a read miss rate (e.g., random read miss (RRM) rate) 322, a write I/O rate 324 and a pre-fetch rate 326 for the extent. The long term rates 330 for an extent may include a read miss rate 332 (e.g., number of read misses/unit of time, where a read miss refers to a cache miss for a read), a write I/O rate 334 (e.g., number of writes/unit of time) and a pre-fetch rate 336 (e.g., number of pre-fetches/unit of time) for the extent. As known in the art, data may be pre-fetched from a physical device and placed in cache prior to reference or use with an I/O operation. For example, an embodiment may perform sequential stream I/O recognition processing to determine when consecutive portions of a thin device are being referenced. In this case, data of the sequential stream may be pre-fetched from the physical device and placed in cache prior to usage in connection with a subsequent I/O operation. In connection with a portion of data at a first point in a sequential stream associated with a current I/O operation, data subsequent to the first point may be pre-fetched such as when obtaining the portion from a physical device in anticipation of future usage with subsequent I/Os. The short term pre-fetch rate 326, as well as the long term pre-fetch rate 336, may also be referred to as denoting a number of sequential reads or sequential read miss operations performed since such pre-fetching may occur in response to determination that a read operation is performed for data which is not in cache (read miss) and the read operation is for data included in a series of sequentially read data portions as described above. The read miss rates 322 and 332 may represent random read miss (RRM) rates where such read misses (e.g., data requested not currently in cache) are associate with read operations not included in connection with reading data of a sequential stream (e.g., all read misses not used in connection with computing 326 and 336).

Each of the foregoing rates of 320 and 330 may be with respect to any unit of time, such as per second, per hour, and the like. In connection with describing elements 302 and 304 in more detail, what will be described is how an embodiment in accordance with techniques herein may determine the short term rates 320 and long term rates 330 using a decay function and decay coefficients.

In an embodiment in accordance with techniques herein, a decay coefficient may be characterized as a weighting factor given to previous activity information. The higher the coefficient, the greater the weight given to previous activity information for the extent. Thus, the adjusted activity level of an extent at a current time, "An", may be generally represented as a function of a current observed or actual activity level for the current time, "$a_n$", a decay coefficient, "r", and previous adjusted activity level for the previous time period or sampling period, "$A_{n-1}$". In connection with the foregoing, "A" may represent an adjusted activity level, "n" may denote the current time period or sampling period and "n−1" may denote the immediately prior or previous time period or sampling period at which the activity for the extent was determined. In other words, "$a_n$" is adjusted to take into account previous activity as represented by "$A_{n-1}$" and "An" represents the resulting adjusted value of "$a_n$". With respect to a statistic or metric such as a number or read misses, "$a_n$" and "An" may each represent an integer quantity or number of read misses within a current sampling period, "n". The foregoing may generally be represented as:

$$An = a_n + (r * A_{n-1}) \quad \text{EQUATION 2}$$

wherein
$a_n$ is the actual observed activity metric for the current or "nth" sampling period,
"r" is a decay coefficient,
"$A_n$" is the adjusted activity metric for the current or "nth" sampling period, and
"$A_{n-1}$" is the adjusted activity metric from the previous or "n−1" sampling period.

Beginning with an initial time period or sampling period, denoted by i="0" (zero), the adjusted activity A0 may be initially that which is observed, a0. Subsequent observed or actual activity levels may be adjusted as described above. Generally, "$a_i$" may denote an actual or observed value obtained for an activity metric for a sampling period "i", where "i" is an integer greater than or equal to 0. "Ai" may similarly denote an adjusted activity metric (or adjusted value for "$a_i$") for a sampling period "i", where "i" is an integer greater than or equal to 0. Thus, for consecutive sample periods at which actual or observed activity metrics are obtained (as denoted by lower case "$a_i$"s), corresponding adjusted activity levels (e.g., "A" values) may be determined as follows:

$$A0 = a0$$

/*Adjusted activity level A0, at time=0 or initially*/

$$A1 = a1 + (r * A0)$$

/*Adjusted activity level A1, at first sampling period, i=1*/

$$A2 = a2 + (r * A1)$$

/*Adjusted activity level A2, at second sampling period, i=2*/
⋮ and so on for subsequent sampling periods 3, 4, and the like, based on EQUATION 2.

In connection with EQUATION 2, $0 <= r < 1$, where "r" is a decay coefficient or weight given to previous activity. Varying "r" in EQUATION 2 results in accordingly varying the weight given to past or previous activity. If r=0, then no weight is given to previous or historic values. Thus, the closer "r" is to 0, the lesser weight given to previous activity. Similarly, the closer "r" is to 1, the greater the weight given to previous activity. In connection with determining an adjusted activity level, An, using EQUATION 2 for short term and long term, different decay coefficients may be selected. Generally "r" for short term is less than "r" used in connection with long term activity. For example, in one embodiment, "r" used in connection short term activity levels may be 50% or 0.50 or smaller. "r" used in connection with long term activity levels may be 80% or 0.80 or larger. The foregoing are exemplary values that may be selected for "r" in connection with short term and long term activity levels depending on the weight to be given to previous activity. In connection with short term activity, a decay coefficient may be selected in accordance with providing a relatively short term rate of decay for an activity level metric determined at a point in time. For example, a short term rate of decay may provide for a rate of decay for an activity level metric on the order of one or more hours (e.g., less than a day). In connection with long term activity, a decay coefficient may be selected in accordance with providing a relatively long term rate of decay for an activity level metric determined at a point in time. For example, a long term rate of decay may provide for a rate of decay for an activity level metric on the order of one or more days, a week, and the like. Thus, an activity metric at a first point in time may have a weighted or residual effect on an adjusted activity level determined at a later point in time in accordance with the selected decay coefficient indicating the rate of decay of the activity metric.

As mentioned above, EQUATION 2 results in a metric or count, such as a number of read misses, number of writes, or number or pre-fetches during a sample period. It may be desirable to also determine a rate with respect to a unit of time, such as per second, per hour, and the like, for each of the foregoing adjusted activity metrics An. A rate with respect to a unit of time for the adjusted activity level An may be represented as:

$$Ar = An * (1-r)/(1-r^{n-1}) \quad \text{EQUATION 3}$$

where
Ar=the adjusted activity rate per unit of time,
r=decay coefficient or weight as described above,
n=denotes an "nth" sampling period as described above,
An=adjusted activity level determined for a given sampling period "n" (e.g. using EQUATION 2 as described above).

Generally, the higher the decay coefficient, r, the slower the change in Ar as may be the desired case with long term Ar values. Thus an embodiment may select decay coefficients for use with long term and short term Ar values so that, when plotted with respect to time, long term Ar values generally have a smaller slope than that associated with short term Ar values.

Figure 11:
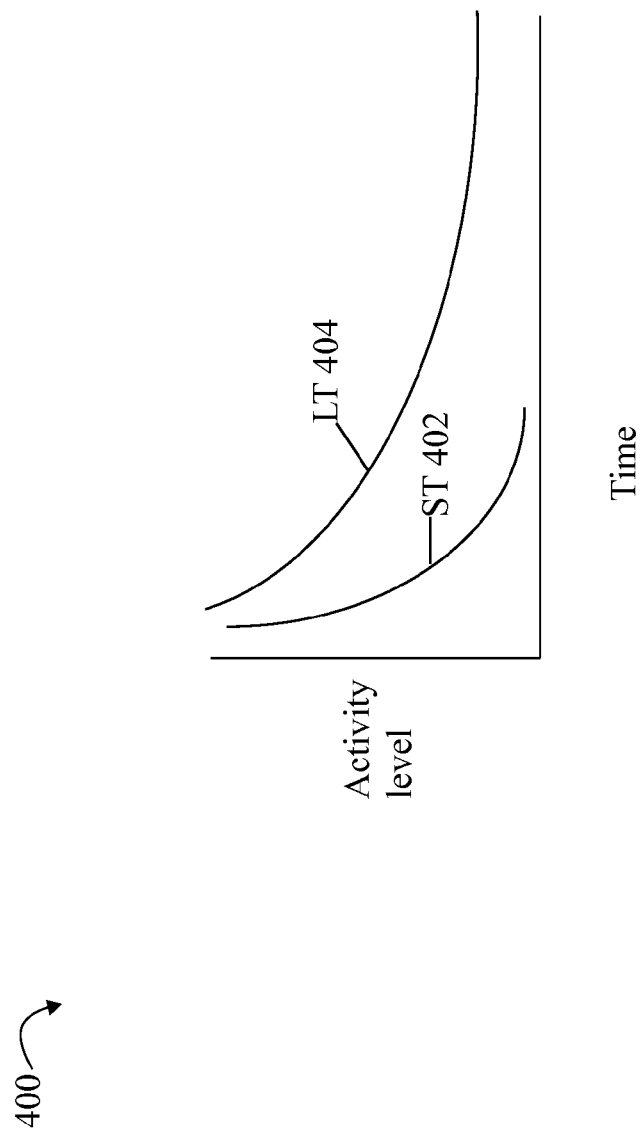
FIG. 11 is a graphical illustration of long term and short term statistics described herein.

Referring to FIG. 11, shown is an example graphically illustrating the general shape of curves for long term (LT) and short term (ST) values in an embodiment in accordance with techniques herein. The activity level values (Y-axis values) are plotted with respect to time (X-axis). The activity level values may be determined using EQUATIONS 2 and/or 3. Curve 402 may be produced using one of EQUATIONS 2 and 3 where a first value for the decay coefficient "r" is selected for ST usage. Curve 404 may be produced using one of EQUATIONS 2 and 3 where a second value for the decay coefficient "r" is selected for LT usage. The values selected for "r" in connection with 402 and 404 may be relative so that the first value for "r" used with 402 is less than the second value for "r" used with 404.

In one embodiment, each of the different An values determined using EQUATION 2 may be converted to a corresponding Ar value using EQUATION 3 when desired.

In connection with the foregoing, for example, with respect to a number of read misses, "$a_n$" represents the number of such operations that have occurred in a current sample period, n. For example, if a sample period=10 minutes so that statistics for an extent are collected and/or computed every 10 minutes, "$a_n$" represents the number of read misses that occurred in the last 10 minute sample period or time interval. $A_{n-1}$ represents the previous or last A calculation (e.g., as determined using EQUATION 2) from the previous sample period, denoted "n−1".

With reference back to FIG. 10, an embodiment may collect short term information 302 as counter values indicating a count or number of each type of operation for a current time period or sampling period "n". The following may represent different "$a_n$" values as included in the short term information 302 for an extent: read miss count (number of read misses for the extent during the sampling period), pre-fetch count (number of pre-fetches for the extent during the sampling period) and write count (number of writes for the extent during the sampling period).

The short term information 302 may also include storing previous A values as determined for the sampling period "n−1" using EQUATION 2 above. For example, short term information 302 may also include storing three (3) previous adjusted activity level values or A values for sampling period "n−1" using EQUATION 2 above for the read miss count, pre-fetch count and write count.

The short term information 302 may also include a timestamp value indicating the timestamp associated with the previous sampling period "n−1".

Using the above-mentioned short term information 302, an embodiment may calculate updated short term rates 320 using EQUATION 3 for a sampling period "n" for a selected "r" as a short term decay coefficient. With each new sampling period, the short term information may be accordingly updated so that which is associated with sampling period "n" subsequently becomes associated with sampling period "n−1".

The long term information 304 may include long term rates or Ar values as determined using EQUATION 3 for a read miss rate (e.g., number of read misses/second), a pre-fetch rate (e.g., number of pre-fetches/second) and a write rate (e.g., number of writes/second). The long term information 304 may also include a time duration interval used for determining an adjusted Ar value for the current time or sampling period "n". For example, the time duration interval may represent the amount of time for which statistics are collected and used in connection with long term Ar values. An embodiment may store a set of long term Ar values rather than calculate such Ar values on demand from other stored information as in the case above for short term rates 320 (e.g., where short term information 302 is stored and used to calculate short term rates 320 on demand). Thus, in such an embodiment, the long term rates 330 may be included the long term information 304 where such long term rates 330 may be updated with each sampling period. In one embodiment with the arrival of a new sampling period "n", the long term information 304 may include Ar values for the foregoing statistics as determined using EQUATION 3 for a sampling period "n−1". These long term Ar values for "n−1" may each be multiplied by the time duration interval to determine $A_{n-1}$, an adjusted metric for the long term time period. The foregoing $A_{n-1}$ value may then be used with EQUATION 2 to determine An for the current sampling period "n" using a selected "r" as a long term decay coefficient. Using An, EQUATION 3 may then be used to obtain updated long term rates Ar values. With each new sampling period, the long term information may be accordingly updated so that which is associated with sampling period "n" subsequently becomes associated with sampling period "n−1".

With reference back to FIG. 10, described above is an activity bitmap 306 having an entry per sub extent where each such entry may indicate an aggregate or collective activity level with respect to all chunks of the associated sub-extent. The number of different activity level states that may be represented for each sub extent depends on the number of bits per entry of the activity bitmap. In one embodiment, each entry of the activity bitmap may be 2 bits as described above so that each entry may be an integer in the inclusive range of 0 . . . 3. Processing may be performed to decrement each entry having a non-zero value by 1 every predetermined time period, such as every 12 hours. Each time there is any I/O operation to a sub extent since the sub extent was located or moved to its current physical location, the sub extent's entry in the activity bitmap 306 may be set to 3. Thus, each entry in the bitmap may represent activity level information for up to 3 of the predetermined 12 hour time periods. An embodiment may also have a different number of bits per entry to represent a larger number of predetermined time periods. Based on the foregoing, the lower the value of a bitmap entry for a sub extent, the longer the amount of time that has lapsed since the sub extent has had any I/O activity.

Figure 12:
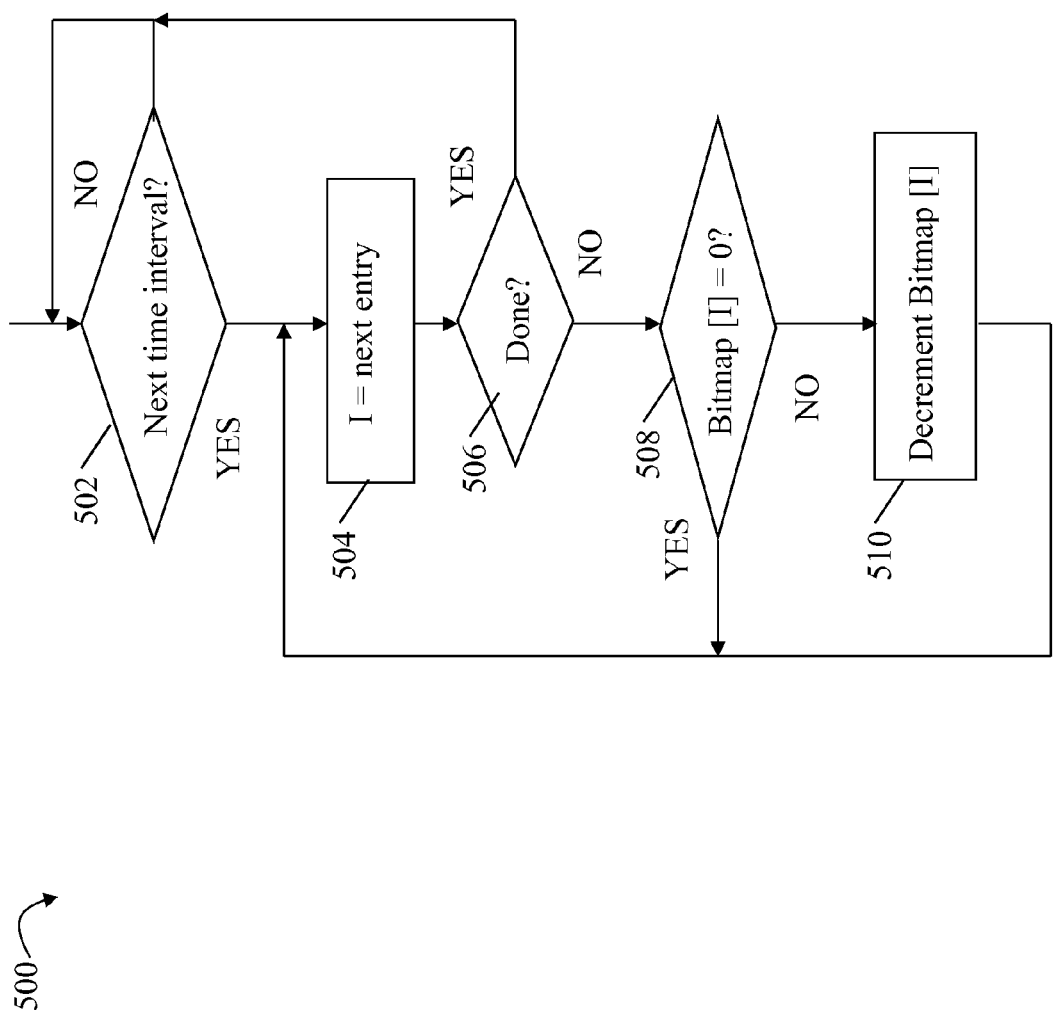
FIGS. 12, 15, 17, 18, and 19 are flowcharts of processing steps that may be performed in an embodiment in accordance with techniques herein.

Referring to FIG. 12, shown is a flowchart of processing steps that may be performed in connection with each activity bitmap associated with an extent in an embodiment in accordance with techniques herein. The flowchart 500 summarizes processing described above where each bitmap for each extent may be traversed with the occurrence of a predetermined time interval, such as every 12 hours. At step 502, a determination is made as to whether the next time interval has lapsed. If not, processing waits at step 502 until step 502 evaluates to yes and control proceeds to step 504. At step 504, I is initialized to the next entry in the bitmap. I represents a loop counter when traversing through the bitmap and denotes the bitmap entry currently selected for processing. At step 506, a determination is made as to whether the entire bitmap has been processed. If step 506 evaluates to yes, control proceeds to step 502 until an amount of time again lapses equal to that of the time interval. If step 506 evaluates to no, control proceeds to step 508 where a determination is made as to whether the current bitmap entry (e.g. bitmap [I]) is zero. If so, control proceeds to step 504. Otherwise, control proceeds to step 510 where the current bit map entry is decremented by one (1) and control proceeds to step 504 to process the next entry in the bitmap.

The activity bitmap may be used in connection with determining an activity level associated with each sub extent, the smallest amount of data that can be associated with a data movement operation to relocate data from one physical device to another. It should be noted that an embodiment may have functionality and capability to physically move data in units or amounts less than a sub extent. However, when performing processing to determine data movement candidates, such as by the optimizer, such processing may consider candidates for data movement which have a minimum size of a sub extent. That is, all data of the sub extent may be either moved or relocated as a complete unit, or remains in its current location. In connection with a sub extent when performing a data movement, it may be that not all chunks of the sub extent are actually moved. For example, suppose a sub extent is 10 chunks and the sub extent is to be moved from a first storage tier, such as from SATA or FC, to a second storage tier, such as flash. It may be that 9/10 chunks of the sub extent are unallocated or already in flash storage with only 1 chunk stored in the first storage tier. In this case, processing only needs to actually move the single chunk from the first storage tier to flash since the remaining 9 chunks are either already in the flash tier or unallocated. With a sub extent, the amount of data actually moved may be at most the size of the sub extent but may be less depending on, for example, whether all chunks of the thin device sub extent are allocated (e.g., actually map to physical storage), depending on the current physical device upon which chunks of the sub extent are located prior to movement, and the like. It should be noted that chunks of a sub extent may be located in different storage tiers, for example, depending on where the chunk's data is stored such as at the time when written as well as the result of other conditions that may vary with embodiment.

As an example use of the activity bitmap is in connection with promotion and demotion. As an example use of the activity bitmap, the bitmap may be used to determine selective sub extents which exhibit the highest activity level such as those having counters=3 (e.g., "hot" or active areas of the extent). These sub extents may be candidates for promotion or data movement to a higher performing storage tier and may be given preference for such promotion and data movement over other sub extents having activity bitmap entries which are less than 3. In a similar manner, the activity bitmap may be used to identify the "coldest" or inactive sub extents. For example, sub extents having bit map entries=0 may be candidates for demotion to a lower performing storage tier.

In connection with promotion data movements, an embodiment may want to be responsive to a change in workload with respect to the short term. With demotion, an embodiment may not want to move data as quickly as with promotion and may also want to consider longer term workloads prior to moving such data to a lesser performing storage tier. With promotion, an embodiment may give greater weight to ST workload and activity data. With demotion, an embodiment may additionally consider LT workload and activity rather than just such ST information.

The information as described and illustrated in FIGS. 10-12 above may be used for a variety of different purposes and evaluations. For example, an embodiment may use one or more of the short term rates to identify one or more active extents based on such aggregated extent-level activity data. Subsequently, once an active extent is identified such as a candidate for promotion, the extent's activity bitmap may be examined to determine which sub extents are most active. Processing may be performed to selectively move some of the sub extents of the active extent (e.g., those with counters=3) to a higher performing storage tier.

As another example, the activity bitmaps of extents may be used to determine a promotion ranking used to identify which extent may be promoted prior to one or more other extents. To further illustrate, an embodiment may have two extents, both which are candidates for promotion. The two extents may exhibit similar activity levels based on aggregate extent-level information such as based on short term rates 320 for each extent. The extent having the lesser number of active sub extents may have a higher priority for movement than the other extent. For example, processing may be performed to count the number of non-zero bit map entries for each of the two extents. The extent having the lower count may have a higher priority than the other extent having a higher count. In other words, the extents may be ranked or ordered for promotion based on a number or count of non-zero bit map entries. The extent having the lower count may be characterized as also exhibiting the greatest activity level density based on the foregoing counts of the activity bitmaps.

As another example in connection with demotion, an embodiment may use one or more of the short term rates 320 in combination with one or more of the long term rates 330 to identify one or more inactive extents based on such aggregated extent-level activity data. Subsequently, once an inactive extent is identified, the extent's activity bitmap may be examined to determine which sub extents are inactive and should be demoted rather than automatically demoting all sub extents of the inactive extent. Processing may be performed to selectively move some of the sub extents (e.g., those with counters=0, counters less than some threshold such as 1, and the like) to a lower performing storage tier.

One embodiment in accordance with techniques herein may include multiple storage tiers including a first tier of flash devices and one or more other tiers of non-flash devices having lower performance characteristics than flash devices. The one or more other tiers may include, for example, one or more types of disk devices. The tiers may also include other types of SSDs besides flash devices.

The different levels of activity information described herein as obtained at a thin device level, extent level, and sub extent level provide a hierarchical view for characterizing activity of different portions of thin devices. Activity information at higher device levels may be used to first identify devices which may be candidates for data movement, such as between storage tiers (e.g. for promotion and/or demotion). In connection with thin devices, once such a first device is identified, additional detail regarding the first device's activity as reflected in extent activity level information may be used to identify an extent of the first device as a candidate for data movement. Subsequently, the activity bitmap for the extent identified may then be used to determine one or more sub extents of the identified extent for data movement. The techniques herein may be used for collecting and tracking activity of thin devices. Use of the decay coefficients and equations for determining adjusted activity levels to account for previous activity levels provides an effective way of tracking workload and activity over time without having to keep a large database of historical statistics and metrics for long and short time periods.

In addition to the activity information described above for each extent and sub extent of a thin device, an embodiment may also track device level activity information for logical devices (e.g., thin devices, LVs, and the like) and physical devices in a data storage system as also noted. Additionally, an embodiment may track activity information for thin device pools. When a DA or other device interface services an I/O, the DA may not typically have any knowledge regarding thin devices as may be known from the host's point of view. In connection with collecting data for use with techniques herein, each DA may be provided with additional mapping information regarding thin devices and where storage for the thin devices is allocated (e.g., such as described by the allocation map). The DA may use this information to determine what thin device (if any) is associated with a given back end I/O request. When the DA is servicing a back end I/O request, the DA may record information about the I/O including information about the thin device associated with the I/O request. Such additional information about the thin device may be used in order to perform statistics collection of activity data for the thin devices in accordance with techniques herein.

In addition to the statistics and activity data described above, an embodiment may also collect and store information regarding expected I/O size information for each extent, thin device (or other logical device), physical device, and the like. Such information may be determined in any one or more suitable ways in an embodiment. For example, an embodiment may determine expected I/O sizes that represent the average size with respect each of the particular types of I/O operations for which statistics are collected. In connection with the embodiment herein, the types of I/O operations for which statistics are collected may be as described above for read miss or random read miss (RRM), pre-fetch (P) or sequential read miss (SRM), and write (W). In a manner similar to that as described elsewhere herein for other statistics, the average I/O sizes may be determined based on size information collected for observed I/O operations. The collected size information based on observed I/Os may be used in determining or modeling expected I/O sizes in connection with equations, such as EQUATION 4, described elsewhere herein when determining various scores. For example, an embodiment may determine a first average I/O size based on I/O sizes of write operations observed for a time period, a second average I/O size based on I/O sizes for SRM operations for a time period, and a third average I/O size based on I/O sizes for RRM operations for a time period. The foregoing average I/O sizes may be tracked with respect to each extent and other levels (e.g., thin device, physical device, etc) in a manner similar to that as described above such as in FIG. 10 for other statistics. An embodiment may also use other approaches which may be further simplified. For example, rather than track such I/O size information for each extent, an embodiment may determine an average I/O size with respect to each particular type of I/O operation (W, RRM and SRM) as an aggregate across one or more devices, such as for a physical device, pool of physical devices, thin device, and the like, and then determine an average I/O size with respect to all extents or data portions thereof. In one embodiment, the expected I/O size for any desired I/O operation type such as used in connection with EQUATIONs 4 and 5 described elsewhere herein, may be computed as an average I/O size based on previously gathered data including metrics related to total amount of data (in bytes, megabytes, or other size unit) for a given time period and total number of I/O operations (for the time period over which the total amount of data is determined). More formally, the average I/O size used as an expected I/O size for a given I/O type may be represented as:

$$\text{Ave size for given I/O type} = \text{TOTAL\_DATA\_TRANSFER} / \text{TOTAL\_OPS} \quad \text{EQUATION 3A}$$

where

"Ave size for given I/O type" is the average or expected I/O size for a given I/O operation type (e.g., Read, Write, Read miss, etc.);

"TOTAL_DATA_TRANSFER" is the total amount of data (e.g., in bytes, megabytes or other size unit) for the desired I/O operation type for a given time period; and "TOTAL_OPS" is the total number of I/O operations observed during the time period for which the TOTAL_DATA_TRANSFER is observed.

It should be noted that EQUATION 3A is one way in which an embodiment may estimate that averages as may be used in connection with expected I/O sizes as described elsewhere herein. Another way an embodiment may determined average I/O sizes is based on a an equation using weighted averages, using information as may be gathered using the allocation map as described elsewhere herein (e.g., to gather information for data portions based on I/Os directed to the physical device where such data portions are stored), and more generally any suitable technique.

In connection with techniques in following paragraphs, the extent-based short term and long term statistics or metrics as described in FIG. 10 may be used in determining scores indicating the activity of extents. In one embodiment, the score may be a weighted value based on a combination of all six metrics 322, 324, 326, 332, 334 and 336 of FIG. 10 although an embodiment may generally use any metrics in determining such scores. In an embodiment herein, a promotion score for an extent may be represented in EQUATION 4 as:

$$((P1*P7*s\_rrm)+(P2*P8*s\_w)+(P3*P9*s\_p)+(P4*P10*l\_rrm)+(P5*P11*l\_w)+(P6*P12*l\_p))/(\text{\# Active Subext}+1)$$

where s_rrm is the rate of short term random read misses (322), s_w is the rate of short term writes (324), s_p is the rate of short term pre-fetches or SRMs (326), l_rrm is the rate of long term random read misses (332), l_w is the rate of long term writes (334), and l_p is the rate of long term pre-fetches or SRMs. The coefficients P1-P12 may be set as appropriate and are described in more detail elsewhere herein. It should be noted that "#Active Subext" represents the number of active subextents or subportions of an extent or other larger data portion for which the score is being determined. Examples of evaluating when a subextent or other subportion is active are described elsewhere herein. It should be noted that metrics used in connection with determining promotion and/or demotion score may take into account I/O size.

The coefficients P1-P6 may represent weights assigned to the different operation types denoting how much weight is given to each particular operation type (e.g., which of random read miss (RRM), pre-fetch (P) or sequential read miss (SRM), write (W)) and the long term and short term variants of expected rates at which such operation types are expected (e.g., predicted or modeled) to occur in the future. In one aspect, the coefficients P1 and P4 represent the weighted preference given to the RRM operation type relative to the other operations types of SRM (or P) and W.

In particular, P1 represents the weighted preference given to the short term operation count or rate for the RRM operation type and P4 represents the weighted preference given to the long term operation count or rate for the RRM operation type. In a similar manner, the coefficients P2 and P5 represent the weighted preference given to the W operation type relative to the other operations types of SRM (or P) and RRM. In particular, P2 represents the weighted preference given to the short term operation count or rate for the W operation type and P5 represents the weighted preference given to the long term operation count or rate for the W operation type. Furthermore, the coefficients P3 and P6 represent the weighted preference given to the P or SRM operation type relative to the other operations types of W and RRM. In particular, P3 represents the weighted preference given to the short term operation count or rate for the P or SRM operation type and P6 represents the weighted preference given to the long term operation count or rate for the P or SRM operation type. The weights or coefficients P1-P6 may be generally referred to as operation type weights. In some embodiments, values for P1-P6 may be dynamically selected each time a new set of statistics or metrics (e.g., 320 and 330 of FIG. 10) are utilized in performing processing described herein. Values for P1-P6 may be generally selected based on expected storage tier workload characteristics and particular performance characteristics of physical drives in the different tiers. Examples of how values for P1-P6 may be selected are described in more detail elsewhere herein. It should be noted that an embodiment may also use a combination of fixed values for P1-P6 when determining a score in connection with evaluating which data portions to store in one or more of the storage tiers and may use dynamically determined values for P1-P6 when determining a score in connection with evaluating which data portions to store in one or more others of the storage tiers. For example, an embodiment may use dynamically selected values for P1-P6 when determining a promotion score of EQUATION 4 for use when evaluating which data portions to store in a target high performing SSD or flash-based storage tier, and may otherwise use a same set of fixed values for P1-P6 when determining a promotion score of EQUATION 4 for use when evaluating which data portions to store in a non-SSD or non-flash-based storage tiers (e.g., storage tiers comprising rotational disk drives). In an embodiment, the fixed values used for P1-P6 for non-SSD-based tiers may be 12, 4, 4, 3, 1, and 1, respectively. Of course, different values may be used to emphasize or deemphasize different I/O characteristics in connection with determination of the promotion raw score. Thus, different values for weights P1-P6 may be selected for use depending on which target tier the promotion score is being calculated for. Such values may be dynamically and continually determined based on current expected workload characteristics of a storage tier at different points in time. An embodiment may also selected weights for P1-P6 which are fixed or static throughout operation and performance of the techniques herein where such a fixed set of the same weights may be used for one or more storage tiers.

The coefficients P7-P12 may represent additional weights assigned or associated with each particular variant combination of operation type (e.g., RRM, SRM or P, and W) and short term or long term for each operation type. Generally, the coefficients P7-P12 may represent weighting factors that may be characterized as varying with, dependent on, or a function of, expected I/O size for the three different operation types of RRM, SRM or P, and W. In particular, P7 and P10 represent weighting factors that vary with, or are a function of, expected I/O size for the RRM operation type. P8 and P11 represent weighting factors that vary with, or are a function of, expected I/O size for the W operation type. P9 and P12 represent weighting factors that vary with, or are a function of, expected I/O size for the P or SRM operation type. Weights P7-P12 may also be referred to herein as I/O size or data transfer weights. As noted above, EQUATION 3A is one way in which the expected I/O size may be determined for use in connection with determining such weights. It should also be noted that as a variation to the above where in one embodiment, size weights as represented using P7-P12 may be applied to only the short term metrics (e.g., always use a size weight of 1 for weights P10, P11 and P12 for long term metrics).

In some embodiments, values for P7-P12 may be dynamically selected each time a new set of statistics or metrics (e.g., 320 and 330 of FIG. 10) are utilized in performing processing described herein. Values for P7-P12 may be generally selected based on expected storage tier workload characteristics and particular performance characteristics of physical drives in the different tiers. For example, as described in more detail elsewhere herein, if particular storage tiers have physical drives where a response time or other measurement of performance does not exhibit a substantial dependency upon I/O size, then values for P7-P12 may be 1 so as not to introduce any bias based upon expected I/O sizes for the different operation types. Examples of how values for P7-P12 may be selected are described in more detail elsewhere herein. It should be noted that an embodiment may also use fixed values for P7-P12 when determining a score in connection with evaluating which data portions to store in one or more of the storage tiers and may use dynamically determined values for P7-P12 when determining a score in connection with evaluating which data portions to store in one or more others of the storage tiers. For example, an embodiment may use dynamically selected values for P7-P12 when determining a promotion score of EQUATION 4 for use when evaluating which data portions to store in a target high performing SSD or flash-based storage tier and may otherwise use a set of fixed values for P7-P12 of 1 for all of P7-P12 when determining a promotion score of EQUATION 4 for use when evaluating which data portions to store in a non-SSD or non-flash-based storage tiers (e.g., storage tiers comprising rotational disk drives). Of course, different values may be used to emphasize or deemphasize different I/O characteristics in connection with determination of the promotion raw score. Thus, different values for weights P7-P12 may be selected for use depending on which target tier the promotion score is being calculated for.

Values of P7-P12 may be selected as a function of expected I/O sizes for the different operation types. For example, P7 and P10 may be determined as a function of the expected I/O size of the RRM operations with respect to the extents for which the promotion score is being determined. P8 and P11 may be determined as a function of the expected I/O size of the W operations with respect to the extents for which the promotion score is being determined. P9 and P12 may be determined as a function of the expected I/O size of the SRM or P operations with respect to the extents for which the promotion score is being determined.

Values for P7-P12 may be based on each storage tier and drive technology depending on the sensitivity of response time to I/O size. Thus, the drive technology may be used in selecting that particular values for P7-P12 such as using curves of FIGS. 13D and 13E where the more sensitive or greater dependency between response time and I/O size, the greater the variation in values of the bias or weights assigned.

The demotion score for an extent may be represented in EQUATION 5 as:

$$(P4*P10*s\_rrm)+(P5*P11*s\_w)+(P6*P12*s\_p)+\\(P1*P7*l\_rrm)+(P2*P8*l\_w)+(P3*P9*l\_p)$$

where s_rrm, s_w, p1, etc. are as set forth above.

As noted above in connection with the exemplary EQUATIONS 4 and 5 for computing, respectively, the promotion and demotion scores, the same set of coefficients may be used. Alternatively, an embodiment may, however, use a different set of coefficients for computing the promotion and demotion scores.

In a multi-tiered storage system as described herein, an application having its data stored on thin devices of a storage group may be allowed to use multiple tiers of storage. In order to be able to use the storage of the tiers efficiently and also move a minimal number of chunks between tiers, chunks which are the most active or "hot" need to be located in the higher tiers (e.g., promoted to such tiers if not already located there) and chunks which are least active or "cold" need to be located in lower storage tiers (e.g., demoted to such tiers if not already located there). After identifying the hot and cold chunks, processing may be performed to determine how much of the hot chunks should be placed in the different storage tiers in order to efficiently utilize the higher performing tiers, such as flash tiers, while also avoiding overloading any given tier with I/O request or I/O transfer activity to the point that overall performance (e.g., across all tiers in the AP, across one or more SGs, for the whole data storage system, and the like with respect to the physical devices under consideration) would have been better had less of the workload been placed in the tier. In connection with the foregoing, techniques are described in following paragraphs which determine promotion and demotion thresholds of a data movement policy that may be associated with one or more SGs. The data movement policy as described herein in the context of thin devices affects what data portions of thin devices are data movement candidates and may be moved to another tier. The selection of promotion and demotion thresholds may be made by considering criteria including performance limits (e.g., response time, number of I/Os per time period, and the like) and capacity limits. The performance limits may be flexible or adaptable and specified for each storage tier. The capacity limits may also be specified for each storage tier and may include capacity limits included in an AP for the affected one or more SGs. The techniques model response time of target storage tiers when evaluating different alternative hypothetical considerations in which performance limits are varied for each tier when selecting promotion and demotion thresholds. The different sets of performance limits in combination with capacity limits are evaluated by modeling the expected target tier performance and then determining an overall performance metric representing an aggregate modeled performance metric across all target storage tiers for all affected SGs. In one embodiment, the overall performance metric may be an average response time determined with respect to all target storage tiers using the modeled response time as determined for each such tier. The average response time is used to compare the overall modeled performance for the storage tiers when evaluating different sets of performance limits for each target tier. Each set of performance limits specified for multiple tiers may be used as a way to provide weighting factors for I/O workload distribution across the tiers in order to reflect the performance differences of the different tier storage technologies. Utilizing such "what if" analysis to evaluate different sets of performance limits coupled with capacity limits provides for determining promotion and demotion thresholds that may be used by the DA, or more generally, other backend data storage system components, in connection with performing data movements in accordance with workload or performance impact across all target storage tiers to increase overall performance.

In connection with techniques herein as mentioned above, response time may be considered as performance criteria alone, or in combination with other performance criteria in combination with capacity limits, when determining promotion and demotion thresholds affected what data portions of a thin device may be moved between physical storage devices in different storage tiers. The techniques herein consider different performance characteristic information and curves that may vary with each storage tier, type of physical device, device vendor, and the like. In particular, performance curves for the different storage tiers may be determined and used to model target tier and also overall SG performance across storage tiers as part of processing to evaluate different sets of performance limits in combination with capacity limits. As an example, consider a workload of N I/O operations/second. The response time experienced for the same workload varies with storage tier due to the underlying capabilities of each tier's technology. As such, performance curves may be used in connection with techniques herein to model expected response times if a particular data movement is performed in accordance with candidate promotion and demotion thresholds.

Figure 13:
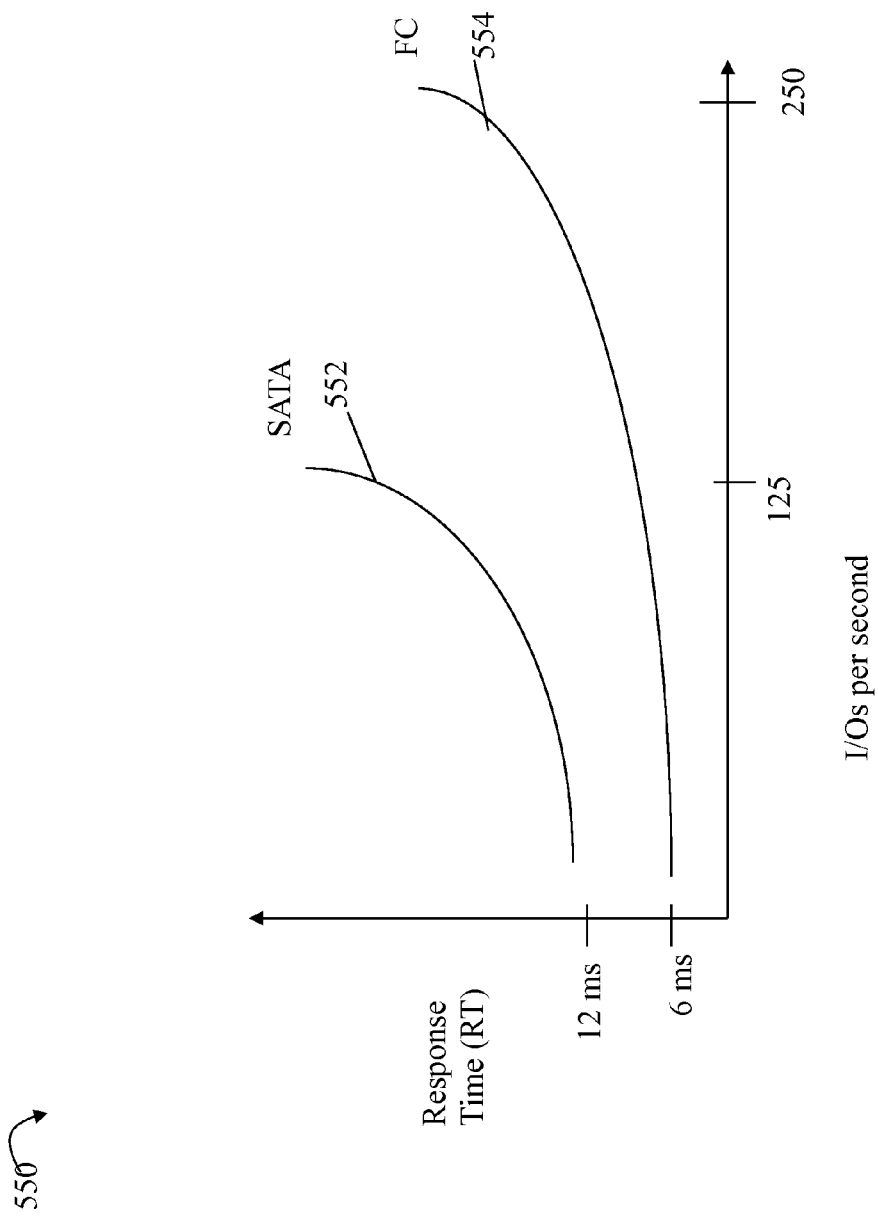
FIGS. 13 and 13A-13E are examples of performance curves that may be used to model device response time and in selection of weights for scoring calculations in an embodiment in accordance with techniques herein.

Referring to FIG. 13, shown is an example of performance characteristic information illustrated in the form of curves for different storage tiers such as may be based on different disk drive types. The example 550 illustrates general curve shapes as may be associated with a SATA drive (as represented by 552) and an FC disk drive (as represented by 554) in connection with processing rate (X-axis in terms of IOs/second) vs. response time (Y-axis). As may be seen from the illustration 550, for a same processing rate of I/Os/second, different RTs are obtained for each of a SATA drive and an FC disk drive. As such, when moving data storage tier of SATA drives to a storage tier of FC drives, differences in performance characteristics such as response times are taken into consideration in accordance with techniques herein. An embodiment may store data as represented by the curves of FIG. 13 in one or more tables having rows and columns of data point values (e.g., X and Y coordinates for a plurality of points). When stored in tabular form, interpolation, curve fitting techniques, and the like, may be used in connection with determining values of X and Y coordinates lying between two existing points stored in the table. When considering moving data between devices of different types or more generally having different device characteristics, such tables of performance characteristic information may be used to determine, for a given processing rate of I/Os per second, a modeled RT for each of the different device types. For example, consider a first storage tier of SATA drives and a second storage tier of FC disk drives. In modeling performance based on a proposed data movement, an aggregated or total processing rate for each target tier may be determined, for example, using performance data collected. For such a total processing rate on the X-axis, a corresponding modeled RT value (Y-axis) may be obtained for each storage tier using tables or curves, such as illustrated in FIG. 13. An embodiment may use appropriate performance curves for each of the different storage tiers and associated technologies of the tiers. The performance curves may be obtained for each storage tier based on observed or collected data through experimentation. The particular parameters or metrics of collected data used to obtain performance curves to model expected RT may vary with storage tier and underlying technology. For example, as described in U.S. patent application Ser. No. 12/924,361, filed Sep. 24, 2010, TECHNIQUES FOR MODELING DISK PERFORMANCE, which is incorporated by reference herein, performance curves for modeling response times for disk drives is described using total number of I/Os and I/O size. Other technologies such as flash-based drives may use other parameters in modeling to determine the appropriate performance curve. For example, one approach to modeling flash-based drives may utilize observed performance data related to total number of I/Os, I/O size, and a ratio of read operations/write operations. Additionally, data modeling for different storage drives may utilize a feedback process. At a point in time, there is a set of data representing the performance curve for a particular drive. The actual measured RT of the drive for a given workload in terms of I/Os per second, for example, may be compared to a modeled RT value determined using the performance curve for similar model parameter values. Adjustments may be made to the modeled performance curve based on differences between the measured RT and modeled RT.

In connection with estimating thin device workloads, various metrics that may be used are described herein and also in U.S. patent application Ser. No. 12/924,396, filed Sep. 25, 2010, TECHNIQUES FOR STATISTICS COLLECTION IN CONNECTION WITH DATA STORAGE PERFORMANCE, which is incorporated by reference herein. Workload for thin devices may be determined in a variety of different ways in connection with determining the contributions of the thin device data portions that may be stored in multiple thin device pools. One approach may be to examine the allocation map and determine the workload of data portions based on I/Os directed to the physical device where such data portions are stored. However, an embodiment may use alternative approaches to estimate thin device workload due to additional resources consumed in connection with use of the allocation map which may adversely impact performance. When data portions of a thin device are moved from a first storage tier to a second storage tier, the related workload of such data portions are moved to the target tier. In one embodiment, storage for thin devices may be evenly distributed across a pool of data devices comprising a thin device pool. This results in even distribution of capacity and I/O workload thereby making it possible to correlate I/O workload and capacity allocation at the pool level rather than reading the allocation map for each thin device. In other words, a workload for a thin device data portion having storage allocated from a thin device pool of data devices may be estimated by collecting thin device pool statistics and then apportioning an amount of the workload indicated by the collected data distributed evenly across all data portions stored in the pool.

In connection with FIG. 13, it should be noted that the performance curve of modeled response time is a function of I/O rate (e.g. IOPS or I/Os per second). Performance curves may also be modeled for response time as a function of IOPS and also I/O size for the different storage tiers (e.g., physical device characteristics of physical devices in a particular tier).

Figure 13A:
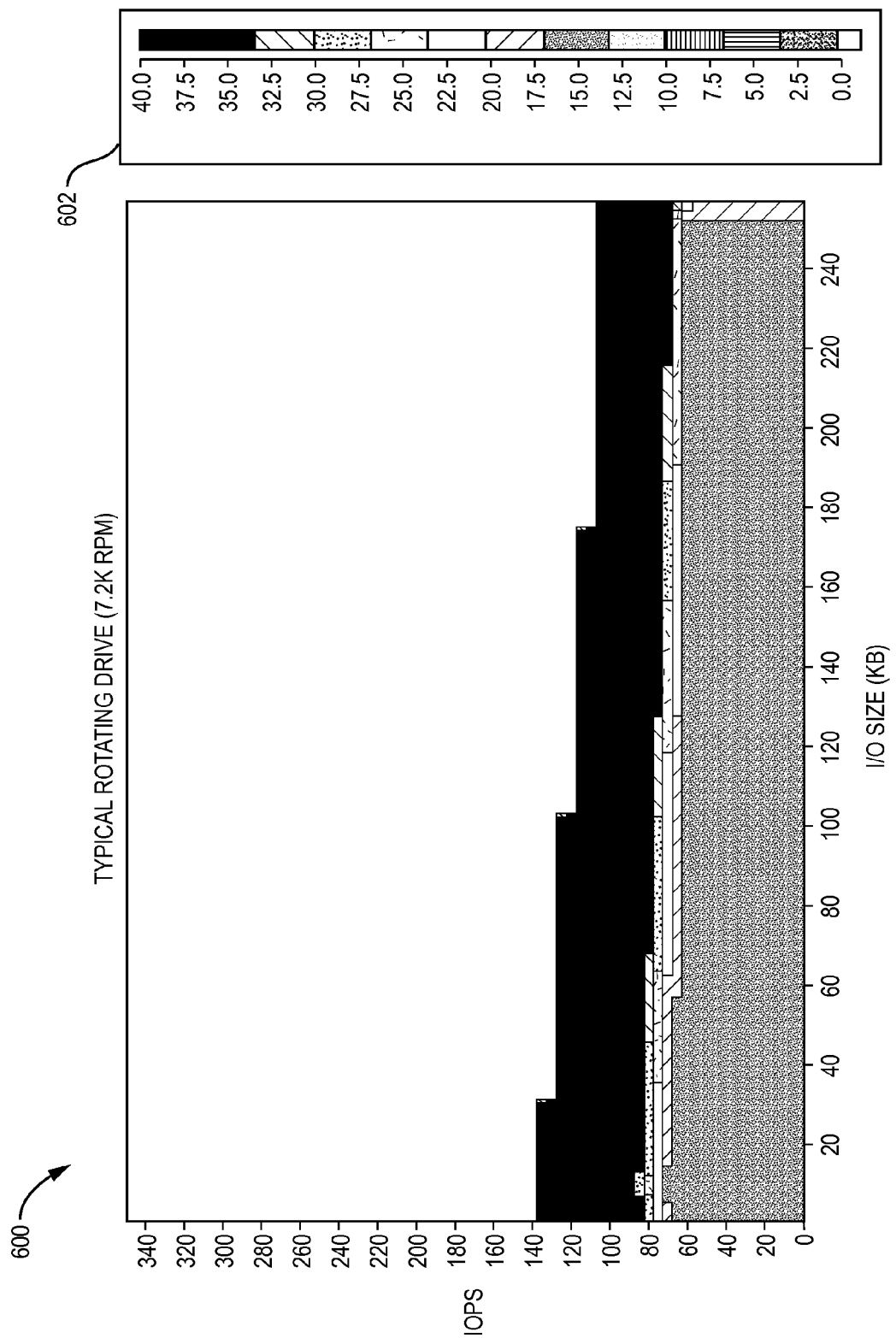

Referring to FIG. 13A, shown is an example 600 illustrating a performance curve for modeled response time as a function of IOPS (Y-axis) and I/O size (average for physical drive in kilobytes (KBs)) for a 7.2K RPM rotating drive. Element 602 illustrates a scale of response times from 0-40 milliseconds where the particular pattern indicated on the scale for a response time is denoted on the X-Y graph of 600 for various combinations of IOPs and I/O sizes. Based on the example 600, it may be generally observed that the I/O size does not have a significant or substantial impact on response time (e.g., response time is not highly dependent on, or sensitive to changes in, I/O size) for the particular physical drive.

Figure 13B:
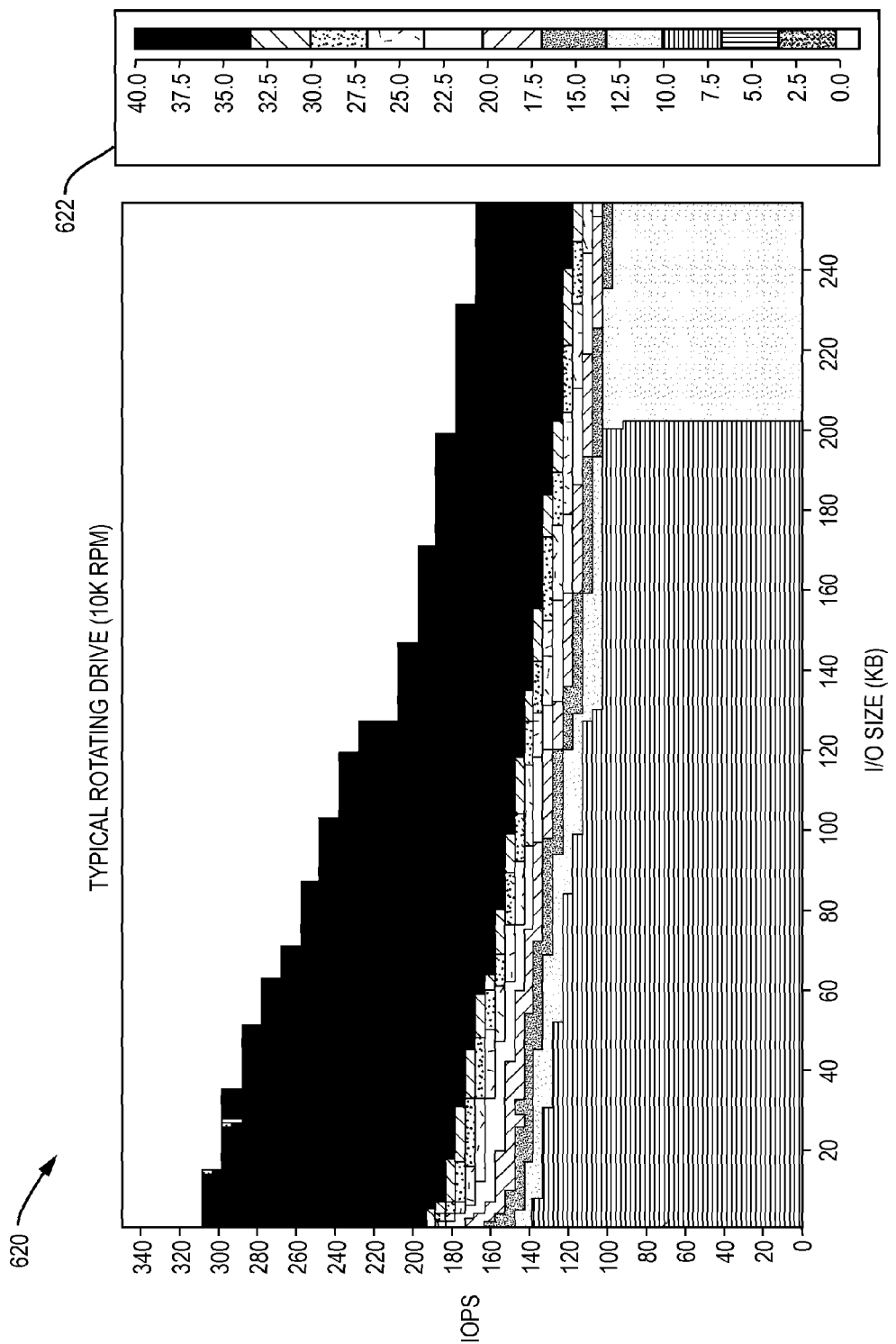

Referring to FIG. 13B, shown is an example 620 illustrating a performance curve for modeled response time as a function of IOPS (Y-axis) and I/O size (average for physical drive in kilobytes (KBs)) for a 10K RPM rotating drive. Element 622 illustrates a scale of response times similar to 602 where the particular pattern indicated on the scale for a response time is denoted on the X-Y graph of 620 for various combinations of IOPs and I/O sizes. Based on the example 620, it may be generally observed that I/O size for the 10K RPM rotating disk drive has a slightly greater dependency than that of FIG. 13A but that the I/O size for the 10K RPM does not have a significant or substantial impact on response time (e.g., response time is not highly dependent on, or sensitive to changes in, I/O size) for the particular physical drive.

Figure 13C:
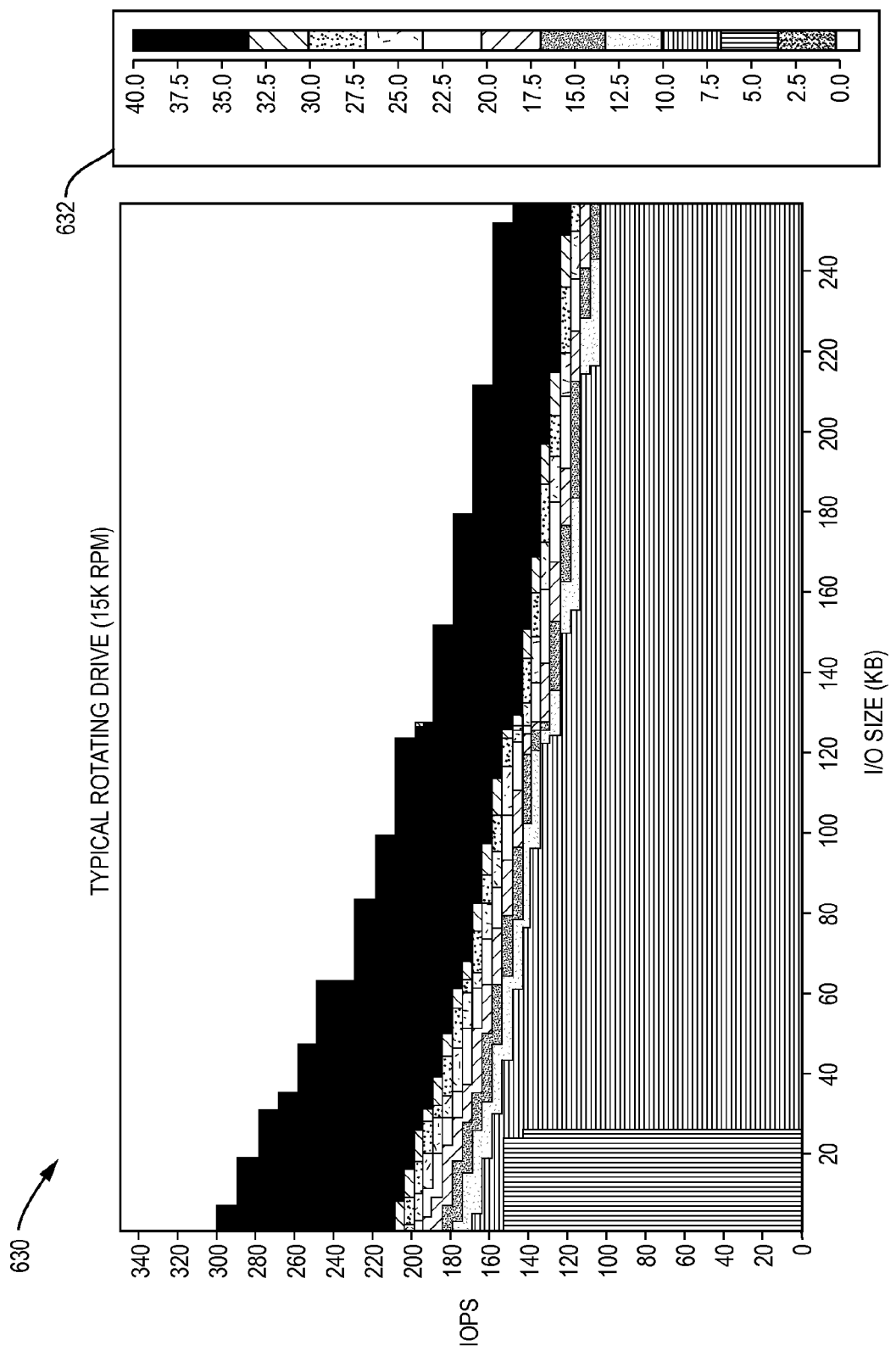

Referring to FIG. 13C, shown is an example 630 illustrating a performance curve for modeled response time as a function of IOPS (Y-axis) and I/O size (average for physical drive in kilobytes (KBs)) for a 15K RPM rotating drive. Element 632 illustrates a scale of response times similar to 602 where the particular pattern indicated on the scale for a response time is denoted on the X-Y graph of 630 for various combinations of IOPs and I/O sizes. Based on the example 630, it may be generally observed that I/O size for the 15K RPM rotating disk drive has a slightly greater dependency than that of the 10K RPM drive of FIG. 13B but that the I/O size for the 15K RPM does not have a significant or substantial impact on response time (e.g., response time is not highly dependent on, or sensitive to changes in, I/O size) for the particular physical drive.

Figure 13D:
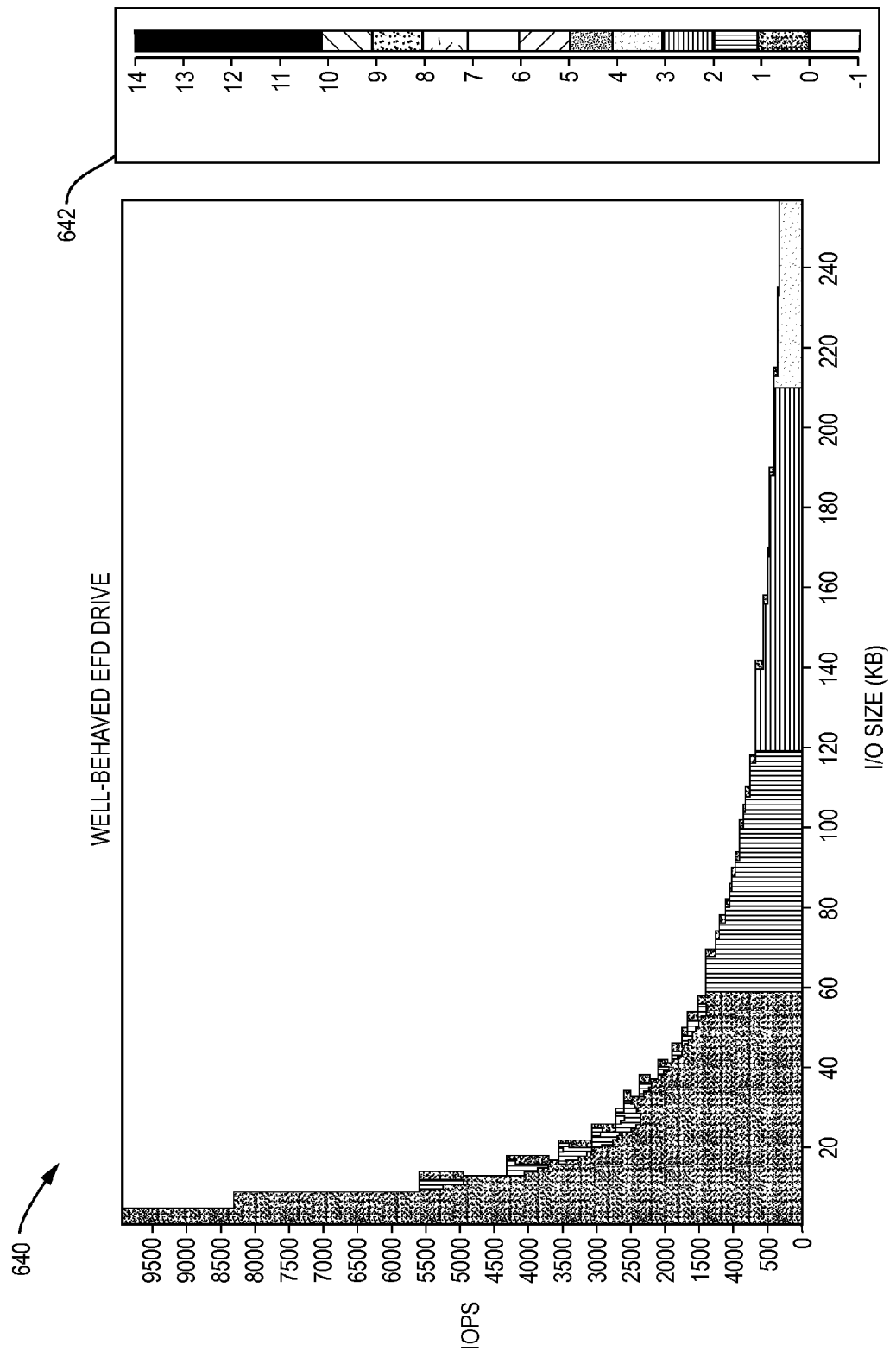

Referring to FIG. 13D, shown is an example 640 illustrating a performance curve for modeled response time as a function of IOPS (Y-axis) and I/O size (average for physical drive in kilobytes (KBs)) for an exemplary SSD drive such as an EFD. Element 642 illustrates a scale of response times similar to 602 where the particular pattern indicated on the scale for a response time is denoted on the X-Y graph of 640 for various combinations of IOPs and I/O sizes. Based on the example 640, it may be generally observed that I/O size for the EFD has a significant or substantial impact on response time (e.g., response time is highly dependent on, or sensitive to changes in, I/O size) for the particular physical drive.

Figure 13E:
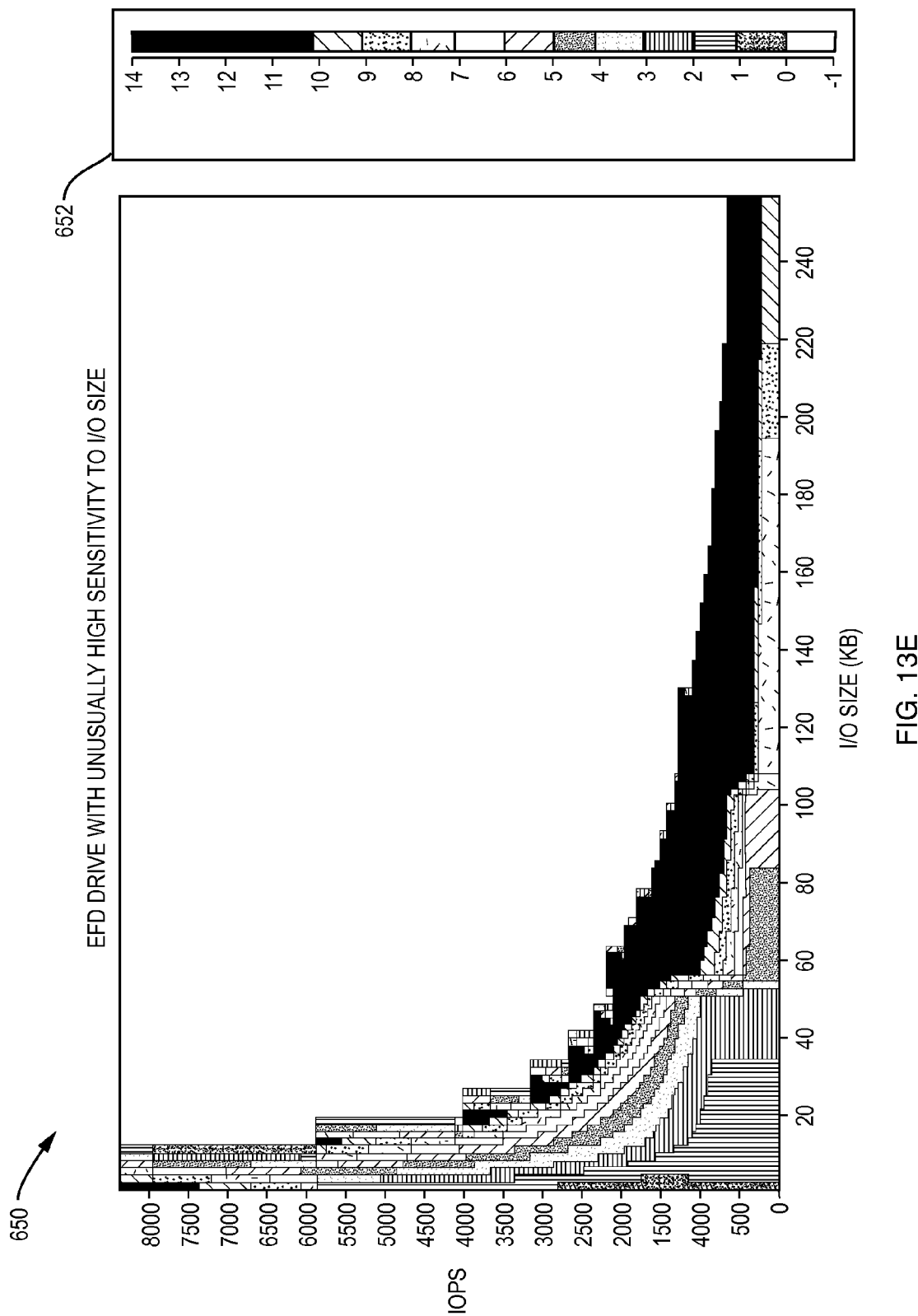

Referring to FIG. 13E, shown is an example 650 illustrating a performance curve for modeled response time as a function of IOPS (Y-axis) and I/O size (average for physical drive in kilobytes (KBs)) for another exemplary SSD drive such as an EFD. The example 640 of FIG. 13D may represent the modeled performance curve for one type of EFD such as by one vendor based on one vendor's technology and implementation and the example 650 of FIG. 13E may represent modeled performance curve for another type of EFD such as by a different vendor or EFD drive with different performance characteristics than that modeled in FIG. 13D. Element 652 illustrates a scale of response times similar to 602 where the particular pattern indicated on the scale for a response time is denoted on the X-Y graph of 650 for various combinations of IOPs and I/O sizes. Based on the example 650, it may be generally observed that I/O size for the EFD has a significant or substantial impact on response time (e.g., response time is highly dependent on, or sensitive to changes in, I/O size) for the particular physical drive.

As such, based on the performance curves of FIGS. 13A-13E, an embodiment may select values for coefficients or weights P7-P12 when determining various promotion and demotion scores in connection with following techniques based on the target storage tier. The target storage tier may be the tier for which processing is performed to select data portions for movement to the target tier. In other words, if processing is determining which data portions may be moved to, or stored on, the flash or SSD tier, values for P7-P12 may be selected in accordance with the expected I/O sizes for each of the I/O operation types as described above. If processing is determining which data portions may be moved to, or stored on, rotating disk drives or, more generally, on a tier including non-flash drives or non-SSD drives, values for P7-P12 may be selected as 1 to reflect the fact that there is not a substantial dependency of I/O size for the particular drive on response time.

In connection with estimating modeled response times, performance curves such as that of FIGS. 13, and 13A-13E may be used based on the particular parameters considered when modeling the response times. For example, an embodiment may use FIGS. 13 and 13A-13C when modeling response times for promotion and demotion scores used with P7-P12 having values of 1 for different types of rotating disk drives. An embodiment may use FIGS. 13D-13E when modeling response times for promotion and demotion scores used with P7-P12 having values of determined as a function of I/O sizes.

The determination of the optimal tier for each extent of storage is driven by the goal of maximizing the chances of achieving storage performance objectives. This goal will tend to be achieved if the storage system can arrange for the largest share possible of the storage request workload to be serviced by the highest performing storage tiers. In connection with techniques herein, scores, such as the promotion and demotion scores, may be metrics or measurements used to drive this determination process where such scores may be calculated for each storage extent. The input to the calculation is information about the expected storage request workload that the storage extent will receive. The promotion and demotion scores as described herein provide a measure of how 'well suited' a storage extent is for placement on a first higher performing storage tier as opposed to a second lower performing storage tier. If the promotion and demotion scores used for the storage tiers are defined properly, then for a first promotion score used when determining what extents to store in an EFD storage tier, if storage extent or portion A has a higher promotion score than storage extent B, then storage extent A is better suited for placement on the EFD tier than storage extent B. Of key importance here is how an embodiment quantifies 'well suited'. Informally, a storage extent should be considered more 'well-suited' for a high tier, such as an EFD tier, if placing the storage extent on the high tier tends to allow a greater number of storage requests (especially RRM requests) to be packed into the high tier. The foregoing provides for use of scores or metrics which guide the selection of the best extents to place on the different tiers.

The use of promotion and demotion scores with properly selected weights or coefficients P1-12 allows the storage system to identify the best extents to place in the different storage tiers in a computationally efficient manner. As described herein, for example, processing may be performed to sort the storage extents according to their promotion scores as may be used when determining which extents are best suited for the EFD storage tier. A sufficient number of the extents with the highest promotion scores may be selected to fill the EFD tier based on any one or more of storage capacity limits and/or performance limits for the EFD tier. Similarly, other tiers may be filled with selected extents using scores determined using other values for weights P1-P12 selected for non-EFD tiers. This approach has the important property that it scales well to configurations involving very large numbers of storage extents.

As described above, the promotion and demotion scores may have values selected for P7-P12 (e.g., for the size or data transfer weights) to express any existing dependency of the score on I/O size. Weights P7-P12 may have values selected which are always 1 for non-EFD tiers or, more generally, for those storage tiers having drives which do not have a substantial affect on response time or other performance metric used to measure system performance.

To illustrate how values for P7-P12 may be selected for an EFD tier where such values for the EFD tier may not always be 1 and may depend on the expected storage tier workload characteristics and the particular performance characteristics of the drives in the high tier, consider the case of a multi-tier storage configuration that includes a storage tier comprised of Enterprise Flash Drives (EFDs). Generally speaking, EFD drives are considered high performing because they are particularly efficient at I/O operation processing (much more so than rotating drives are). However, the data transfer rates supported on EFD drives are not correspondingly large in comparison to data transfer rates for rotating disk drives. As known in the art, data transfer rate or throughput may be characterized as the speed at which data can be transferred between devices. For example, data transfer rates may be expressed in terms of Mbps (amount of data transferred for given unit of time). As such, an embodiment may perform processing to select values for P7-P12 dynamically for the EFD tier by considering the expected workload on the EFD storage tier and the specific performance characteristics of the EFD drives underlying the EFD storage tier. For example, if the expected workload on the EFD storage tier is light enough that the data transfer limits of the EFD drives will not be approached, then an embodiment select size weights (e.g., values of P7-P12) for use with EQUATION 4 that are one to thereby allow the greatest number of storage requests to be packed into the available storage capacity in the EFD storage tier (e.g., an embodiment may use a function for EQUATION 4 that assigns a value of 1 to parameters P7-P12). If the expected workload on the EFD storage tier is heavy enough to approach the data transfer limits of the EFD drives, then an embodiment may select size weights (e.g., values of P7-P12) for use with EQUATION 4 that place greater weight on storage requests with small I/O sizes will allow the greatest number of storage requests to be packed into the available data transfer capacity of the EFD storage tier (e.g., an embodiment may use a function for EQUATION 4 that assigns larger values to parameters P7-P12 for data portions with smaller I/O size).

An embodiment in accordance with techniques herein may use models of drive performance to determine whether the performance of the drives in a storage tier is data transfer limited, and the values for P7-P12 may be assigned accordingly as a function of varying I/O size for the different operation types as described elsewhere herein. With scores for the EFD storage tier, there is a preference to have extents in this EFD tier which have higher IOPS of smaller sizes. Therefore, an embodiment may select values for P7-P12 providing a bias or greater weight to a short term or long term metric when the operation type (e.g., RRM, SRM, or W) has smaller expected I/O sizes.

To illustrate how an embodiment may select values for P1-P6 (e.g., operation type weights) for use in the scores for a tier where such values for P1-P6 may depend on the expected storage tier workload characteristics and the particular performance characteristics of the high tier drives, let us again consider the case of a multi-tier storage configuration that includes a storage tier comprised of EFDs. Suppose performance of a particular type of EFD drive is particularly sensitive to the amount of write activity on the drive, with performance degrading for larger amounts of write activity. An embodiment in accordance with techniques herein may take this into account when selecting values for P1-P6. For example, consider a first case where, if the total amount of write workload that may be delivered to the EFD storage tier is light enough to not degrade the performance of the EFD drives, then the scores calculated for the EFD tier may use a small positive (or zero) values for P2 and P5 associated, respectively, with the short term and long term W statistics (e.g., s_w and l_w from EQUATIONS 4 and 5), and relatively large values for P1 and P4 associated, respectively, with the short term and long term RRM statistics (e.g., s_rrm and l_rrm from EQUATIONS 4 and 5), since this allows the greatest number of RRM requests to be packed into available EFD storage. However, consider a second alternative case wherein, if the total amount of write workload that may be delivered to the EFD storage tier is heavy enough to degrade the performance of the EFD drives, then the scores may select lower (e.g., in comparison to those for the first case) or negative values for P2 and P5 associated with the short term and long term W statistics, and yet larger values for P1 and P4 (e.g., larger than in the first case) associated, respectively, with the short and long term RRM statistics. This selection in the second case allows the greatest number of RRM requests to be packed into available EFD storage. An embodiment in accordance with techniques herein may use models of drive performance to determine whether the performance of the drives in a storage tier is write performance limited, and values for P1-P6 may be assigned accordingly.

More generally in connection with selecting values for P1-P6 of the scores, values may be selected depending on how much preference is given to provide better performance (such as better response time) for a particular operation type (e.g., R vs. W, or preference ordering of multiple types RRM, SR, and W). For example, an embodiment may give higher weight to RRM over W since it is more likely that there is an application waiting for the data of the RRM operation to complete before the application can further proceed with processing. An embodiment may give less weight to sequential read (SR) operations than RRM operations. Write operations and associated statistics in the scores may be given the least relative weight because a waiting host or application performing the write may receive an acknowledge that the operation is complete once the write data is written to cache rather than having to wait for data to be read from a physical drive as with any type of read miss operation (e.g., RRM and SR collectively).

As discussed elsewhere herein, policies may be used to determine when to promote data (map the data to a relatively faster tier) and when to demote data (map the data to a relatively slower tier). In particular, one such policy is a data movement policy based on promotion and demotion thresholds that may be determined using promotion and demotion scores for data portions. In an embodiment herein, this may be performed by first determining a score for different portions of a storage space based on relative activity level and then constructing promotion and demotion histograms based on the different scores and the frequency of each. In connection with thin devices, each of the data portions may correspond to a logical extent for which such scores are determined. Exemplary ways in which the promotion and demotion scores may be calculated are described above. The promotion and demotion scores may be used, respectively, in connection with the promotion and demotion histograms described below in more detail. Generally, the scores may be characterized as reflecting the I/O benefit to the host application and cost (e.g., in terms of performance bandwidth) to the targeted storage device tier. In connection with constructing the histogram, all extents are ordered or sorted according to their scores, from highest to lowest. Those extents having the highest scores are generally those preferred to be selected for having storage allocated from the highest performing tier. The histogram is one way in which such scores may be sorted and utilized in connection with techniques herein. It will be appreciated by those of ordinary skill in the art that there are alternative ways to define and compute the scores than as described herein. In one embodiment described herein, the scores may be computed differently for promotion and demotion to reflect the difference in criteria related to data movement into and out of storage tiers.

For purposes of illustration, consider an example of a single SG which may use a group of data devices, and thus physical devices, in three thin device pools—one for each of three storage tiers such as illustrated in FIG. 8A. Workload statistics such as described in connection with FIG. 10 may be computed for each extent and a promotion score may be calculated for each extent in the SG. Also, assume that only thin devices managed in accordance with techniques herein for which data movement may be performed are located in the SG and use the foregoing thin device pools. In this example, the three storage tiers may include a first storage tier of EFDs, a second storage tier of FC rotating disk drives and a third storage tier of rotating SATA disk drives where storage tiers 1-3 are correspondingly ranked highest to lowest as performance tiers.

In connection with techniques herein, assume a first set of promotion scores are determined using a first promotion score having weights or coefficients selected for the first or highest storage tier to be filled, the EFD storage tier. A first promotion histogram described below in connection with FIG. 14 may be produced using the first set of promotion scores for filling the EFD storage tier.

Referring to FIG. 14, a histogram 1000 illustrates a plurality of activity bins (buckets) and the frequency thereof. Each vertical line of the histogram 1000 represents a bin corresponding to a number of data portions (e.g., extents) having the corresponding score. Determination of a score for a data portion is discussed in more detail elsewhere herein. In an embodiment herein, there are five thousand bins. Of course, a different number of bins may be used instead. The height of each bin represents a number (frequency) of data portions having a particular score. Thus, the longer a particular vertical line, the more data portions there are having the corresponding score. Note that the sum of all of the frequencies of the histogram equals the total number of data portions of the system. Note also that the sum of frequencies of a portion between a first score and a second score equals the total number of data portions having a score between the first and second scores. As such, the total capacity allocated for a particular bin assuming a fixed size data portion may be determined as the mathematical product of the frequency of data portions in the bin (of those data portions having allocated storage) and the size of a data portion. If the data portions in a bin may have varying size, then such sizes corresponding to the allocated storage amounts for the data portions may be summed to determine the total capacity of storage allocated for the bin. In a similar manner, the modeled response time (e.g., average) for the total cumulative workload (e.g., total I/Os/second) and optionally also based on I/O size of those data portions may be determined. The histogram 1000 also shows a first range indicator 1002 that corresponds to bins having a score from S1 to SMAX (the maximum score). In the embodiment herein, there are three levels or tiers of physical storage and data portions of the thin device having a score corresponding to the first range indicator 1002 are promoted (mapped) to a highest (fastest) level of storage and data portions having a score corresponding below S1 are mapped to other storage tiers described below. Thus, S1 may represent the promotion score corresponding to the promotion threshold for the first or highest storage tier so that all data portions having a score at or above S1 are promoted to the highest storage tier, or otherwise considered a candidate for such promotion if not already located in the highest storage tier.

In a similar manner, for those extents or data portions which do not have first promotion scores at or above S1, a second set of new promotion scores may be determined whereby each promotion score of the second set is based on a second promotion score using values for P1-P12 selected for the next fastest or second storage tier to be filled (e.g., the FC rotating disk drive tier in this example). As described herein, values for P7-P12 may all be 1 with values for P1-P6 selected as may be determined dynamically or based on fixed values. Based on these new second promotion scores, a second promotion histogram is constructed as described in connection with FIG. 14 with the differences that 1) the scores are the second promotion scores for those data portions not previously mapped to the first storage tier using the first promotion histogram, and 2) the threshold S1 now denotes the promotion score corresponding to the promotion threshold for the second storage tier (next fastest) so that all data portions having a score at or above S1 are promoted to the second storage tier, or otherwise considered a candidate for such promotion if not already located in the second storage tier. Since this example only includes three storage tiers, those data portions having a second promotion score below the threshold are mapped to (stored in) the lowest or third storage tier of SATA drives.

It should be noted that above-noted two promotion histograms of FIG. 14 used in connection with promotion scores and also in connection with demotion histograms such as in FIG. 16 (described below) in connection with demotion scores may include scores for all data portions under consideration or analysis. For example, as described elsewhere herein in connection with other examples, the techniques herein may be performed with respect to a number of storage groups of thin devices having their storage allocated from one or more storage pools so that the thin devices have storage allocated from a set of physical drives. In this case, the histograms may include scores with respect to the foregoing data portions of the number of storage groups under consideration and evaluation with the techniques herein.

It should be noted that an embodiment using a histogram may select a suitable number of bins or buckets and an interval for each such bin. In one embodiment, the size of each bin may be driven by a selected number of bins with each bin having the same size. Additionally, an embodiment may use different techniques in connection with mapping or converting the promotion and demotion scores to indices associated with histogram bins. For example, an embodiment may use linear scaling to set a lower boundary for buckets having an associated index lower than a selected pivot value and may use logarithmic scaling to set a lower boundary for buckets above the pivot. Logarithmic scaling may be appropriate in embodiments having larger scores or a wide range of scores in order to scale the size of scores above the pivot. In such embodiments, the score range associated with a bucket interval above the pivot varies so that a reasonable number of data portions are mapped to the associated bucket. Whether a histogram or other suitable technique is used may vary with the number of buckets, the number of data portions, and the like.

Additionally, it should be noted that rather than have a histogram with frequency on the Y-axis as in FIG. 14, an embodiment may represent the total allocated capacity on the Y-axis of the number of data portions having scores within a particular bin. In other words, the height of the bucket or bin represents the total allocated capacity of the scores mapped to that bin. Other representations are possible besides histograms in connection with determining promotion thresholds and also demotion thresholds as described elsewhere herein in more detail.

In connection with determining the first tier promotion threshold S1 of FIG. 14, processing is performed to map a number of data portions to the highest performing tier in accordance with criteria including a combination of one or more capacity limits and one or more performance limits. A capacity limit may be specified for each storage tier for the SG in an AP associated with the SG as described above. Additionally, a capacity limit indicating the physical maximum amount of storage capacity as a physical characteristic of the drives may also be considered since it may be possible in some embodiment to exceed the maximum capacity of the drives prior to exceeding the capacity limits in accordance with an AP. Additionally, one or more sets of performance limits may be specified for each storage tier. In one embodiment, performance limits may be specified in terms of response time for each tier. An embodiment may define one or more sets of predetermined response time performance limits for storage tiers where such sets of response time limits may also referred to as performance or comfort zones. Each set contains a response time limit for each storage tier that may be the target of promotion. In one embodiment, limits are not specified for the bottom tier. In one embodiment, seven comfort zones may be specified where each zone includes a response time limit for the first highest performing storage tier, such as flash-based tier, and the second highest performing tier, such as FC disk drives. For example, the following response time performance limits may be specified for seven comfort zones in the embodiment having 3 storage tiers:

| Comfort Zone | EFD/flash Response Time (ms) | FC disk Response Time (ms) |
|---|---|---|
| 1 | 1 | 6 |
| 2 | 2 | 10 |
| 3 | 3 | 14 |
| 4 | 4 | 18 |
| 5 | 6 | 25 |
| 6 | 8 | 40 |
| 7 | 10 | 50 |

Of course, an embodiment may provide any number of comfort zones more or less than seven and for a different number of storage tiers. Additionally, the foregoing values are exemplary and may vary with technology, drive vendor, and the like. Generally, values specified as the performance limit metrics, such as response times, may vary with the workload and/or other workload characteristics (such as I/O size) of a particular system and may be determined in any suitable manner. For example, values for the foregoing metrics may be made based on knowledge regarding particular workload of a system and typical performance of drives of different storage tiers in a system. In this manner, limits specified may be realistic and in accordance with typical workload performance within a system. It should be noted that the foregoing limits may also be selected based on end user performance requirements. Additionally, as noted elsewhere herein, although response time is used as the workload or performance metric in connection with the foregoing comfort zones, other performance criteria metrics may be used in combination with, or as an alternative to, response time. For example, an embodiment may use utilization as a metric in a manner similar to response time in connection with techniques herein. That is, just as comfort zones include response time limits for storage tiers, comfort zones may include other criteria such as a utilization for each storage tier. As known in the art, utilization of a resource, such as a physical drive or with respect to physical drives of a storage tier, may be defined as a metric measuring an amount of time a device is utilized or in a non-idle state. For example, utilization for a storage tier may be represented as a percentage (e.g., based on a ratio of an amount of time the physical devices of the storage tier are in the non-idle state/total amount of time). The foregoing utilization metric may represent the average utilization for a storage tier determined over a period of time.

Generally, processing may be performed to determine a set of promotion thresholds for the different storage tiers (e.g., S1 of FIG. 14) in accordance with criteria including capacity limits and a set of performance limits for a single comfort zone. In connection with the above-mentioned first promotion histogram used when mapping data portions to the first or EFD storage tier, processing traverses the first promotion histogram, from highest score to lowest score, mapping data portions to the first storage tier until either the capacity limit for the first storage tier is reached or until the response time performance limit for the first storage tier is reached. Similarly, in connection with the above-mentioned second promotion histogram used when mapping data portions to the second of FC storage tier, processing traverses the second promotion histogram, from highest score to lowest score, mapping data portions to the second storage tier until either the capacity limit for the second storage tier is reached or until the response time performance limit for the second storage tier is reached.

For each storage tier, a performance counter is maintained indicating a modeled current I/O processing rate (e.g., total IOPS) and associated modeled response time based on those data portions currently mapped to the storage tier. As described elsewhere herein, performance curves such as illustrated in FIGS. 13 and 13A-13E may be used in modeling current performance for each storage tier based on data portions currently mapped to the storage tier when traversing the histogram scores. As each bucket or bin of the histogram has its data portions mapped to the first storage tier, the performance counter (indicating an updated modeled tier RT) is updated to reflect the modeled performance for the first storage tier as also including the additional data portions of the bucket now newly mapped to the first storage tier. For example, as a bucket of data portions is mapped to the first storage tier, the performance or workload information attributed to the newly added data portions in combination with those data portions already mapped to the first storage tier may be input to the appropriate storage tier performance model to determine a modeled aggregate response time. For example, as described above, one disk performance model for SATA and FC disk drives may use as the following as modeling inputs—total number of I/Os (e.g., used to determine the number of I/Os per second or other unit of time) and I/O size (or average I/O size of the total number of I/Os considered)—as collected or observed for the data portions. With these modeling inputs for the aggregated data portions mapped to the first storage tier, the modeling technique may use performance curves to determine an estimated or modeled response time for the physical storage devices in the storage tier based on the aggregate workload of the existing data portions currently mapped to the first storage tier and the additional data portions now also mapped to the first storage tier. In a similar manner, processing may track the current amount of storage of the first tier consumed via the mapping so far. After each bucket of data portions is additionally mapped to the first storage tier to hypothetically represent or model movement of such data portions to the first storage tier, a determination may be made as to whether any of the capacity limits or the response time performance limit for the first tier has been reached or exceeded. If so, the score associated with the current bucket is the promotion threshold. Thus, all data portions in buckets higher than the current bucket (e.g., scores exceeding that of the current bucket) are candidates for promotion to the first storage tier. It should be noted that in connection with the foregoing promotion threshold, the score used as the promotion threshold may be the upper limit of the bucket interval (e.g., score range) for the current bucket at which at least one of the capacity limits or response time performance limits was exceeded during histogram traversal.

In connection with response time performance modeling for a storage tier, as described elsewhere herein with thin devices, the additional I/Os associated with the data portions being added (via mapping) to a storage pool of a particular storage tier may be modeled as being evenly distributed across drives of the storage pool. In the simplified example described herein with only a single storage pool, the modeled storage pool response time is also the modeled storage tier response time. In the event of multiple storage pools in a single tier where all such pools are used by the SG, an embodiment may choose to evenly distribute the added I/O operations across all drives of the storage pool. As described elsewhere herein, a simplifying assumption is that there are no other consumers of the storage tier capacities than those thin devices under device management using the techniques herein. In the event that there are other types of devices having associated data stored on the storage tiers, the amount of storage consumed and the workload of such device may be considered when determining whether capacity and performance limits have been reached. It should be noted that the even distribution modeling as described above may reflect that which is actually performed by the storage tiers and devices therein being evaluated in connection with thin device storage allocation. If an embodiment allocates thin device storage in a different manner, then such modeling should reflect that which is performed in the embodiment.

In a similar manner, a promotion threshold for the second storage tier is determined by performing processing as described above for the first tier with the difference that the processing is performed for the second storage tier until either the capacity limits or response time performance limit of the first zone are reached for the second storage tier. The foregoing capacity limits and response time performance limits vary with each storage tier. Processing that maps data portions to the second storage tier resumes with the second promotion histogram including new second promotion scores for those unmapped data portions from the previous storage tier processing (e.g., those data portions of the first promotion histogram having first promotion scores below the first storage tier promotion threshold). In this manner, data portions which were not mapped to first tier storage are automatically considered for mapping to storage in the next highest tier. At the end of the second storage tier processing for the current zone, the second storage tier promotion threshold is determined.

Figure 15:
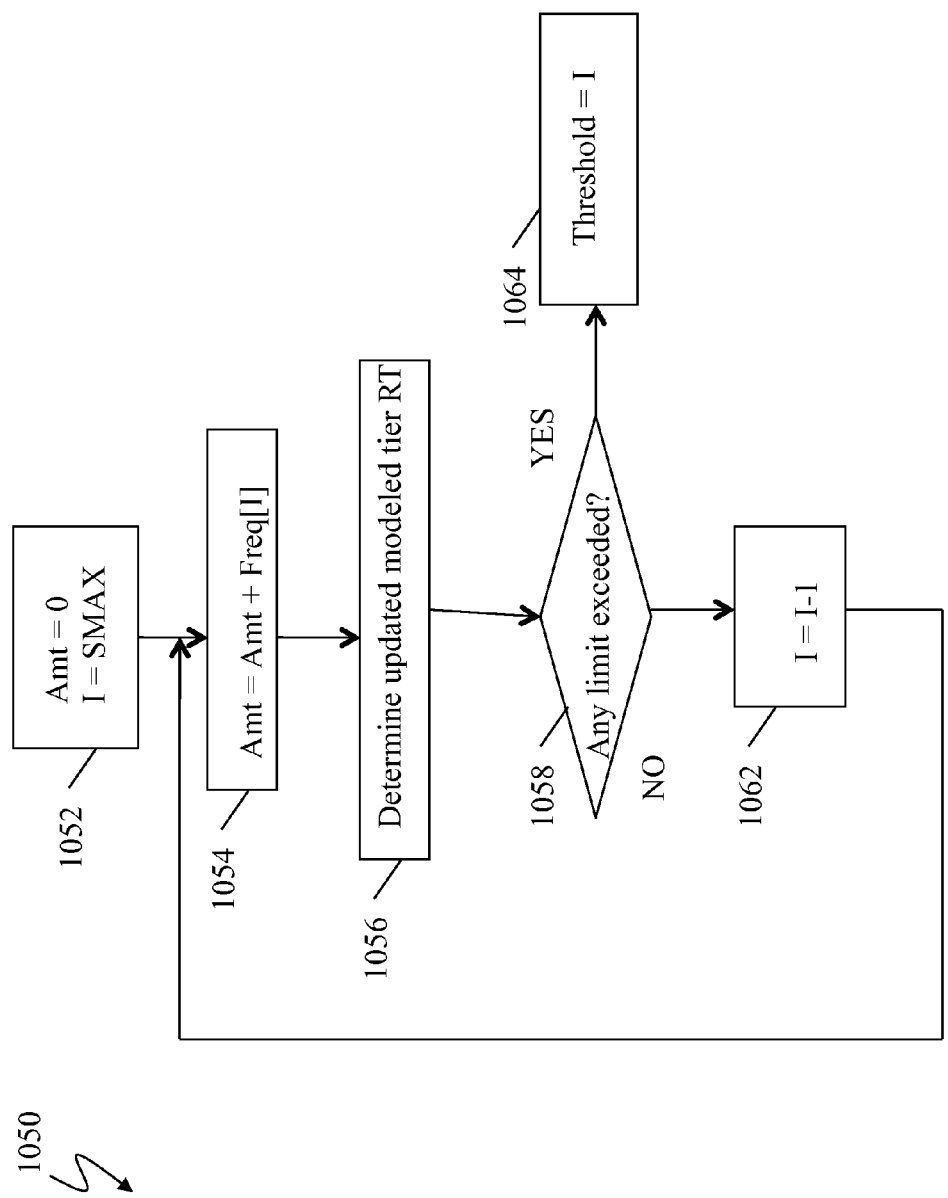

Referring to FIG. 15, shown is a flowchart of steps summarizing processing as described above in connection with determining a single promotion threshold for a single target tier using criteria including capacity limits and comfort zone response time limits for the target tier as specified in a single zone of performance limits. Thus, flowchart 1050 may be executed twice to determine, for the first zone, the two promotion thresholds described above respectively for the first and second storage tiers using the first and second promotion histograms.

At step 1052, initialization processing is performed. Step 1052 includes initializing a variable, AMT, that keeps track of the amount of storage portions to zero. Step 1052 also includes initializing an index variable, I, to the maximum score (highest bin). In an embodiment herein, there are five thousand bins, so I would be set to five thousand at the step 1054. Of course, other numbers of bins are also possible. Following step 1052 is step 1054 where AMT is incremented by FREQ[I], the amount of data mapped to bin I. Following the step 1054 is step 1056 where an updated modeled tier RT (response time) is determined. At step 1058, a determination is made as to whether any of the capacity limits and/or response time performance limit for the current tier have been exceeded. Step 1058 may include comparing the updated modeled tier RT to the response time performance limit for the current zone and current target promotion tier. Step 1058 may include comparing the current amount of capacity of the target tier consumed via the modeled mapping represented by AMT to the AP capacity limit. As described elsewhere herein, the total capacity consumed across one or more bins may be determined based on the cumulative frequencies of those bins and the amount of allocated storage of the data portions in the foregoing one or more bins. Step 1058 may include comparing the current amount of capacity of the target tier consumed via the modeled mapping represented by AMT to the SG capacity limit such as may be based on the physical drive capacity limits. If it is determined at the test step 1058 that none of the established limits have been exceeded, then control passes from the test step 1058 to a step 1062 where the index variable, I, is decremented. Following the step 1062, control passes back to the step 1054 for another iteration. If any one or more of the foregoing limits are exceeded, step 1058 evaluates to yes and control proceeds to step 1064 where a score threshold is assigned the value of I. Data portions having a score of I or higher are promoted to the highest level of storage. Following the step 1064, processing is complete.

The methodology for determining score values used to map data portions (indicating promotion candidates) to one or more intermediate storage levels may be similar to that described above in connection with the flow chart 1050. In the case of second and third intermediate storage levels in this current embodiment with 3 storage tiers though, processing may be performed with respect to the second promotion histogram. In an embodiment having more than three storage tiers, new promotion scores and an associated new promotion histogram may be computed for a next lower storage tier as may be needed depending on whether a new promotion score is used.

Figure 14A:
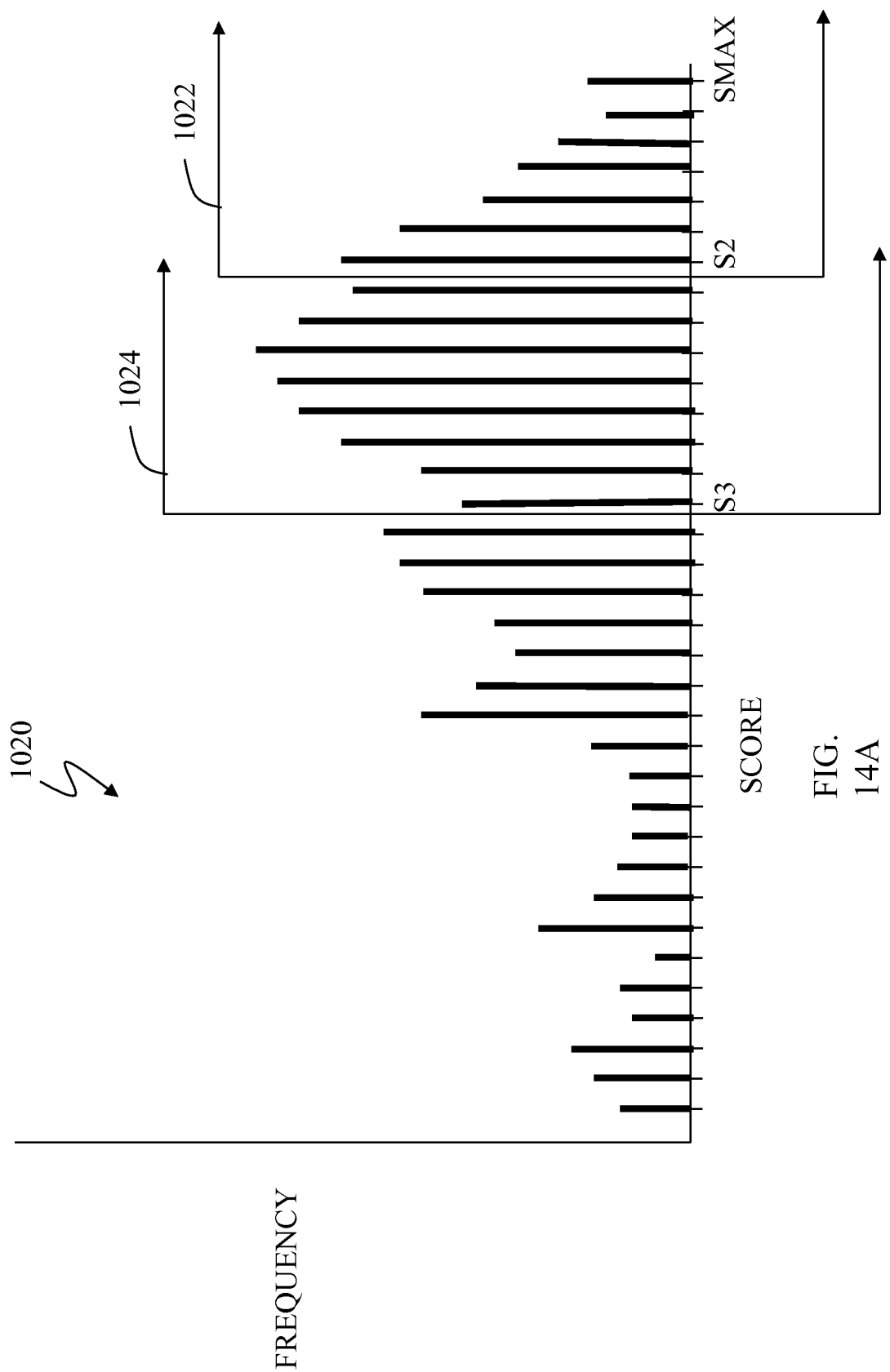

If a same set of promotion scores is used for determining promotion for two storage tiers, the same promotion histogram may be used. For example, consider a case where there are 4 storage tiers—EFD and three storage tiers of rotating disk drives. A first set of promotion scores and a first promotion histogram may be used as described above to determine which data portions are mapped to the EFD tier. The first histogram may be based on first promotion scores having values calculated with weights P1-P12 selected for the particular EFD tier. Next, a second set of promotion scores may be calculated using a second promotion score different from that used in determining the first histogram. The second histogram may be based on second promotion scores having values calculated with new weights P1-P12 selected whereby P7-P12 may be 1 and P1-P6 may be a suitably selected. With reference to FIG. 14A, shown is the second histogram whereby S2 denotes a promotion threshold score for the second tier and S3 denotes a promotion threshold score for the third storage tier. In this case, when determining data portions mapped to the third storage tier, the index variable I would be initialized to a score that is one less than the lowest score of the next highest storage level, the second storage tier. For example, if storage portions having a score of 4500 to 5000 are assigned to the second storage level, then the index variable, I, would be initialized to 4499 in connection with determining scores for the third storage level just below the second storage level.

Once promotion threshold processing has completed for the current zone, demotion threshold processing is performed as will now be described.

Figure 16:
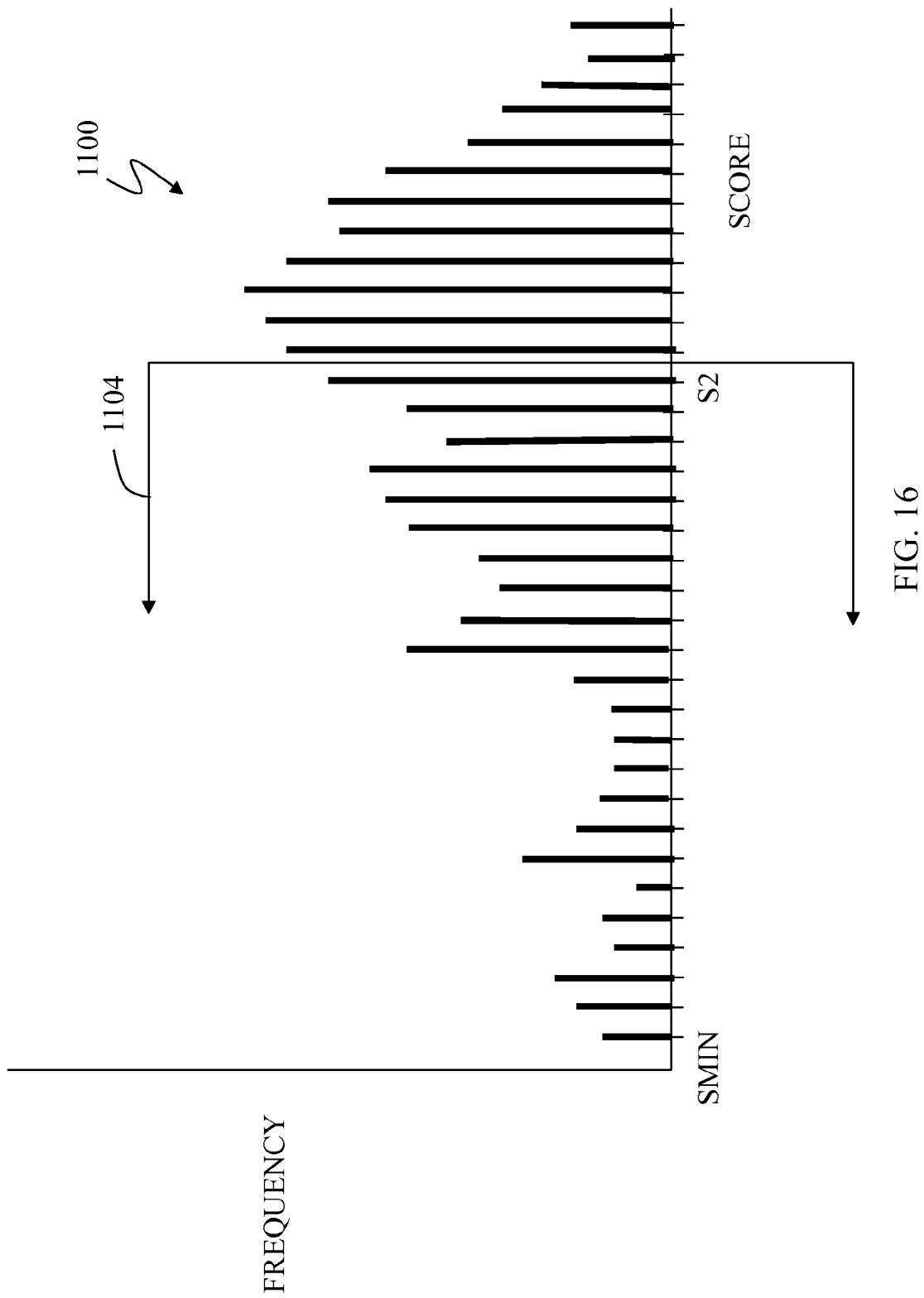

Referring to FIG. 16, shown is a demotion histogram 1100 similar to the histogram 1000, discussed above which illustrates a plurality of scores and the frequency thereof. The histogram 1100 may be used to determine which of the data portions (if any) may be demoted (e.g., mapped to relatively slower physical storage). In some embodiments, the histogram 1100 may be identical to the histogram 1000. In other embodiments, the histogram 1100 may be different than the histogram 1000 because the scores for the histogram 1000 used for promotion may be different than the scores for the histogram 1100 used for demotion. Determination of promotion and demotion scores is discussed in more detail elsewhere herein.

In one embodiment including three storage tiers—EFD, FC rotating disk drives and SATA disk drives—as described above, a first demotion histogram 1100 may be determined for the EFD storage tier. In a manner similar to that as described above for a first set of promotion scores for the EFD tier, a first set of demotion scores may be determined for the EFD storage tier using first demotion scores having weights P1-P12 selected for the particular EFD storage tier. In the example 1100 of FIG. 16, shown is a first range indicator 1104 denoting that data portions have demotion scores less than S1 may be demoted (mapped) from the EFD first storage tier to one of the remaining two lower or slower storage tiers of physical storage.

Subsequently a second demotion histogram may be determined using those data portions which have demotion scores from the first histogram less than S1. In other words, those data portions having demotion scores less than S1 are demoted from the EFD storage tier but now a determination may be made as to which storage tier such demoted data portions are located—the FC or the SATA storage tiers. For those data portions demoted from the EFD storage tier, second demotion scores may be determined for use with a second demotion histogram. The second demotion histogram may be based on second demotion scores having weights P1-P12 selected for the second storage tier of FC rotating disk drives in this example. Thus, the second histogram is similar to the first histogram with reference to FIG. 16 with the differences that 1) S1 represents a second demotion threshold whereby all data portions have a demotion score less than S1 are demoted to the third or lowest storage tier and those data portions having a demotion score more than S1 are mapped to the second storage tier and 2) S1 represents the demotion threshold for the second storage tier.

In an embodiment, the demotion threshold for a tier may be determined in any suitable manner. For example, an embodiment may select a demotion threshold with respect to demoting a data portion from a storage tier based on the threshold score determined as the promotion threshold for the storage tier. The demotion threshold may be selected as a score that is the same or lower than the promotion threshold. For example, the demotion threshold may be determined using a constant factor by which the promotion threshold for the same storage tier is multiplied. (e.g. promotion threshold for a tier=1.2*demotion threshold for a storage tier). The foregoing may introduce a stationary zone between the promotion and demotion thresholds for a tier where scores falling this stationary zone are neither promoted or demoted with respect to the storage tier. Introduction of the stationary zone may serve as one mechanism that may be included in an embodiment to limit thrashing with respect to repeatedly promoting and then demoting the same data portions having scores which border the promotion or demotion threshold for a storage tier. The demotion threshold may be selected so that it is always equal to or less than the storage capacity for the SG as may be specified in an associated AP.

In an embodiment herein, the processing performed for demoting data portions (extents) may be similar to processing described in connection with FIG. 15 with the difference that processing may be reversed so that, for example, the portions to be demoted to the lowest level of storage may be determined prior to higher storage tiers by initially beginning with setting I in step 1052 to SMIN and incremented in each iteration. In such an embodiment, storage capacity limits and/or performance limits may be utilized as may be provided in connection with an embodiment. For example, an embodiment may not provide performance limits for the lowest/slowest performing tier but may provide such limits for other tiers. In this case, an embodiment may determine demotion thresholds based on the criteria provided (e.g., if performance limits are not provided for the third storage tier (e.g., slowest) then only capacity limits may be used for the third storage tier.

In some embodiments, when a data or storage portion (e.g., an extent) is selected for promotion, only active subportions (e.g., subextents) are promoted while inactive subportions remain at their current storage level. In an embodiment herein, a subportion is considered active if it has been accessed in the previous 4½ days and is considered inactive otherwise. Of course, other appropriate criteria may be used to deem subportions either active or inactive. In some embodiments, when a data portion (e.g., an extent) is selected for demotion, the entire storage portion may be demoted, irrespective of activity level of subportions. In addition, in some embodiments, appropriate mechanism(s) may be provided to reduce the amount of data that is demoted so that more data is maintained on relative faster physical storage devices. Each extent may be evaluated for promotion first as described above and then for demotion if it has not otherwise qualified for promotion. If an extent does not qualify for promotion or demotion, then no data movement is modeled for the extent and subsequently the extent is also not a candidate for data movement with respect to a set of criteria (e.g., capacity limits and performance zone limits) currently being evaluating through modeling using techniques herein. It should be noted that an extent that qualifies for promotion may not then subsequently be a candidate for demotion. Thus, a candidate that qualifies first for promotion may then be removed as a possible demotion candidate.

In some cases, it may be desirable to minimize the amount of data that is demoted. A mechanism for doing this may take into account the capacity and amount of data that has been placed onto the higher tiers and set the demotion threshold lower (so less data is demoted) if the amount of promoted data is less than the capacity (or specified percent of capacity) of the higher tiers. For example, if the policy indicates a desire to fill the higher tiers within fifty percent of capacity, but the promotion portion of the algorithm has only promoted data so that the higher tiers are thirty percent full, the demotion threshold may be set lower so that less data is demoted.

Figure 16A:
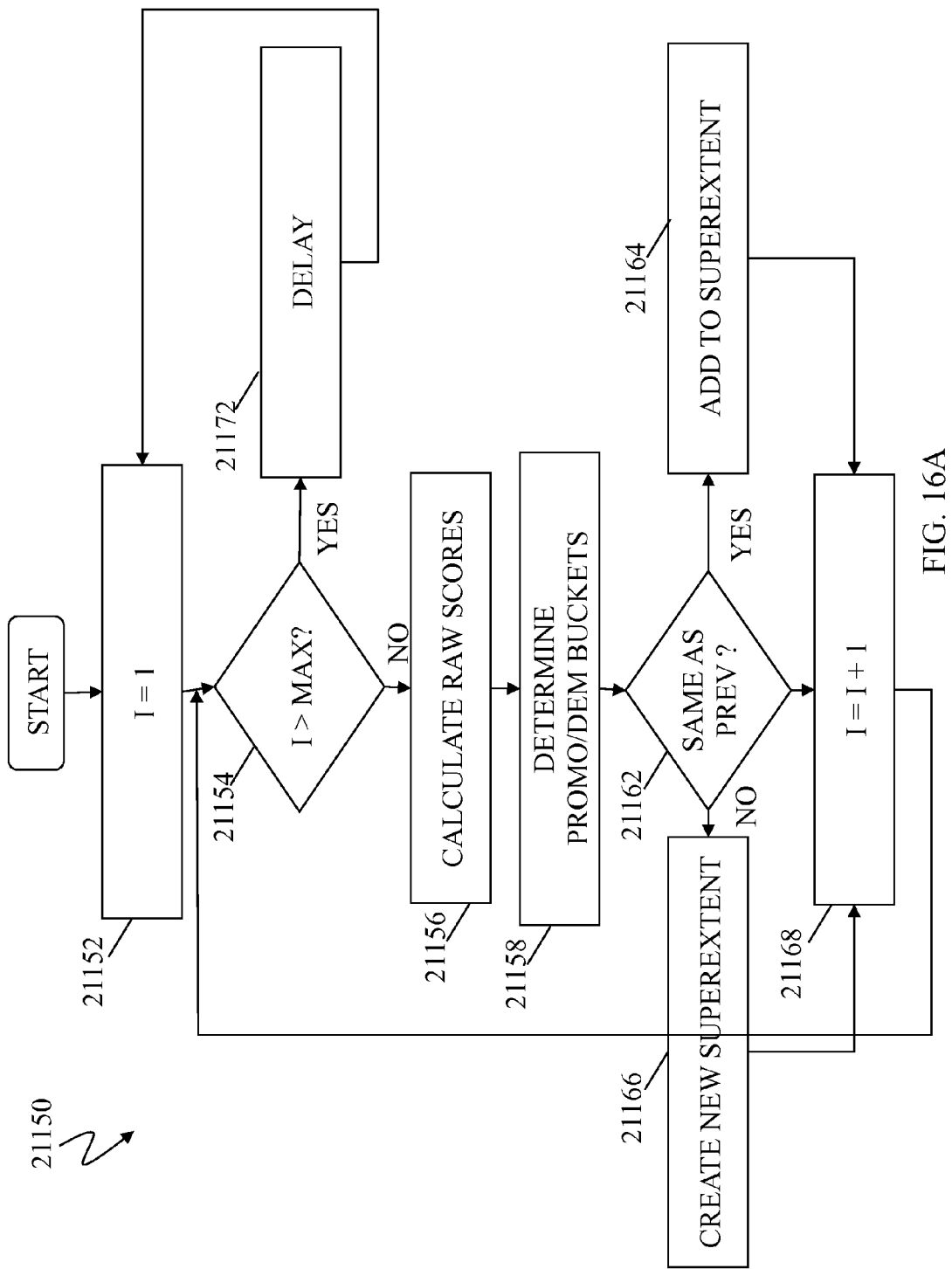
FIG. 16A is a flow chart illustrating processing performed in connection with creating histograms for promotion and demotion of data to different tiers of storage according to an embodiment of the system described herein.

Referring to FIG. 16A, a flow chart 21150 illustrates steps performed in connection with creating the histograms 1000, 1100. Processing begins at a first step 21152 where an index variable, I, is set to one. The index variable I is used to iterate through the storage portions (e.g., extents) of a storage space. Following the step 21152 is a test step 21154 where it is determined if I is greater than MAX, a maximum value for I (e.g., the number of extents of the storage space). The test at the step 21154 determines if all of the storage portions of a particular storage space have been processed. If not, then control transfers from the test step 21154 to a step 21156 where the raw promotion score and the raw demotion scores are calculated.

The raw promotion score and the raw demotion score reflect an amount of I/O activity for a particular extent. Any appropriate mechanism may be used to calculate the scores some of examples of which are described herein. For example, in an embodiment herein, the raw promotion score is provided by the formula:

$$(p1*s\_rrm + p2*s\_w + p3*s\_p + p4*l\_rrm + p5*l\_w + p6*l\_p)/(\text{\# Active Subext} + 1)$$

where s_rrm is the rate of short term random read misses, s_w is the rate of short term writes, s_p is the rate of short term pre-fetches, l_rrm is the rate of long term random read misses, l_w is the rate of long term writes, and l_p is the rate of long term pre-fetches for a given extent. The coefficients p1-p6 may be set as appropriate. In an embodiment herein, the values used may be 12, 4, 4, 3, 1, and 1, respectively. Of course, different values may be used to emphasize or deemphasize different I/O characteristics in connection with determination of the promotion raw score. In an embodiment herein, the different short term and long term rates may be provided using the mechanism described in U.S. patent Ser. No. 12/924,396 filed on Sep. 27, 2010 and titled "TECHNIQUES FOR STATISTICS COLLECTION IN CONNECTION WITH DATA STORAGE PERFORMANCE", which is incorporated by reference herein. Of course, any appropriate technique may be used for collection of the statistics used herein.

The demotion raw score may be determined using the following formula:

$$(p4*s\_rrm+p5*s\_w+p6*s\_p+p1*l\_rrm+p2*l\_w+p3*l\_p)$$

where s_rrm, s_w, p1, etc. are as set forth above.

Following the step 21156 is a step 21158 where the promotion bucket index and the demotion bucket index are both calculated. The indexes are used to add data to the histograms (e.g., 1000, 1100). Determination of the bucket indexes is discussed in more detail elsewhere herein. In some embodiments, the promotion raw score may be multiplied by a priority factor (e.g., one, two, or three) prior to obtaining the bucket index. The priority factor may be used to give higher priority (i.e., increase the likelihood of promotion) for some of the storage, possibly selected by a user or by a policy. For example, important operations in an organization may be assigned a higher priority so that storage associated therewith is provided with a priority factor of two or three (or some other value).

Following the step 21158 is a test step 21162 where it is determined if the promotion and demotion bucket indices determined at the step 21158 are the same as the promotion and demotion indices determined for the most recent extent or set of extents. If so, then control passes from the test step 21162 to a step 21164 where the current extent being processed is added to a super-extent data element for the most recent extent or set of extents. The super-extent represents data for a number of contiguous extents having the same promotion and demotion indices. The super-extents are provided to increase efficiency and decrease the amount of storage needed. Note that other criteria may be used to combine information for contiguous extents.

If it is determined at the test step 21162 that the promotion and demotion bucket indices determined at the step 21158 are the same as the promotion and demotion indices determined for the most recent extent or set of extents, then control passes from the test step 21162 to a step 21166 where a new super-extent is created. Adding to an existing super-extent at the step 21164 and creating a new super-extent at the step 21166 are both discussed in more detail elsewhere herein. Following the step 21164 and following the step 21166 is a step 21168 where the index variable, I, is incremented. Following the step 21168, control transfers back to the test step 21154 for another iteration.

If it is determined at the test step 21154 that I, the index variable used to iterate through the storage portions (e.g., extents), is greater than a maximum value (the number of extents being processed), then control transfers from the test step 21154 to a step 21172 where a delay is introduced. Following the step 21172, control transfers back to the step 21152 to reprocess the extents of a data storage space to reconstruct the histograms.

The amount of delay at the step 21172 represents the cycle time for repeatedly reconstructing the histograms. The delay may be a constant and/or may be adjustable depending upon the amount of time spent performing other processing associated with promotion and demotion of data. In some embodiments, the delay may be set so that the histograms are recalculated every ten minutes. It is also possible to keep track of instances where the algorithm does not complete in a certain amount of time (e.g., ten minutes). In such a case, a counter could be incremented each time the algorithm does not complete and decremented when it does. If the counter reaches a certain value (e.g., ten), the system may operate in a degraded mode indicating that data tiering is not being performed properly.

Figure 16B:
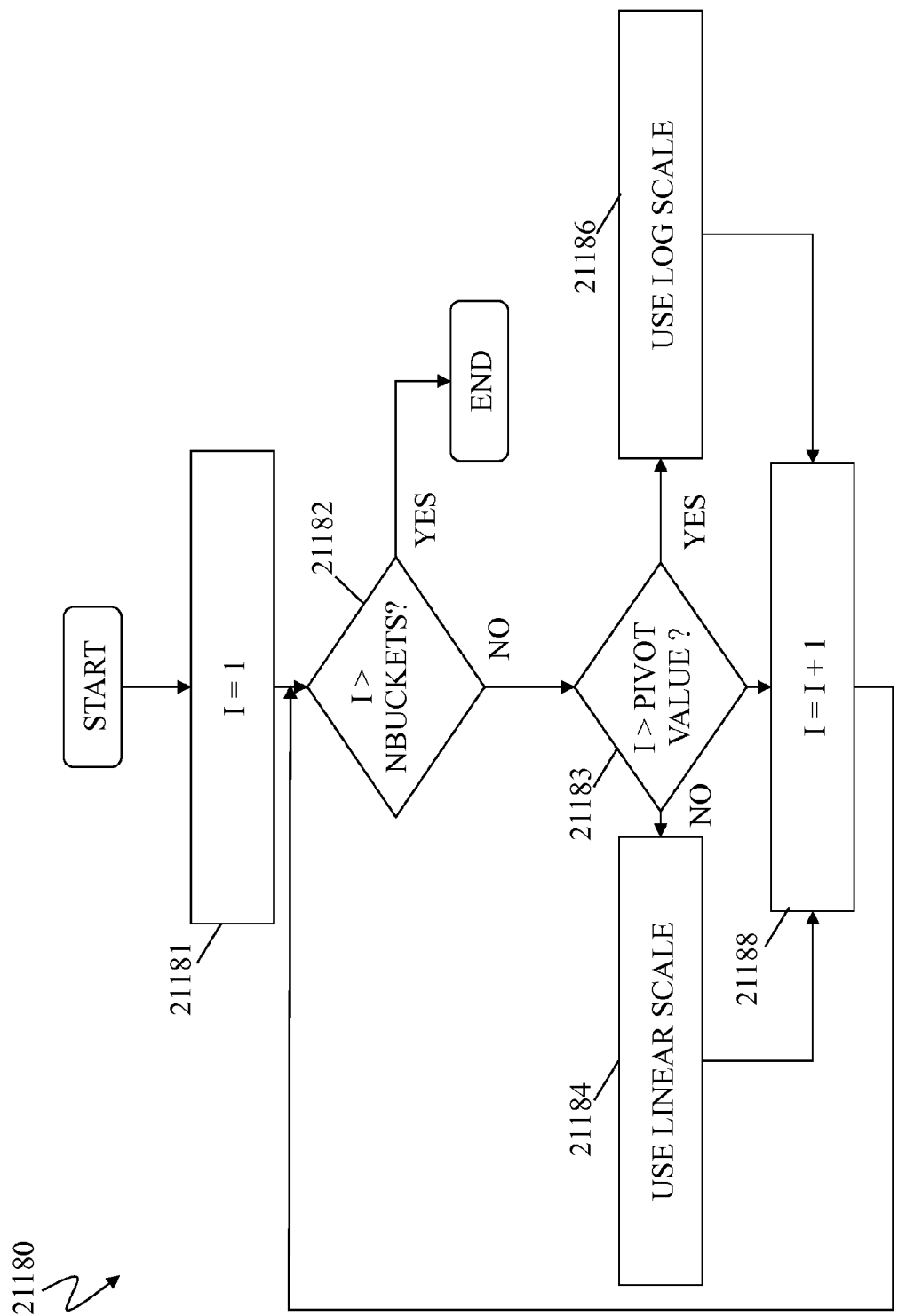
FIG. 16B is a flow chart illustrating processing performed in connection with determining lower boundary values to facilitate mapping raw scores into histogram buckets according to an embodiment of the system described herein.

Referring to FIG. 16B, a flow chart 21180 illustrates steps performed in connection with providing values for converting the raw promotion and demotion scores into promotion and demotion indices (buckets). In an embodiment herein, each of the buckets (bins) has a lower boundary of a raw score that falls into a particular bucket. Thus, for example, given a bucket I, a raw score will map to bucket I if the raw score has a value between the lower boundary of bucket I and one less than the lower boundary of bucket I+1. The following describes how the lower boundary values are set for the bins and thus describes how to map raw scores to particular histogram buckets (bins). Accordingly, the processing performed at the step 21158, discussed above, where raw scores are mapped into particular buckets involves finding a particular bucket where the raw score falls between the low boundary thereof and the lower boundary of the next bucket.

Processing begins at a first step 21181 where I, an index variable, is set to one. The index variable, I, is used to iterate through all of the buckets (bins). Following the step 1181 is a test step 1182 where it is determined if I is greater than NBUCKETS, the number of buckets (histogram values) used by the system. In an embodiment herein, NBUCKETS is five thousand, although other values may be used. If it is determined at the step 21182 that I exceeds the number of buckets, then process is complete. Otherwise, control transfers from the step 21182 to test step 21183 where it is determined if I is greater than a pivot value. In an embodiment herein, a linear scale is used for setting a lower boundary for buckets below the pivot value and a logarithmic scale is used for setting the lower boundary for buckets above the pivot value. Determination of the pivot value is discussed in more detail elsewhere herein.

If it is determined at the test step 21183 that I is not greater than the pivot value, then control passes from the test step 21183 to a step 1184 where a linear scale is used for setting the lower boundary of bucket I. In an embodiment herein, the lower boundary is set equal to I (the bucket number) at the step 21184, but of course other mappings are possible. If it is determined at the test step 21183 that I is greater than the pivot value, then control passes from the test step 21183 to a step 21186 where a logarithmic mapping is used. In an embodiment herein, the following formula is used:

lower boundary=exp(log(pivot value)+logperbucket*(I-pivot value))

where logperbucket equals (maxlog−minlog)/(numbuckets−pivot value-2), maxlog=log(max raw score), minlog=log (pivot value), and numbuckets is the total number of buckets. In an embodiment herein, numbuckets is five thousand and max raw score is 4,800,000. Of course, other values may be used.

Following the step 21184 or the step 21186 is a step 21188 where I is incremented. Following the step 21188, control transfers back to the step 21182 for another iteration.

As discussed elsewhere herein, determining the low boundary for each of the buckets allows mapping the raw scores into particular buckets at the step 21158, discussed above. A raw score maps to a particular bucket when the raw score is greater than or equal to the low boundary and when the raw score is less than the lower boundary of the next higher bucket. The processing illustrated by the flow chart 21180 constructs a table used to map raw promotion and demotion scores into buckets. The mapping may be performed using a binary search of the table.

Figures 16C, 16D:
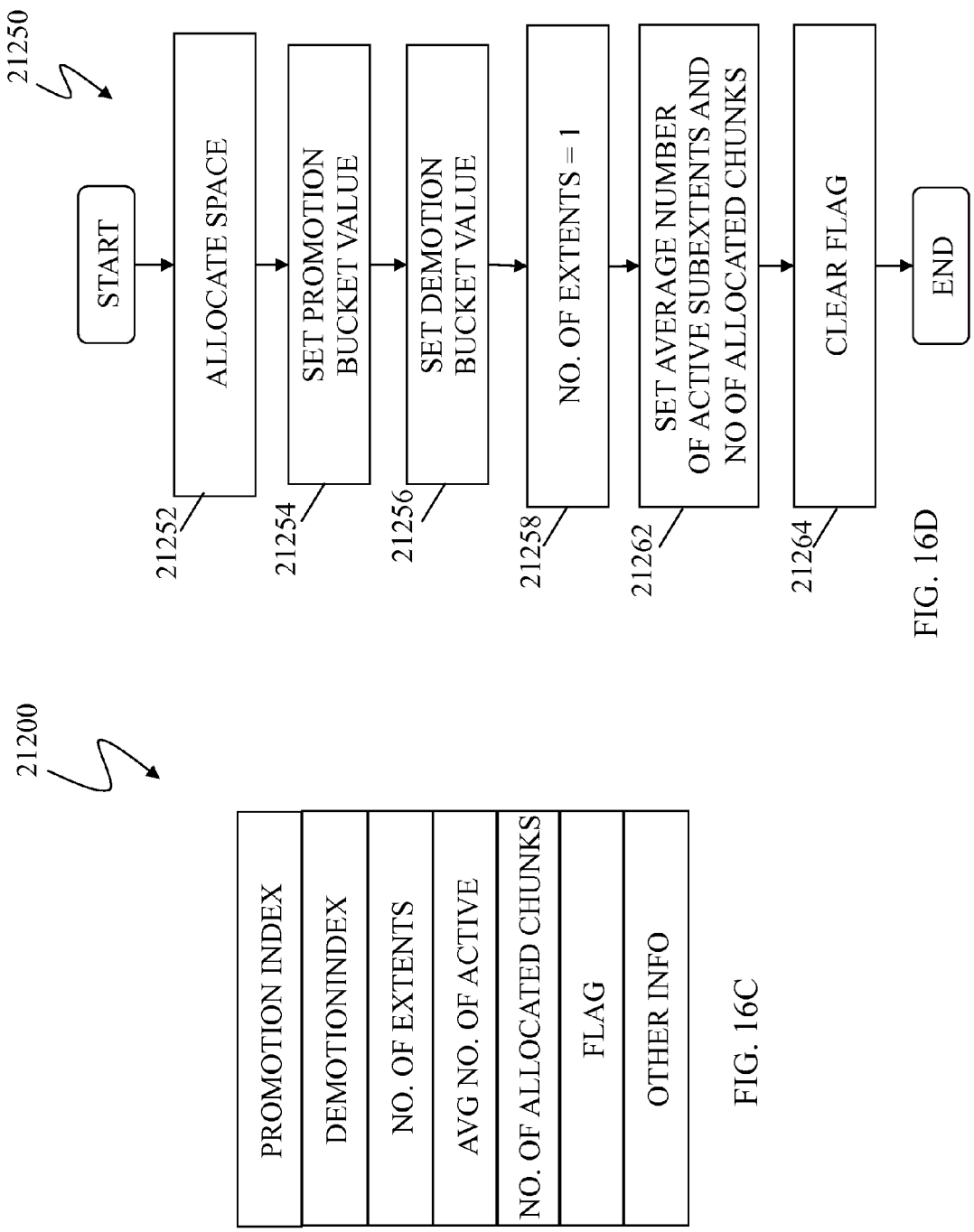
FIG. 16C is a diagram illustrating a data structure used for storing data for super-extents according to an embodiment of the system described herein.
FIG. 16D is a flow chart illustrating processing performed in connection with creating a new super-extent according to an embodiment of the system described herein.

Referring to FIG. 16C, a diagram 21200 illustrates a data structure that may be used for storing metadata for a super-extent. The data structure 21200 includes an entry for the promotion bucket index for the super-extent and an entry for the demotion bucket index for the super-extent. The data structure 21200 also includes an entry for the number of extents in the super-extent.

As discussed elsewhere herein, an extent may include a number of sub-extents. In an embodiment herein, there are forty-eight sub-extents for each extent. Some of the sub-extents may be active (i.e., have been accessed within a particular amount of time). In an embodiment herein, a sub-extent is considered active if there has been at least one I/O operation thereon within the last 4½ days and is considered inactive otherwise. The data structure 21200 includes a field indicating the average number of active sub-extents for all of the extents of the super-extent. The value of the average number of active sub-extents field is provided by:

(total number of active sub-extents)/(number of extents)

The data structure 21200 also includes a flag field that indicates whether data for a particular super-extent was recently promoted or demoted and to which tier. In some embodiments, it is possible to use the flag field to decide to add a particular super-extent to a histogram and/or whether to demote (or promote) data corresponding to a particular super-extent. For example, in an embodiment herein, data that had been recently promoted to the first or second highest level (according to the flag field) is not considered for demotion to the lowest level and data that been recently promoted to the highest level (according to the flag field) is not considered for demotion at all. Note that handling promotion first followed by demotion may be considered part of the policy. The data structure 21200 may also include other information. In an embodiment herein, the flag indicates whether a corresponding data portion had been promoted or demoted in connection with the previous histogram (e.g., the most recent iteration). Thus, after running the promotion algorithm, the flag may be used to eliminate from the demotion histogram any data that had just been promoted, as described above.

Referring to FIG. 16D, a flow chart 21250 illustrates steps performed in connection with creating a new super-extent at the step 21166, described above. Processing begins at a first step 21252 where space is allocated for the metadata for the super-extent. In an embodiment herein, the super-extent metadata may be provided in the global memory 25*b*, although other storage locations are possible, provided that the metadata is accessible to provide the processing described herein.

Following the step 21252 is a step 21254 where the promotion bucket index is set to the value determined at the step 21158, described above. Following the step 21254 is a step 21256 where the demotion bucket index is set. Following the step 21256 is a step 21258 where the number of extents field is set to one. Following the step 21258 is a step 21262 where the value for the average number of active sub-extents field is set according to the number of active sub-extents for the extent and where the number of allocated chunks for the super-extent is set. Following the step 21262 is a step 21264 where the flag field is initialized (e.g., cleared) because the data corresponding to the new super-extent had not been recently promoted or demoted (i.e., marked, according to the flag, as having been promoted or demoted in the previous operation). Following the step 21264, processing is complete.

Figures 16E, 16F:
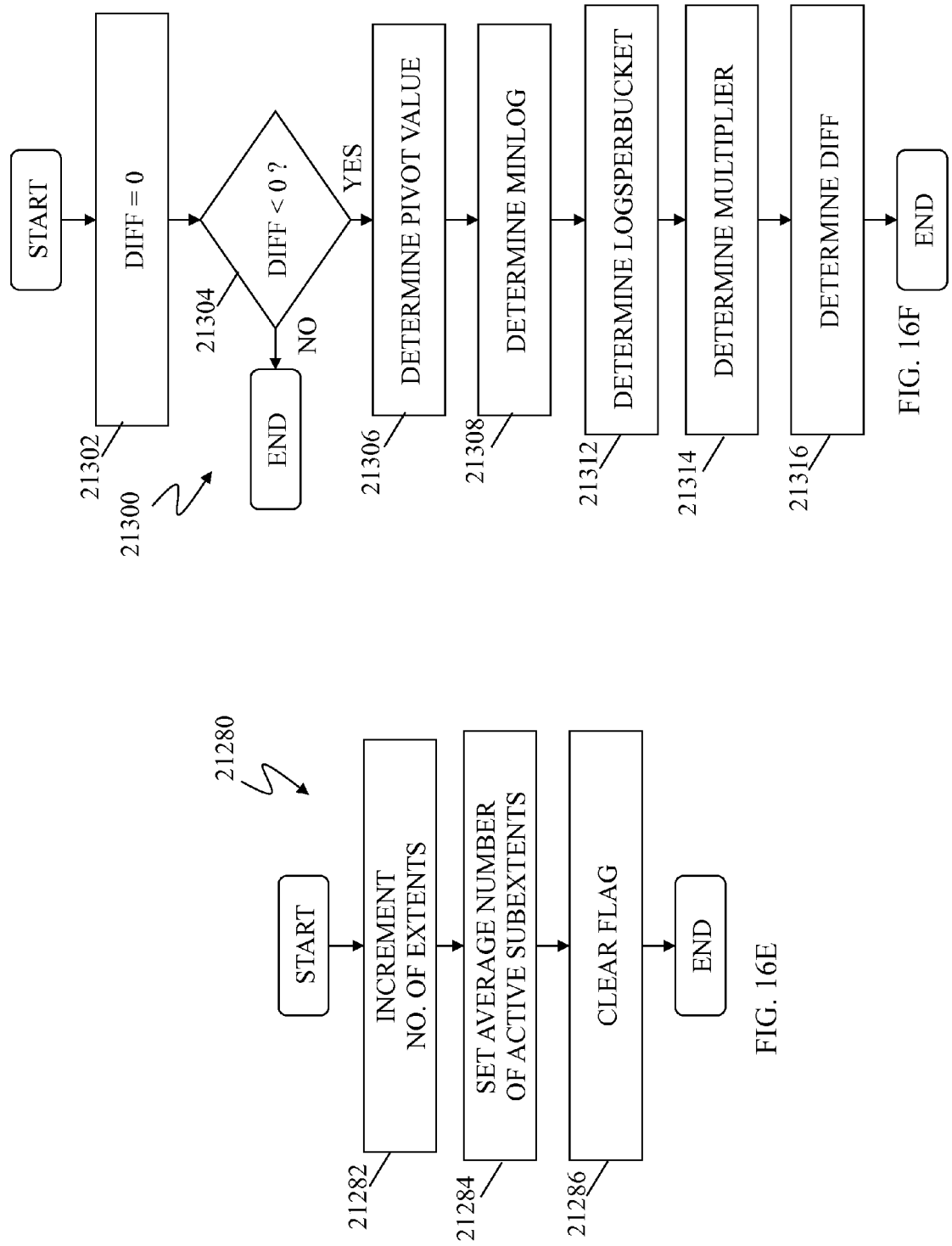
FIG. 16E is a flow chart illustrating processing performed in connection with adding extent information to a super-extent according to an embodiment of the system described herein.
FIG. 16F is a flow chart illustrating calculating a pivot value according to an embodiment of the system described herein.

Referring to FIG. 16E, a flow chart 21280 illustrates steps performed in connection with adding an extent to an existing super-extent at the step 21164, described above. Processing begins at a first step 21282 where the number of extents field is incremented. Following the step 21282 is a step 21284 where the average number of active sub-extents field is adjusted to account for the active sub-extents in the extent being added. Following the step 21284 is a step 21286 where the flag field is modified (e.g., cleared). Following the step 21286, processing is complete.

Referring to FIG. 16F, a flow chart 21300 illustrates steps performed in connection with determining the pivot value. As described elsewhere herein, the pivot value is used to determine when to use a linear scale to set the lower boundary for a bucket index and when to use a log scale to set the lower boundary. It is desirable to set the pivot value so that the log scale does not cause the same lower boundary value to be provided for adjacent buckets. In an embodiment herein, the pivot value is set so that the difference between adjacent lower boundary values is at least one, but a different value for the desired difference may also be used.

Processing for the flow chart 21300 begins at a first step 21302 where a variable, DIFF, is set to zero. The DIFF variable is used to keep track of the difference between the lower boundaries of adjacent buckets as the pivot value is increased. Following the step 21302 is a test step 21304 where it is determined if DIFF is less than one. If not, then processing is complete. Otherwise, control transfers from the test step 21304 to a step 1306 where the pivot value is calculated using the formula:

pivot value=1+1/(multiplier−1)

where multiplier equals exp (logsperbucket) and where determination of logsperbucket is described above. For the initial determination of logsperbucket prior to first performing the step 21306, it is assumed that pivot value is one so that the initial value of minlog is zero.

Following the step 21306 is a step 21308 where minlog is recalculated. As discussed elsewhere herein, minlog is the log of the pivot value. Following the step 21308 is a step 21312 where logsperbucket is recalculated. Determination of logsperbucket is discussed elsewhere herein. Following the step 21312 is a step 21314 where multiplier (which equals exp(logsperbucket)) is recalculated. Following the step 21314 is a step 21316 where DIFF is recalculated using the formula:

DIFF=(pivot value)*multiplier−pivot value

Following the step 21316, control transfers back to the step 21304 for another iteration.

In some embodiments, it is possible to have multiple independent storage groups that share the same physical storage space, where each storage group has its own independent set of thresholds used for tiering data. Note also that, since it is not necessary to provide absolute comparison of statistics of all of the data stored in physical storage space, the system could be implemented with multiple independent processes (possibly executed by different processors) that determine histograms and provide tiering for different storage groups. Construction of the histograms 1000, 1100 may be independent of each other and may be independent of processing that uses the histograms to promote and demote data.

After processing is performed for the first and second storage tiers to determine promotion and demotion thresholds using capacity limits and the first zone's performance limits, an overall performance metric for the SG using the physical drives of the storage tiers just processed is determined. In one embodiment, this performance metric may be the modeled average response time (RT) for the SG across all storage tiers just processed and may be represented in EQUATION 6 as:

$$\text{Average RT} = (1/\text{Total I/Os per second}) * \Sigma \text{ ALL\_TIERS (RT of tier*I/O operations per second for the tier)}$$

In EQUATION 6, "Total I/Os per second" is the total number or aggregate of I/Os per second across all physical devices of the SG, "Σ ALL_TIERS" is the mathematical summation of the product represented by "(RT of tier*I/O operations per second for the tier)". It should be noted that the "RT of tier" may represent the average response time of physical devices in a particular tier. Additionally, EQUATION 6 may generally be determined with respect to all SGs and devices thereof currently being evaluated using the techniques herein. The foregoing Average RT may serve as an overall metric regarding performance of the entire SG across all storage tiers considered to determine whether the modeled performance using the response time limits for the first zone is preferable over other response time limits of another zone. The foregoing EQUATION 6 is a weighted average response time calculation that considers the number of I/Os with a given response time. Alternatively, an embodiment may compute an average RT including separate weightings related to technology type. It should be noted in connection with computing the average RT for the SG using EQUATION 6, the RT for each storage tier of the SG is utilized. This RT for each storage tier may be the last modeled RT computed during the histogram traversal as a result of performing promotion and demotion threshold determination and modeling the performance of such proposed data movement candidate data portions. It should be noted that if other criteria, such as utilization, are used in addition to or as an alternative to RT, then an embodiment may compute an overall or average metric across all storage tiers similar to as described above with EQUATION 6. For example, if zones of performance limits are defined for utilization limits for the storage tiers, then a metric for computing average utilization across all storage tiers of devices being evaluated may be used to represent the overall performance criteria used in selecting a set of performance limits in combination with capacity limits, and also the associated promotion/demotion thresholds.

In a similar manner as just described for the first set of performance limits of the first zone, processing is also performed for the next zone 2 (e.g., using the second set of performance limits). Thus, promotion thresholds and an average RT using EQUATION 6 are produced as a result of processing in accordance with capacity limits in combination with performance limits of each zone. After each zone is processed for candidate promotion and demotion thresholds, a determination may be made as to whether to stop further evaluating remaining zones. Such a determination may be made by comparing a first value for the average RT determined using EQUATION 6 for a current zone with second value for the average RT determined using EQUATION 6 for the previously processed zone. For example, after determining promotion and demotion thresholds using zone 1 performance limits in combination with capacity limits (zone 1 scenario) and then zone 2 performance limits in combination with capacity limits (zone 2 scenario), the average RT associated with the zone1 scenario may be compared to the average RT associated with the zone 2 scenario. If the average RT for zone 2 scenario does not indicate a sufficient or threshold level of improvement over the average RT for zone 1, then no further zones may be evaluated. An embodiment may define a threshold value that represents the minimum amount of improvement expected in order to continue evaluating further zone scenarios (e.g., determining promotion and demotion thresholds using capacity limits and performance limits for subsequently defined zones). An embodiment may determine a difference in metric values obtained for the average RT for the two zone scenarios to be compared. An improvement between zone scenarios may be determined if there is decrease in the average RT (e.g., lower average RT means better overall performance). This decrease may be larger than the threshold in order for a sufficient level of improvement to be determined. Alternatively, an embodiment may set the threshold value to zero so that any decrease in average RT between scenarios is considered sufficient improvement to proceed with evaluating further zone performance limits in combination with capacity limits.

It should be noted that if one of the capacity limits has been exceeded on a preceding iteration of processing for the prior zone, processing using subsequent zones stops. The processing described herein assumes that the lowest storage tier has sufficient capacity to accommodate storage for any data portions not mapped to the other storage tiers.

Figure 17:
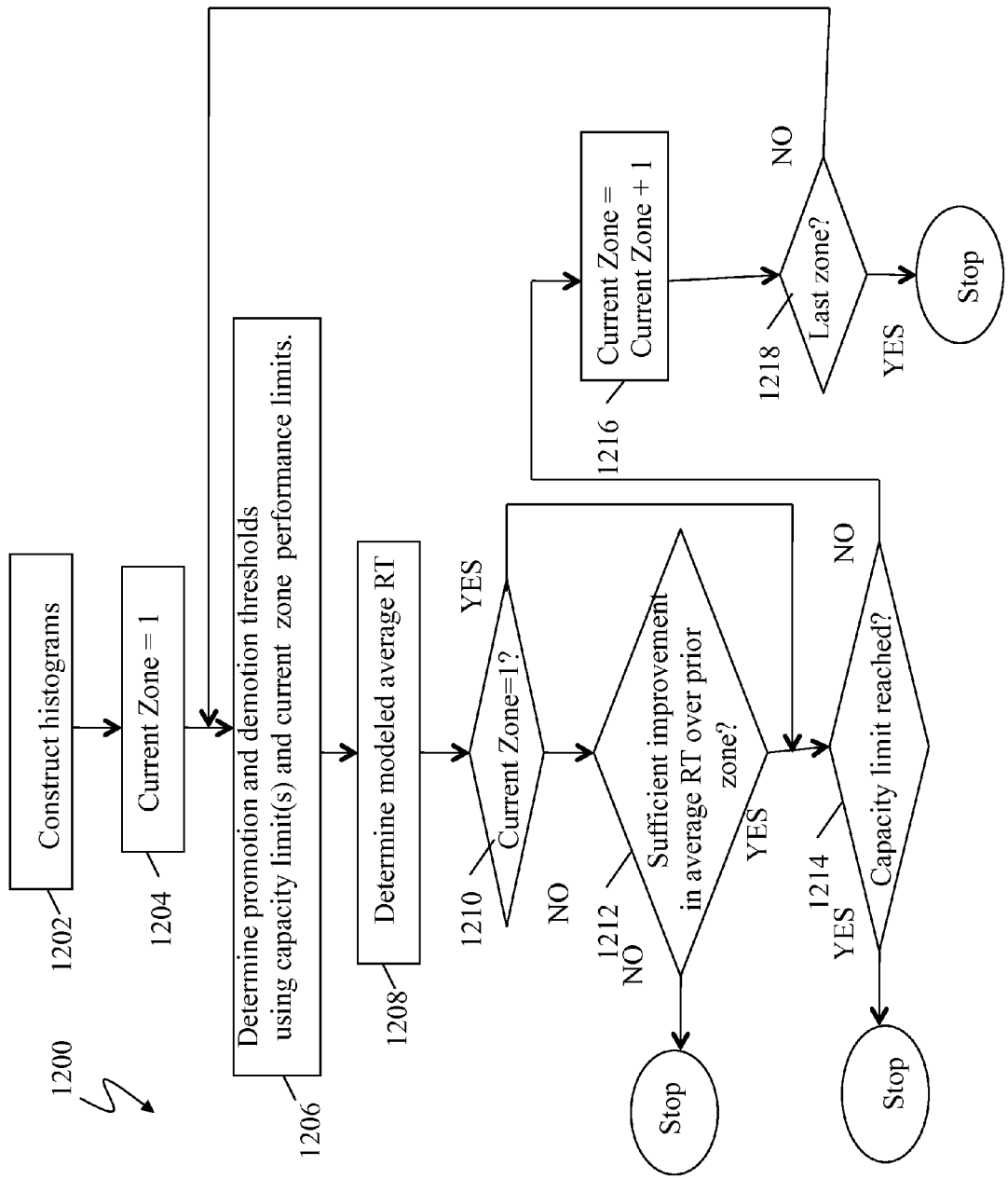

Referring to FIG. 17, shown is a flowchart 1200 of steps that may be performed in an embodiment in evaluating and modeling performance for different performance limits in combination with capacity limits in an embodiment in accordance with techniques herein. The steps of 1200 summarize processing described above. At step 1202, one or more histograms may be constructed. In step 1204, current zone is set to 1 in connection with commencing processing for the first zone's performance limits. At step 1206, promotion and demotion thresholds are determined in accordance with the capacity limits and performance limits of the current zone. Selection of such thresholds is followed by modeling proposed data movements and determining modeled RTs for all storage tiers for the one or more SGs. At step 1208, the modeled average RT is determined as an overall performance metric across all storage tiers for the one or more SGs. At step 1210, a determination is made as to whether the first zone is currently being processed. If so, control proceeds to step 1214. Otherwise, control proceeds to step 1211 where a determination is made as to whether there has been sufficient improvement with respect to the modeled average RT values for the current zone scenario and the previous zone scenario. If step 1212 evaluates to no, processing stops. If step 1212 evaluates to yes, control proceeds to step 1214 where a determination is made as to whether the capacity limit has been reached. Step 1214 may examine any one or more capacity limits defined such as, for example, capacity limits (e.g., per storage tier, overall SG capacity limits, and the like) as may be defined in an AP, physical limits of drive capacities, and the like. If any one of these capacity limits has been exceeded, step 1214 may evaluate to yes and processing may stop. If step 1214 evaluates to no, control proceeds to step 1216 to increment current zone to the next zone. At step 1218, a determination is made as to whether this is the last zone. If so, processing stops. Otherwise, control proceeds to step 1206.

It should be noted that FIG. 17 illustrates only one particular way in which the performance limit criteria and capacity limit criteria may be used in connection with selecting promotion and/or demotion thresholds based on stopping criteria. An embodiment may vary the stopping criteria. For example, an embodiment may perform the foregoing evaluation of all zones of performance limits and capacity limit(s) and determine an average RT value across all storage tier using EQUATION 6, for each such zone, without consideration of the stopping criteria at steps 1212 and/or 1214 and then select the performance zone limits resulting in the best relative average RT across all storage tiers. As another variation, an embodiment may terminate processing and evaluation of subsequent performance zone limits upon finding a first such zone having performance limits that results in a modeled average RT that is above a defined threshold. Thus, an embodiment in accordance with techniques herein may vary the stopping criteria specified in connection with FIG. 17.

Once processing as described in FIG. 17 is completed, the promotion and demotion thresholds associated with the zone having performance limits resulting in the minimum average RT may be selected for implementation in connection with actually performing the previously modeled data movements. This is described and summarized now with reference to FIG. 18.

Figure 18:
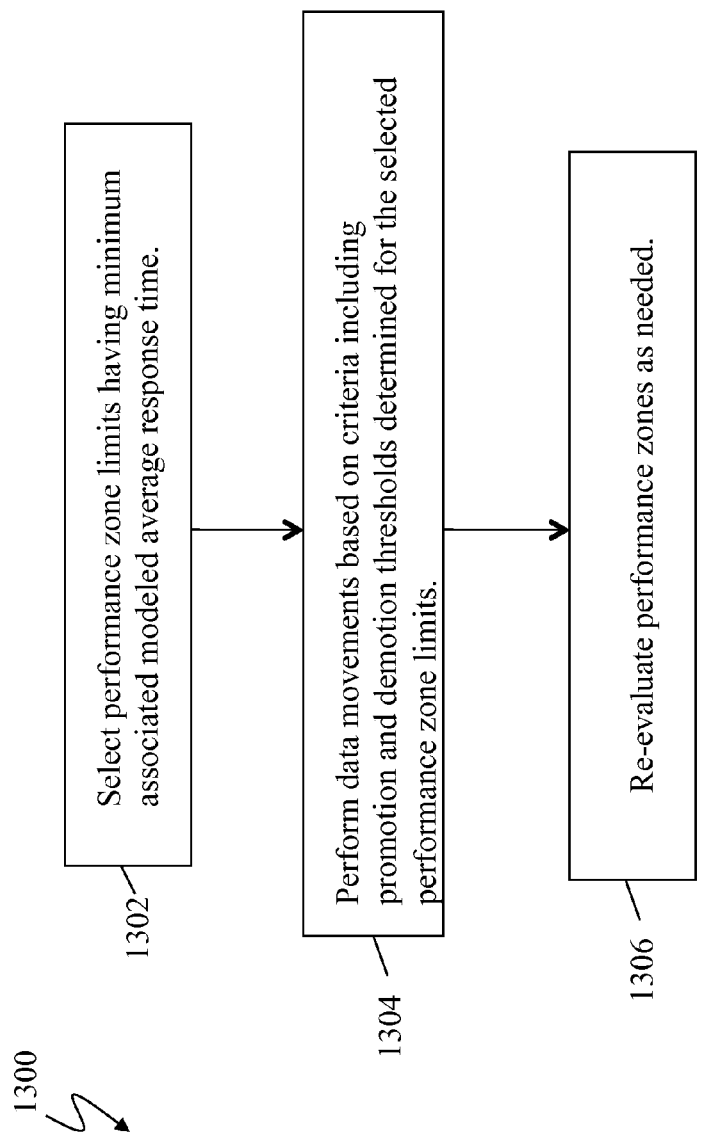

With reference to FIG. 18, at step 1302, performance zone limits are selected having the minimum associated average response time as modeled. It should be noted that if other performance criteria and associated limits, such as in connection with utilization limits described elsewhere herein, is utilized, step 1302 may include considering other overall performance metrics besides the average response time across all storage tiers. For example, an embodiment may also consider the overall average utilization across all storage tiers. If the embodiment utilizes more than one overall performance metric, then step 1302 may include evaluating the combination of the overall performance metrics. For example, an embodiment may weight each overall performance metric in connection with step 1302 to select a particular performance zone and associated limit criteria. At step 1304, data movements (e.g., promotion and demotions for the multiple storage tiers) may be performed based on criteria including the promotion and demotion thresholds determined for the selected performance zone limits of step 1302. In step 1306, performance zones may be re-evaluated as needed using techniques described herein. Additionally, the response time limits of the performance zones may also be modified as needed to adjust for any workload changes in the system. In other words, as described elsewhere herein, the performance zones defined should set forth reasonable response time limits based on workload of the system being evaluated. The performance zones may set forth response time criteria that varies as the system workload may vary in order to appropriately and automatically adjust response time limits to accommodate for such variations in workload dynamically. It should be noted that the re-evaluation at step 1306 may be performed in response to an occurrence of any suitable event. For example, such re-evaluation may be performed periodically (e.g., upon the occurrence of a predefined time interval), in response to measured or observed system performance reaching a threshold level (e.g., when the measured or monitored response time of the data storage system reaches a defined threshold level), in response to a user's manual selection, and the like.

For purposes of simplification, examples above considered a single SG. An embodiment may evaluate multiple SGs in combination if they share physical devices or defined pools of devices so that there is a dependency in that they utilize the same data storage resources. Additionally, there may be other consumers of the physical devices beside those under management of an optimizer or other component using the techniques herein for data movement. For example, there may be devices which not under management of such a component performing data movement using techniques herein for any one or more reasons. When considering the performance limits of storage tiers, an embodiment may determine a performance baseline associated with such devices representing the workload of such devices in the system since such devices may be viewed as having consumed or utilized a portion of the allowable performance limits. The performance baseline may be defined as disk utilization or a response time value that a physical storage device or drive would have if the drive only hosted data storage for devices that are not under management by a component using the techniques herein. In one embodiment this may include those portions of thin devices which may not be moved between physical devices such as between storage tiers. An embodiment may determine the baseline performance in any suitable manner for unmovable thin devices. For example, an embodiment may determine the data or thick devices included in a thin device pool servicing the thin device and obtain performance data for each such data device in the thin pool. There is an assumption that the embodiment provides for an distribution of workload within pool data devices. Performance data may be obtained for each moveable thin device using the thin device pool where such performance data indicates the thin device workload as distributed over data devices of the thin pool. For each such data device, the workload associated with unmovable thin devices may be determined by subtracting the distributed movable thin device workload associated with the data device from the observed workload of the data device. In other words, for a data device, the workload of the data device attributable to the moveable thin device is subtracted from the total workload of the data device. The result of the foregoing is an estimate of the data device workload attributable to non-moveable thin device portions.

In connection with the defined performance or comfort zones described herein, it should be noted that such zones are determined for the particular resource or service that may be consumed or utilized. In a similar manner, zones may be defined and evaluated in connection with other resources or services which are consumed or utilized in the data storage system. For example, zones and performance modeling variations may be modeled in connection with varying the amount of cache where cache limits may be placed on data cached for particular thick or data devices, thin devices, and other entities which consume cache. As another example, zones of performance limits may be specified for varying performance limits related to one or more DAs that service physical data storage devices. In a similar manner as described herein for storage tiers of physical devices, different performance criteria may be specified in terms of performance zones of limits. For example, with respect to DAs, utilization may be used as a performance metric for which comfort zones are defined.

In connection with avoiding thrashing, described herein are several techniques that may be utilized such as related to using weighting of long term and short term metrics (e.g., FIG. 10) and using a stationary zone between demotion and promotion thresholds for a storage tier. An embodiment may use different techniques to avoid large changes in promotion and demotion thresholds selected and utilized in successive time periods. An embodiment may determine a running average with respect to promotion and/or demotion thresholds determined using the techniques herein and use the running average as the actual threshold when implementing data movements. The running average of promotion and/or demotion thresholds may be determined, for example, over a period of time, or using N previous threshold values. An embodiment may also increase the number of performance zones evaluated.

It should be noted that the criteria which is evaluated using techniques herein may include capacity limits and performance limits. The processing performed herein provides for adaptive tier overloading protection by allowing the system to automatically select from different sets or zones of performance limits as system workload changes. The particular performance limit criteria of response time specified for each tier in each zone is only an example of a performance limit criteria that may be used in an embodiment. For example, performance limit criteria may use one or more other metrics other than response time, such as I/O processing rate (e.g., number of I/Os/second), #reads/second, #writes/second, service time, queue waiting time or wait time, length and/or number of wait queues, and the like. These one or more other metrics may be used alone or in combination with response time limits. Furthermore an embodiment may associate a different weighting factor with each of the different metrics included in performance limits specified for a zone. The weights used for each of the different metric may vary with performance zone. Furthermore, the actual metrics may also vary with performance zone. For example, it may be that for a first zone, a particular response time limit is being evaluated and other performance limit criteria is also included for evaluation. This additional performance limit criteria (e.g., an additional metric) may not considered in evaluation with other response time limits of other zones.

Furthermore, the particular overall metric of average response time used to select between evaluated performance zones may vary in an embodiment from what is described herein. For example, an embodiment may use a different metric other than average response time, or may use the average response time metric, alone or in combination with, other overall performance criteria to evaluate and select between performance zone limits. For example, as described elsewhere herein, an embodiment may also use utilization as the performance metric, alone or in combination with, response time. In such an embodiment, comfort zones of utilization values may be specified and an average utilization may be determined across all storage tiers in a manner similar to calculating and using average response time in EQUATION 6. Utilization may also be modeled in a manner similar to response time as described, for example, in connection with FIGS. 13 and 13A-13E (e.g, use modeled utilization curves with I/Os per second on the X-axis and utilization on the Y-axis as may be determined through observed and collected data).

Described above are techniques where performance limits and capacity limits are included in the criteria used to determine when limits of a storage tier have been reached. The above-mentioned criteria may include performance limits alone, or performance limits in combination with capacity limits. Furthermore, the above-mentioned criteria used in connection with comfort zones may include capacity limits alone without performance limits.

As another simpler variation of the techniques herein with the promotion and demotion scores, an embodiment may rather not evaluate multiple alternatives or comfort zones and may rather consider a single set of limits or criteria including limits that may be based on performance limits as described above (e.g., response time) in combination with capacity limits, performance limits alone, or capacity limits of the different storage tiers alone without performance limits in connection with determining data portions such as extents stored in the various storage tiers. Described below is processing for an embodiment using capacity limits alone. However, other above-noted criteria (e.g., performance limits alone or in combination with capacity limits) may be used in connection with such processing. For example, consider an embodiment including three storage tiers—a first tier of SSD or EFD devices and second and third tiers of rotating disk drives. The second tier may be, for example, FC 15K RPM drives and the third tier may be, for example, SATA drives. The three storage tiers may be ranked from first to third, in terms of performance, from highest to lowest accordingly. When evaluating which data portions may be stored on, or moved to, the first highest performing tier of EFD drives, promotion scores for extents as described above may be determined. Values for P1-P12 may be selected based on the expected storage tier workload characteristics and performance characteristics of the EFD drives as described elsewhere herein. For determining which extents may be mapped to the EFD storage tier, values of P7-P12 may be selected, for example, based on the expected I/O sizes for the particular EFD drives. Values for P1-P6 may also be selected, for example, based on the expected amount of write activity to account for the fact that performance of the EFD devices degrades with larger amounts of write activity. In a similar manner, demotion scores may be determined for the extents as described above. A first promotion histogram may be formed as described above in connection with FIG. 14 for evaluating which extents may be stored in the EFD storage tier as the target tier. Processing as described in FIG. 19 may be performed to determine which extents may be stored in the first EFD storage tier based on the scores and capacity limit of the EFD tier.

Figure 19:
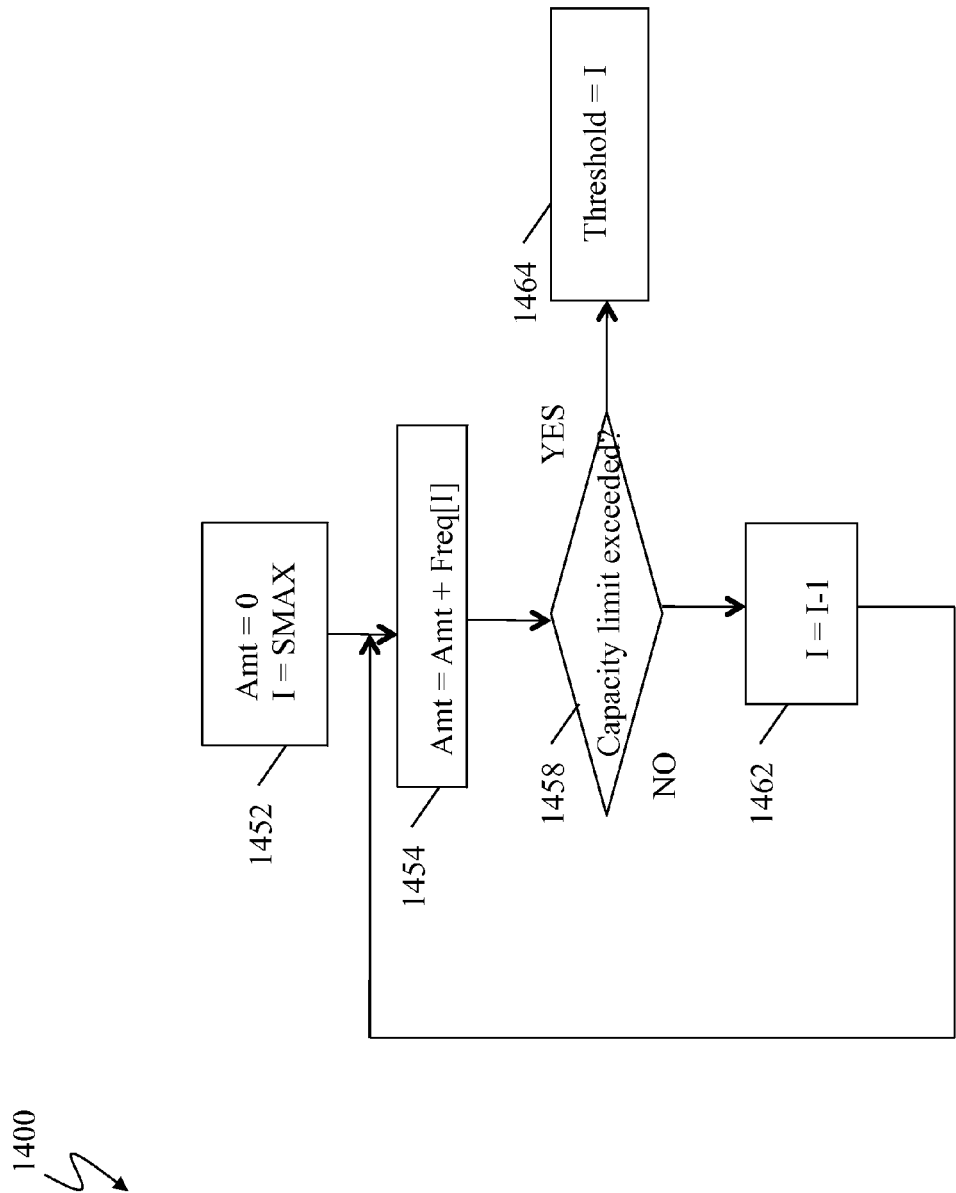

Referring to FIG. 19, shown is a flowchart of steps summarizing processing as described above in connection with determining a single promotion threshold for a single target tier using criteria including capacity limits for the target tier. At step 1452, initialization processing is performed. Step 1452 includes initializing a variable, AMT, that keeps track of the amount of storage portions to zero. Step 1452 also includes initializing an index variable, I, to the maximum score (highest bin). In an embodiment herein, there are five thousand bins, so I would be set to five thousand at the step 1452. Of course, other numbers of bins are also possible. Following step 1452 is step 1254 where AMT is incremented by FREQ[I], the amount of data mapped to bin I. Following the step 1454 is step 1458 where a determination is made as to whether the capacity limit for the current EFD tier have been exceeded. Step 1458 may include comparing the current amount of capacity of the target tier consumed via the modeled mapping represented by AMT to the AP capacity limit. As described elsewhere herein, the total capacity consumed across one or more bins may be determined based on the cumulative frequencies of those bins and the amount of allocated storage of the data portions in the foregoing one or more bins. Step 1458 may include comparing the current amount of capacity of the target tier consumed via the modeled mapping represented by AMT to the SG capacity limit such as may be based on the physical drive capacity limits. If it is determined at the test step 1458 that the established capacity limit has been exceeded, then control passes from the test step 1458 to a step 1462 where the index variable, I, is decremented.

Following the step 1462, control passes back to the step 1454 for another iteration. If the capacity limit is exceeded, step 1458 evaluates to yes and control proceeds to step 1464 where a score threshold is assigned the value of I. Data portions having a score of I or higher are promoted to the highest level of storage. Following the step 1464, processing is complete for the first storage tier, the EFD storage tier.

Once the foregoing of FIG. 19 is performed for the EFD or first storage tier using the first promotion histogram whereby a first EFD promotion threshold is determined, new promotion scores may be determined for the remaining extents not placed in the first EFD storage tier in connection with FIG. 19 processing. In other words, FIG. 19 processing determines which extents include the highest ranked promotion scores of the first promotion histogram where such promotion scores may have coefficients selected for the particular EFD storage tier. Such highest ranked extents may be included in the EFD storage tier up to the capacity limit of the EFD storage tier such as may be specified for the SG. Subsequently, new second promotion scores are determined for the remaining extents where the new promotion scores may have different values selected for the coefficients P1-P12 for the second storage tier. The second promotion scores may use values of 1 for coefficients P7-P12 and may select other suitable values for P1-P6 as described elsewhere herein for the second storage tier.

Based on these second promotion scores, a new second promotion histogram as described in FIG. 14 may be formed and used in connection with determining which extents may be promoted or mapped to second storage tier. To determine which extents may be stored in the second storage tier based on the capacity limits of the second storage tier, processing steps of FIG. 19 may be again performed using the second promotion histogram. In this manner, those extents of the second histogram having the highest promotion scores may be stored in the second storage tier up to the capacity limit of the second storage tier. The remaining extents may be placed in the third storage tier.

Once promotion processing has completed, demotion threshold processing may be performed in a manner similar to that as described elsewhere herein with the difference that only capacity limits are utilized where applicable.

In a manner similar to that as described for criteria including only capacity limits to determine a mapping between data portions and physical storage locations on different storage tiers, such criteria may alternatively include, for example, performance limits in combination with capacity limits, or performance limits alone.

It should be noted that although the techniques described herein are used with thin devices providing virtual storage provisioning, the techniques herein may also more generally be used in connection with other types of devices, such as other logical devices which are not virtually provisioned.

Described herein are different techniques that may be performed by an optimizer, for example, such as the optimizer 138 with reference back to FIG. 3. As described herein the optimizer may perform processing of the techniques herein to determine how to partition physical storage in a multi-tiered environment for use by multiple applications. The optimizer may perform processing such as, for example, to determine what particular portions of logical devices (e.g., LUNs or LVs) to store on physical devices of a particular tier, evaluate when to move data among physical drives of different tiers, and the like. In connection with above-mentioned descriptions, embodiments are described whereby the optimizer may be included as a component of the data storage system, such as a data storage array. In such embodiments, the optimizer may perform optimizations, such as the data movement optimization, with respect to physical devices of a single data storage system such as a single data storage array. Such data movement optimizations may be performed with respect to different data storage units of granularity that may be vary with embodiment and/or type of logical devices. For example, an embodiment may provide for partitioning data of a logical device (as may be stored on one or more physical devices (PDs)) into multiple data portions of any suitable size. The data movement optimization processing may provide for evaluation and data movement of individual data portions (each of which can be much less than the size of entire LV) between storage tiers based on the workload or activity of I/Os directed to each such data portion. As the workload may change dynamically over time, the data storage optimizer may continuously evaluate and perform data movement optimizations as needed responsive to such changing workloads.

The data storage optimizer may be located in a first or primary data storage system and may perform data storage optimizations, such as data movement and other optimizations, for PDs stored on the first data storage system. Additionally, the optimizer, or more generally, the one or more components performing the optimization processing, may perform data storage optimizations with respect to externally located data storage systems and PDs. Each such externally located data storage system may also include one or more storage tiers which may be the same or different storage tiers from those of the primary data storage system and/or other external data storage systems. For example, the first data storage system may be connected, directly or through a network or other connection, to one or more external data storage systems. The optimizer of the first data storage system may perform data storage optimizations such as data movement optimizations with respect to PDs of the first data storage system and also other PDs of the one or more other external data storage systems. In this manner, the data storage optimizer may perform data storage optimizations of its own local devices and/or other devices physically located in another component other than the data storage system. In other words, the techniques herein for performing data movement evaluation, performing the actual movement of data such as between physical devices of different storage tiers, and the like, may be performed by code executing on a component that is external with respect to the data storage system including the physical devices for which such data movement optimization is performed.

Figure 20:
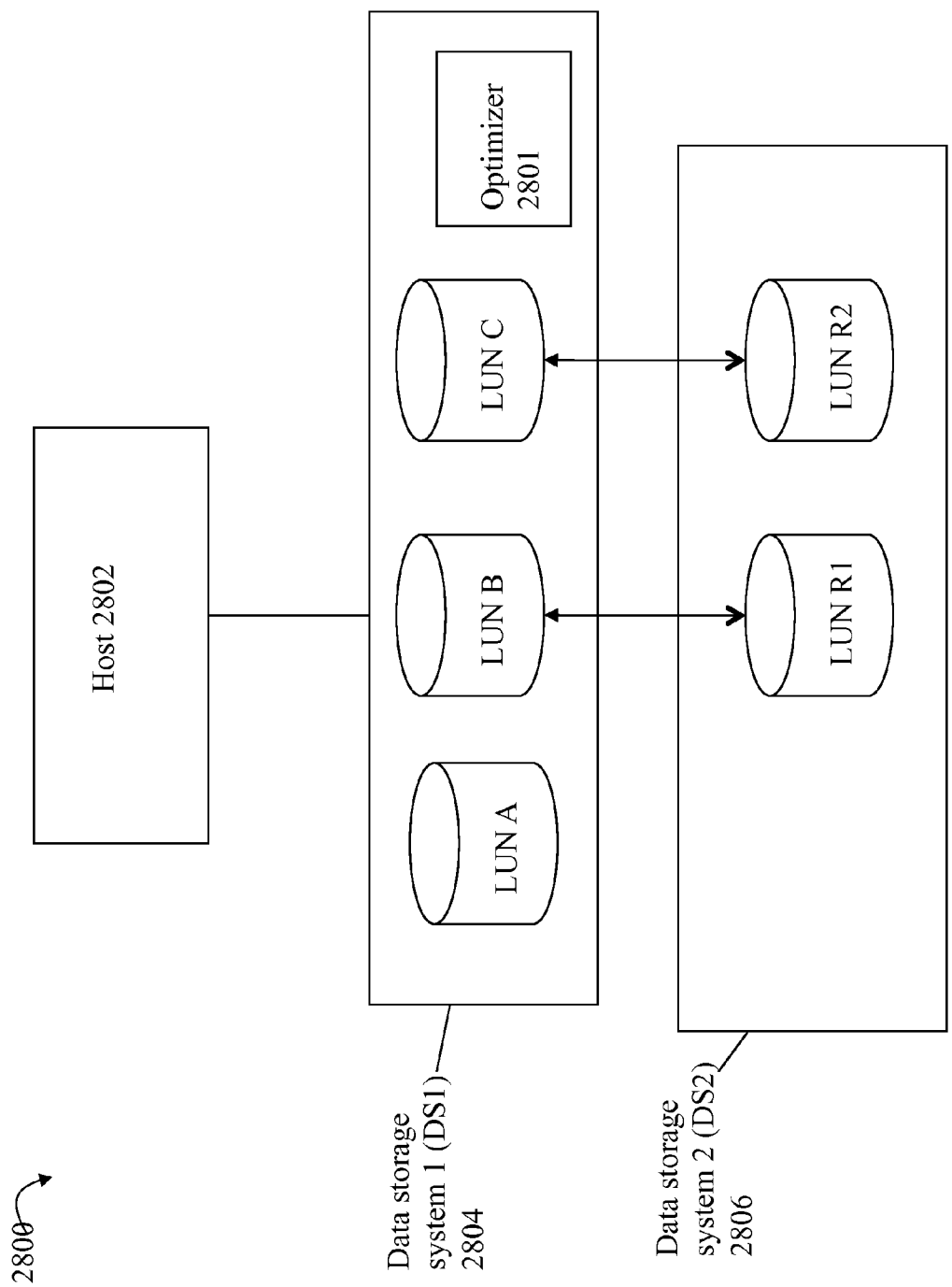
FIGS. 20 and 21 are examples of a host issuing I/Os to a primary data storage system which also performs data optimizations and stores data on external data storage system(s)

For example, with reference now to FIG. 20, shown is an example 2800 of a system and network including a host 2802, data storage system 1 (DS1) 2804 and data storage system 2 (DS2) 2806. The data storage optimizer 2801 as may be included in DS 1 2804 may perform data storage optimizations across multiple storage tiers of PDs included in DS1 2804 and also PDs of DS2 2806. The optimizer 2801 may perform optimization processing such as in connection with data movement evaluation for moving data portions of LUNs between different underlying PDs providing the physical storage for the LUNs. DS1 2806 may provide for presenting to the host 2802 storage on both DS1 and DS2. LUNs A, B and C may be presented as devices of DS1 where LUN A may have underlying storage provisioned on PDs of DS1 and LUNs B and C may have underlying storage provisioned on PDs of DS2. For example, as illustrated, DS1 may map LUNs B and C (presented to the host as devices of DS1) to LUNs R1 and R2, respectively, of DS 2.

DS1 may utilize one or more components providing a "virtualized backend" to DS2 such as, for example, where a DA of DS1 communicates with an FA of DS2 to access LUNs R1 and R2 of DS2. In connection with SCSI terminology, a port of a DA of DS1 may be an initiator and a port of an FA of DS2 may be a target forming a path over which DS1 may access a LUN of DS2 (e.g., access one of the LUNs R1, R2). Thus, the example 2800 is an illustration whereby the host 2802 communicates directly with DS1 2804 issuing commands and operations to LUNs A-C. Host 2802 is provided access to storage and devices of DS2 only indirectly through DS1. As such, DS1 may want to know different types of information about DS 2 2806 (e.g., such as regarding the underlying PD storage from which LUNs R1 and R2 of DS2 are provisioned in connection with providing data services, and other information as described elsewhere herein) in connection with performing data storage optimizations. Complete information regarding DS2, such as related to the configuration of DS2, the performance or storage tier classification and/or underlying PD technology of PDs providing storage for LUNs R1 and R2 of DS2, and the like, may not be available to DS1. Since such information is not provided to DS1, an embodiment may utilize the techniques herein to perform data movement optimizations among multiple storage tiers including such an external storage tier of PDs of DS2.

Generally, an external storage tier may include PDs whose performance classification, technology and/or characteristics may be unknown, incomplete and/or otherwise may not be modeled using a well-defined performance response model for various given I/O workloads. For example, the external storage tier may include PDs which are accessed and used for storing data by another application other than that as managed by the data storage optimizer. In such a case, the external storage tier may include an additional workload which is unknown to the data storage optimizer and may vary with the demands of the other application. Yet any such additional workload has an impact on the performance response of the external storage tier. Without knowledge of the additional workload, it becomes difficult to properly classify the external storage tier using observed or collected data as one of a set of predefined or ranked performance classifications, physical device technology, and the like. For example, a first average RT of M milliseconds may be observed for a first observed average workload. The first average RT may be within an RT range expected for a tier of FC rotating drives which has a heavy total workload, or a tier of SATA rotating drives with a much lighter total workload. It may be that there is an additional unknown workload besides the first workload thereby making it difficult to classify and model the external storage tier using a set of known performance curves for EFD, FC, SATA, and the like, as described herein (e.g., see FIGS. 13A-E). Additionally, such PDs of the external storage tier may change over time. For example, first PDs of the external data storage system may be replaced with newer PDs having different performance classification, technology, and the like, than the first PDs. In this manner, the performance classification and characteristics of the external storage tier may change over time unbeknownst to the data storage optimizer. For example, at a first point in time for I/O workload W1 directed to the external storage tier, an observed RT may be obtained which is 1 millisecond (in the range of an EFD). At a second point in time for the same workload W1 to the external storage tier, an observed RT may be obtained which is 15 milliseconds. In this manner, behavior regarding performance of the external storage tier may be characterized as unpredictable or unstable in that RTs cannot be predicted within some reasonable acceptable bounds for a given workload at different points in time.

In this manner, techniques herein may be used in connection with perform data movement optimizations among a plurality of storage tiers whereby such storage tiers include an external storage tier, or more generally, a storage tier whose performance classification and/or characteristics or unknown, incomplete and/or otherwise may not be modeled using a well-defined performance response model for various given I/O workloads. In other words, techniques herein provide for I/O workload distribution among multiple storage tiers including a tier which may not be accurately modeled using predictive techniques described herein with performance curves.

The techniques herein may be performed by executing code on DS1 whereby the external storage tier may include the underlying PDs providing storage for LUNs R1 and R2 of DS2. The optimizer of DS1 may perform data movement and placement of LUN data of LUNs A-C. For example, DS1 may control movement and placement of data for LUNs B and C on selected ones of LUNs R1, R2 of DS2 whereby information regarding the performance classification, technology of PDs providing physical storage for LUN R1 and R2, and the like may not be available. As such, techniques herein may be used to gather information regarding the possibly changing performance of such PDs of DS2 given particular workloads (e.g., such as in terms of I/O rates) and generate performance curves that may change over time.

Using techniques herein, at a first point in time, DS1 may store data of LUN B accessed by the host on LUN R1 and may store data of LUN C which is accessed by the host on LUN R2 as illustrated in the example 2800. At a second point in time, the optimizer may determine that the data of LUN B should be moved from the external storage tier to PDs of DS2 another second storage tier including PDs locally within DS1 (note that such other PDs are not illustrated in the example 2800 for simplicity of illustration). Thus, DS1 may address each LUN of DS2 in a manner similar to one of its own PDs for placement and data movement optimizations. Using the performance curves and other techniques herein, the data storage optimizer may model proposed data movements to obtain simulated or expected performance results if such proposed data movements are performed.

It should be noted that the foregoing example describes performing data storage optimizations, such as data movement and placement, with reference to an entire LUN or logical device. However, as described elsewhere herein and also appreciated by those skilled in the art, such data movement and placement may be performed with respect to varying and different levels of storage granularity. For example, the foregoing may be used in connection with data movement and placement for a portion of a LUN such as LUN B whereby a first portion of LUN B may have its data stored on LUN R1 and a second portion of LUN B may have its data stored on LUN R2 and yet a third portion of LUN B may have its data stored on PDs of DS1. DS1 may then perform processing to appropriately and suitably move such data portions as workload and activity for each such portion may change over time.

Figure 21:
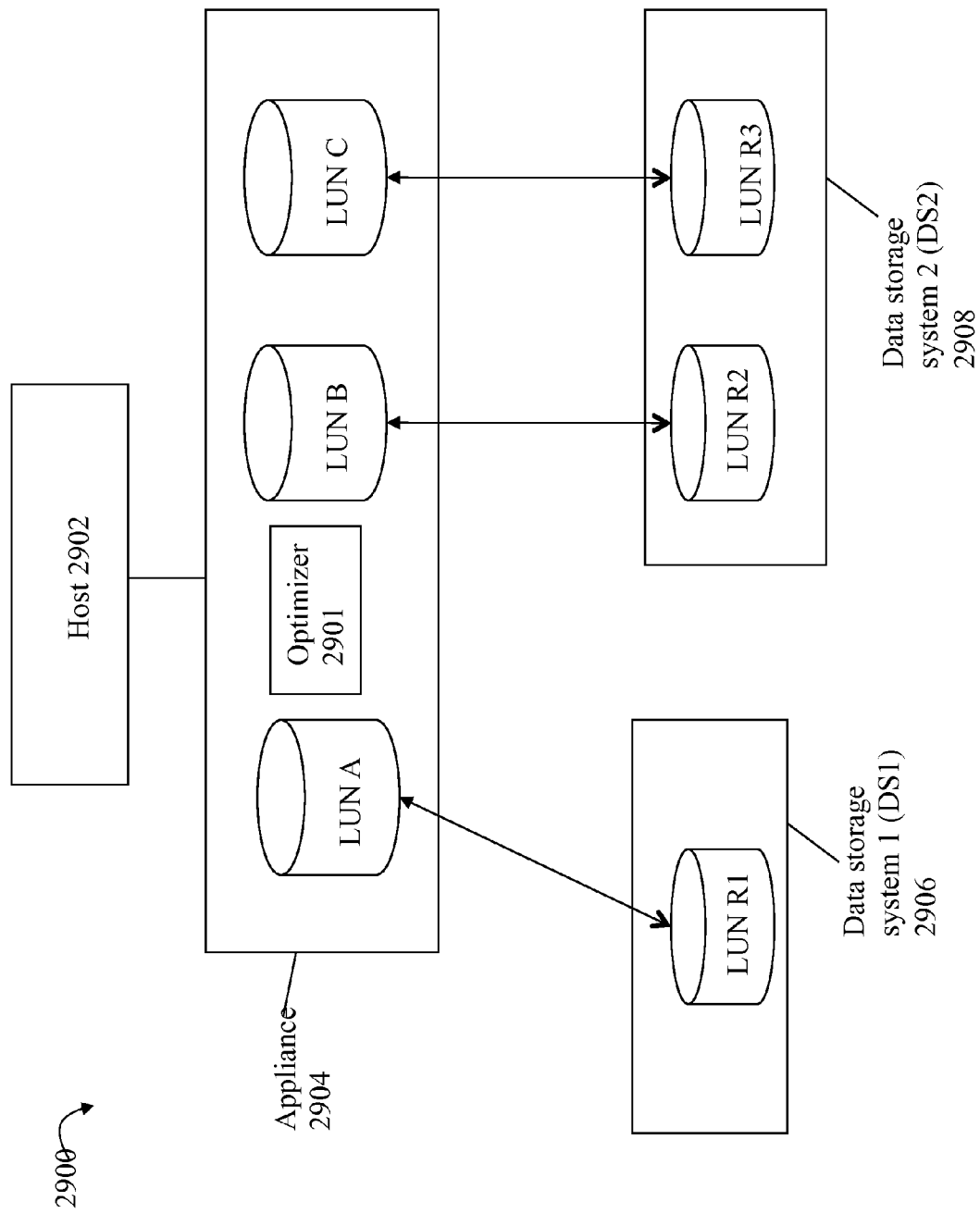

With reference now to FIG. 21, shown is another example of another embodiment that may utilize the techniques herein. The example 2900 includes a host 2902, appliance 2904 and DS1 2906 and DS2 2908. The appliance 2904 may be a data storage virtualization appliance such as an EMC® VPLEX™ appliance which accesses and aggregates storage from multiple data storage systems DS1 and DS2 whereby each such data storage system may be of the same or different types (e.g., same or different manufacturers as well as different array types that may be from a same manufacturer). In this manner, the appliance 2904 may present storage of DS1 and DS2 in an aggregated virtualized environment to the host 2902 and other clients. The host 2902 communicates with the appliance 2904 to access data on any one of the virtualized storage devices LUNs A-C exposed to the client and each such virtualized storage device of the appliance may be mapped to one or more other LUNs R1-R3 of one or more other data storage systems such as DS1 2906 and DS2 2908. To illustrate, the appliance 2904 may expose or present to the host LUNs A-C. As such, the appliance 2904 may want to know information about DS1 2906, DS2 2908 and the underlying PD storage from which LUNs R1, R2, and R3 are provisioned in connection with providing data services, performing optimizations such as data movement as described elsewhere herein, and the like. Such information regarding the expected performance characteristics and performance curves used for predictive RT performance modeling of LUNs R1, R2 and R3 may not be available to the appliance 2904 (e.g. the appliance may not be provided with such information regarding the underlying PDs from which storage is configured for storing data of LUNs R1, R2, and R3). Since such information is not provided to the appliance, an embodiment may utilize the techniques herein for an external storage tier including PDs provisioned for LUNs R1-R3 of DS1 2906 and DS2 2908. The techniques herein may be performed by executing code on the appliance to collect performance data regarding the external storage tier (e.g., the one or more underlying PDs providing storage for LUNs R1, R2 and R3). The foregoing information may be used as described elsewhere herein in connection with determining I/O distribution among different storage tiers and data storage movement optimizations whereby an optimizer of the appliance may perform data movement of LUN data of LUNs A-C. For example, the appliance may at a first point in time map LUN A, or a portion thereof, to LUN R1 of DS1. At a later point in time, the workload to LUN A, or the portion thereof, mapped to the LUN R1 of DS1 may change. The appliance may now determine that LUN A, or the portion thereof, has its data relocated or moved from the external storage tier including LUN R1 to other PDs not included in the external storage tier. Using the performance curves and other techniques described herein, the data storage optimizer may model proposed data movements to obtain simulated or expected performance results if such proposed data movements are performed.

In connection with a data storage system, such as DS 1 2084 of FIG. 20, or an appliance 2904 of FIG. 21, including the data storage optimizer, it is desirable for the data storage optimizer to have information about the external data storage system and its PDs. As described elsewhere herein in more detail, such information may include performance characteristics (e.g., RT characteristics for given workloads such as may be embodied in performance curves) of the external data storage systems PDs and configuration information regarding the external data storage system. However, such information regarding the external data storage system(s) including PDs forming an external storage tier may not be available for use by the data storage optimizer in connection with techniques herein.

In connection with description herein in some contexts, the PDs of the external data storage system may be referred to as virtual drives from the perspective of a first or primary data storage system (e.g., DS 1 2804) including the data storage optimizer. More generally, a virtual drive is a unit of storage that a storage system (such as DS 1 2804) can use to provide storage services to its clients, but which may be embodied as a unit of logical storage presented to the storage system, such as over a storage network, from a separate data storage system. The former storage system including the data optimizer may also be referred to as the primary data storage system and the latter may be referred to as the external data storage system. In contrast with internal drives of the primary storage system, the physical storage media resources underlying a virtual drive do not reside within the primary storage system. The primary storage system delivers storage accesses to the storage media underlying a virtual drive or volume using standard storage network protocols. Examples of such external storage embodied as virtual volumes or drives are described, for example, in connection with LUN R1, R2 of DS 2 2806 of FIG. 20 and LUNs R1, R2 and R3 of DSs 2906, 2908 of FIG. 21. It should be noted that in description herein, external LUN may be used to refer to a LUN located on such an external data storage system and external PD may be used to refer to a PD located on such an external data storage system providing the physical backing storage for external LUNs.

In connection with the data storage optimizer having knowledge regarding the performance characteristics and performance classification of virtual drives, the optimizer on the primary storage system should be able to predict, for a given candidate workload on a given set of drives (whether internal or virtual with respect to the primary storage system), what the resulting utilization and/or response time will be. In this manner, the primary storage system may avoid drive overload missing RT goals. One challenge of the primary storage system related to automating the optimization of a storage configuration that includes virtual drives is the fact that the primary storage system may not have access to explicit, quantitative information needed for modeling the virtual drives and/or external data storage system such as, for example, configuration and performance capabilities of the underlying external storage hardware, information regarding the RAID type in use in the external storage system, the extent to which a given virtual drive may be competing for external storage system resources with other virtual drives or with other activity on the external storage system, and the like. This challenge exists because, in practice, many candidate external storage systems may not support mechanisms, such as APIs (application programming interfaces), that may be used for exporting the needed information to the primary storage system without requiring significant involvement by human storage administrators, or without requiring the configuration of new reporting infrastructure. In some instances, the invasiveness and cost of such storage administration overhead and of implementing such reporting infrastructure can negate the benefits of using virtual drives in the first place.

When such information about the external data storage system is unknown, the PDs of the external data storage system(s) under data storage management and optimization of the data storage optimizer may form an external storage tier included as one of multiple storage tiers whereby techniques herein may perform data movement optimizations among the multiple storage tiers. In connection with following paragraphs, reference may be made to an external storage tier. However, it should be generally noted that the external storage tier may more generally be referred to as a storage tier of PDs where the associated performance classification such as PD performance characteristics, technology, and the like, may be unknown, incomplete and/or otherwise may not be modeled using a well-defined performance response model for various given I/O workloads such as due to changing performance of the external storage tier.

In one aspect, the external storage tier may be more generally characterized as a storage tier having an unknown performance classification and/or unknown drive technology in contrast to one or more other storage tiers for which such performance classification, drive technology, and possibly other performance characteristics are known. In this manner, tiers for which performance characteristics and classifications are known may be ranked or classified relative to one another based on expected performance. For example, as described herein, a first storage tier may include EFDs which is ranked as having a higher performance classification than a second tier of FC rotating disk drives. The second tier of FC drives may be ranked as having a higher performance classification than a third tier of SATA rotating disk drives. However, it may not be possible to similarly rank the external tier relative to the foregoing 3 tiers since such performance characteristics regarding the technology and underlying PDs is not known. By default, an embodiment may rank the external storage tier relative to the foregoing 3 other tiers as the last or worst performance tier of all.

It should be noted that storage tiers may be subject to a predetermined ranking or performance classification where such performance aspects about the PDs are known. With respect to the external storage tier (or more generally a storage tier which is any of unknown performance capabilities, incomplete performance capabilities, and/or not well defined in terms of predictive performance for given workloads), the external storage tier may also be ranked or classified in the predetermined performance classification relative to the non-external storage tier(s) using any suitable technique some of which are described herein such as default to the lowest ranked tier. Such performance aspects may include PD technology as well as one or more other aspects, alone or in combination with PD technology. For example, storage tiers may be classified based on expected average response times or expected response time ranges. In this manner, storage tiers may be ranked in terms of expected performance of the underlying PDs based on such expected characteristics response times. Thus, although examples provided herein may use PD technology as a known performance characteristics for ranking or classifying storage tiers relative to one another, the storage tiers, and also the storage pools (SPs) including PDs of the tiers, may be classified based on criteria including performance characteristics such as expected average response time (RT) for completing an I/O operation. In this manner, the PDs comprising each of the storage tiers (and thus the SPs comprising those tier) may be categorized without requiring knowledge of the underlying storage technology, such as SSD, a particular type of SSD such as MLC, SLC and the like) or a particular type of rotating disk drive (e.g., such as SATA, FC 10K RPM, etc. by a particular vendor). It should be noted that in some embodiments, the storage tiers and associated SPs may include such PD characteristics related to the underlying hardware technology in combination with other performance characteristics including expected average RT. In this manner, storage tiers and SPs may be classified using criteria including the expected average RT, alone or possibly in combination with, other criteria.

In following paragraphs, the external storage tier, or more generally a storage tier which is any of unknown performance capabilities, incomplete performance capabilities, and/or not well defined in terms of predictive performance for given workloads may also be referred to as the FTS tier for shorthand reference purposes. Similarly, remaining storage tiers excluding the FTS tier may be referred to as the non-FTS tier(s).

Techniques herein are described for use with non-FTS tiers which may be characterized as predictive having well defined performance models that can be used for predicting and modeling data storage movement. Additionally, as will be described in following paragraphs, techniques are described for use with and external or FTS tier. In this manner, there may be no existing performance curves or other knowledge of the external tier used with predictively modeling the external storage tier. Furthermore, even if observed performance data is collected and used to construct performance curves to model the external tier, performance of the external tier may be characterized as changing over time so that the same set of performance curve(s) may not be used to model or predict RTs for a given workload at different points in time. For example, one characteristic of the external tier is that there may be an additional workload of I/Os directed to PDs of the external tier and such additional workload is unknown to the data storage optimizer performing the modeling and data storage movement optimization processing. The additional workload impacts overall RT performance since the additional workload must be considered in combination with the workload for I/Os directed to logical devices under management by the optimizer. For example, at a first point in time for a workload W1 (e.g., including a number of I/Os or I/O rate, specified mix of read and/or write operations), the external storage tier may result in an average observed RT of R1. At a second different point in time for the same W1, the external storage tier may result in an average observed RT of RT2 which is significantly different than RT1 (e.g., more than an excepted acceptable difference). The optimizer may be unable to use a same set of performance curves to model the external tier whereby approximately the same RT may be modeled as expected for a given W1 at different points in time. In this manner, the external storage tier may be characterized as having changing or moving RT at different points in time even given the same workload.

In accordance with techniques herein, an embodiment may, in an ongoing manner at different points in time, collect performance data regarding the external storage tier for different workloads. As the performance characteristics, such as observed RT for a given workload, change, the collected performance data may be updated to include such new information and adapt or adjust the average observed RT for an I/O operation associated with the external storage tier. Generally, performance data may be collected for the external storage tier which is referred to herein as a moving average RT adapted to account for changes in observed RT for the same workload at different points in time. One embodiment may collect performance data at various time periods in an ongoing manner. For each time period or interval, the average observed RT it takes for an I/O operation directed to the external storage tier to complete may be determined. The observed average RT obtained at a given time interval "n" may be weighted in connection with other previously observed average RTs obtained at previous time periods to determine an overall average RT statistic maintained in an ongoing manner for the external storage tier. This overall average RT may be referred to as the moving average RT for the external storage tier used in connection with techniques herein. The moving average RT for the external data storage tier may be calculated, for example, using EQUATION 2 described elsewhere herein. Specifically, in accordance with EQUATION 2 noted above, the overall average RT for the externals storage tier, average RT, at a sampling or time period "n", may be determined as:

$$\text{average } RTn = RTn\_observed + (r * RT_{n-1}) \quad \text{EQUATION 7}$$

wherein

RTn is the adjusted updated average RT for the external storage tier for the current or nth sampling period;

RTn_observed is the actual observed average RT to complete an I/O directed to the external storage tier for the current or "nth" sampling period, "r" is a decay coefficient, and "$RT_{n-1}$" is the adjusted activity metric (average RT) from the previous or "n−1" sampling period.

In order to determine an average RT for a time period for the entire external tier, an embodiment may, for example, aggregate pool level performance data whereby such pools are formed of PDs in the external tier to determine an average RT across all such pools and therefore an average RT for a time period with respect to the external storage tier based on observed I/Os. It should be noted that although RT is the performance metric used herein, an embodiment may generally use other suitable performance metrics. Using EQUATION 7 provides for adapting the average RT for the external storage tier over time by weighting previously observed average RTs using the decay coefficient "r". Any suitable value may be selected for use as the decay coefficient in EQUATION 7. For example, a same value for "r" may be selected as used in EQUATION 2 above. A user may select varying values for "r" depending on the particular application, a default value may be used, and the like.

Rather than use EQUATION 7, an embodiment may alternatively calculate average RTn as follows:

$$\text{average } RTn = RTn\_observed + r * (RTn\_observed - RT_{n-1}) \quad \text{EQUATION 7A}$$

whereby the decay coefficient "r" is used to weight the difference (RTn_observed−$RT_{n-1}$). It should be noted that the values used in EQUATION 7A may be as defined and described herein in connection with EQUATION 7.

Figure 22:
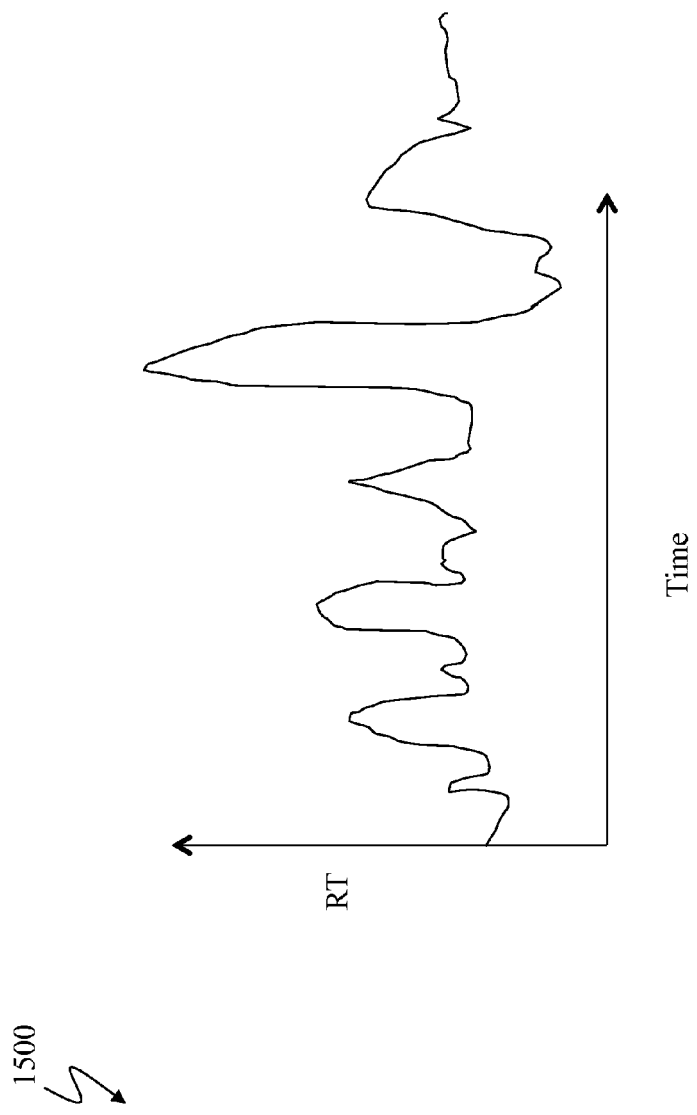
FIG. 22 is an example of an average RT determined with respect to time for an external storage tier as may be used in an embodiment in accordance with techniques herein.

With reference to FIG. 22, shown is an example 1500 of the moving average RT that may be determined at different points in time for an external storage tier. An embodiment may store raw actual observed average RT values (e.g., RTn_observed) along with the number of IOPS (I/Os per second or I/O rate) associated with each such raw or observed average RT obtained at the different sampling periods.

The adaptive techniques herein provide for distributing the I/O workload across all storage tiers, including the external storage tier and other storage tiers under management by the optimizer. In connection with such techniques described in following paragraphs, different factors (which are described below) or criteria may be used to determine a new I/O workload allocation for the external storage tier in order to adapt to any dynamically determined performance difference between the external FTS tier and other non-FTS storage tiers. In the foregoing the other storage tiers may be the remaining storage tiers whose RT performance for a given I/O workload may be predictively modeled using performance curves. The difference between predicted (or projected) RT performance of the lowest such ranked non-FTS tier (that has IO being projected) and observed RT performance of the external or FTS tier may be used as described in following paragraphs as one of the inputs in determining workload (e.g., amount of I/Os) allocated to the external storage tier for purposes of modeling. The projected workload allocated to the external storage tier may be referred to in following paragraphs as the reserved workload or amount of I/Os for the external storage tier for which processing may be performed. In accordance with techniques herein, each iteration of processing may determine an updated amount of reserved workload in terms of I/Os for the external storage tier.

As a first step as described above, current performance data for the external storage tier may be collected and an updated average observed RT for the external storage tier may be determined such as using EQUATION 7. As a second step, processing described above may be performed to make a first prediction or model of projected workloads and modeled RTs for all storage tiers without considering the FTS or external storage tier. For example, assume there are a total of 4 storage tiers—a first EFD tier, a second tier of FC rotating disk drives, a third tier of SATA rotating disk drives and a fourth external storage tier. The second step performs processing with respect to the foregoing first 3 non-FTS tiers for which performance classification and characteristics are known (without considering the external storage tier) and able to modeled using predictive modeling techniques, such as using the performance curves described elsewhere herein (e.g., FIGS. 13A-E). In an embodiment in accordance with techniques herein, the second step detailed processing is described above and may include, for example, determining scores for all data portions and constructing a histogram using such scores, for example, as illustrated in FIGS. 14, 14A, and 16. Using such histograms, the system may determine which data portions should be located in each of the foregoing 3 storage tiers (excluding the external storage tier) and may model resulting RT performance and projected I/O workloads of each such tier. The workload in terms of I/Os or an I/O rate (e.g., IOs per second or IOPS) for each tier may be determined by aggregating the workload of all data portions which the histogram indicates should be located in each tier. Once the modeled workload in terms of I/Os or I/O rate and any associated information regarding read/write mix or ratio and average I/O size is determined for each non-FTS tier, the resulting RT of each tier may be modeled using the performance curves for each such storage tier. For purposes of description, the processing performed such as in the second step and described herein to determine a projected workload and associated resulting modeled RT for each non-FTS storage tier (e.g., other than the external storage tier) may be referred to as determining an allocation or workload and modeled RT for each storage tier using the automated storage tiering techniques in a predictive manner such as using performance curves. An embodiment performing the second step may perform processing as described herein regarding performance zones (e.g., FIG. 17) and using capacity and performance limits (e.g., FIG. 15). In this manner, histograms may be constructed based on capacity and performance limits (e.g., FIG. 15) for the non-FTS tiers. As described, for example in connection with FIGS. 17 and 18, different performance zone limits for each storage tier may be evaluated using predictive modeled performance in order to select performance zone limits for the tiers having the best modeled performance (e.g., minimum predicted RTs). Using such selected performance limits and capacity limits with the histogram, promotion and/or demotion thresholds may be determined denoting a partitioning of which workloads (and data portions having such workloads) are projected as included in each of the storage tiers. In this manner, a projected I/O workload of the different storage tiers (excluding the external storage tiers) may be determined as well as RT predictions for each storage tier other than the external tier and also an overall data storage system RT prediction given such projected I/O workloads for the different storage tiers. As described herein, the overall optimization goal is to minimize the overall data storage system RT (with respect to all I/Os directed to logical devices under management using such techniques).

As a third step, processing is performed to determine a workload allocation or reserved workload for the external storage tier. The third step is described in more detail in following paragraphs as well as other steps). The third step may include determining a delta amount (e.g. increase or decrease) of workload by which to change the projected workload allocated for the external storage tier. The updated projected workload reserved for the external storage tier may be an increase, decrease, or no change with respect to the reserved workload for the external tier determined by the previous iteration of processing. As a fourth step, processing is performed as in the second step and described herein to determine a projected workload and associated resulting modeled RT for each storage tier other than the external storage tier using predictive performance modeling (e.g., based on the performance curves such as FIGS. 13A-E). However, in the fourth step, the workload allocated among the non-external storage tiers is the total workload for the data storage system (or total workload with respect to I/Os directed to logical devices under management by automated storage tiering) reduced by the reserved I/O workload allocated to the external storage tier. The reserved amount of workload allocated to the external storage tier is that amount determined by the third step. As a fifth step, as described above (e.g., step 1304 of FIG. 18), data movements may be determined based on the particular data portions the modeling determined should be located in the different storage tiers and the current tier in which such data portions are currently located.

The above-referenced overall processing steps will now be described in more detail. In connection with the data storage system, or more generally storage under management using the data storage optimizer and techniques herein, the total I/O demand or workload is known. Processing herein determines how much of the I/O workload is reserved or allocated for placement in the external storage tier prior to executing the predictive algorithm to distribute the remaining I/O workload among the remaining storage tiers (other than external storage tiers). In connection with the relative performance classification or ranking of all storage tiers, the external storage tier may be treated as the lowest ranked of all storage tiers. This may be the case, for example, due to the uncertainties and unknown performance aspects of the FTS tier relative to the other storage tiers whose relative performance classifications are known. Techniques herein assume that tiers with better I/O RTs should be projected with more I/O workload relative to other tiers experiencing worse I/O RTs. Thus, I/O workload may be accordingly shifted between tiers based on tier RTs.

Figure 23:
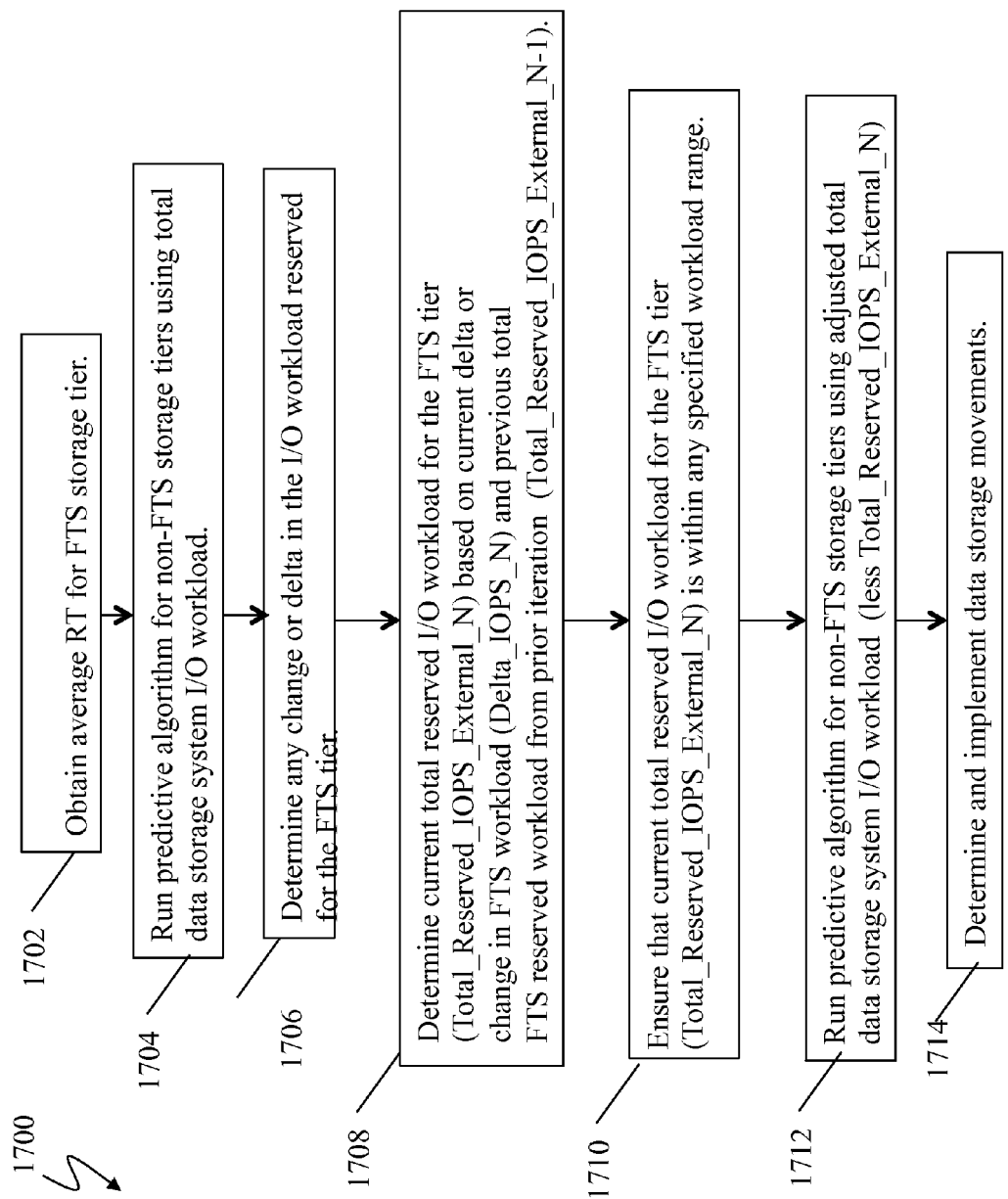
FIGS. 23, 25 are flowcharts of processing steps that may be performed in an embodiment in accordance with techniques herein.

With reference to FIG. 23, shown is a flowchart of processing steps that may be performed in an embodiment in accordance with techniques herein. It should be noted that the processing steps of 1700 outline steps of a single iteration of an algorithm that may be repeatedly performed in an ongoing manner at various points in time. In following paragraphs, iteration N may refer to the current iteration and iteration "N−1" may refer to the immediately prior or previous iteration of such steps of 1700.

At step 1702, the average RT for the FTS tier may be obtained. This may be, for example, the measured moving RT average as described above determined using EQUATION 7.

At step 1704, processing may be performed as described elsewhere herein using a predictive algorithm for the non-FTS storage tiers using the total data storage system I/O workload. As described herein, as a result of the modeling performed in step 1704, outputs may include the predicted or modeled RT for each non-FTS tier, overall modeled data storage system RT and also an I/O workload distribution among the non-FTS tiers. In subsequent processing, the average RT of the non-FTS tier having the lowest ranked performance classification is used.

It should be noted that when modeling the RT of one of the non-FTS tiers, an embodiment may use the short term IOP rates (e.g., See FIG. 10 for various read and write rates along with possibly other information related to average I/O size) to determine a workload for each data portion in the tier. Using such short term metrics, an aggregate workload for all such data portions in each storage tier may be determined. Performance curves (e.g., FIGS. 13A-e) may be used to determine a predicted or modeled RT for each non-FTS tier. As described herein, an average modeled RT may be determined for each pools in a tier and then an aggregated average modeled RT for the tier determined using the pool level average RTs. In connection with step 1704, processing does not include actually implementing data movements based on the determined I/O workload distributions for the different non-FTS storage tiers.

At step 1706, processing may be performed to determine any change or delta in FTS workload (Delta_IOPS_N). Step 1706 may be determined in any suitable manner. Exemplary processing steps that may be performed to determine any change or delta in FTS workload are described in more detail below. Generally, if the FTS tier has better performance than the non-FTS tier than is ranked lowest in the relative performance classification, than the FTS tier may take on additional workload. If the FTS tier has worse performance than such a non-FTS tier, than workload may be moved out of FTS tier and therefore reduced.

At step 1708, processing is performed to determine the current total reserved I/O workload for the FTS tier (Total_Reserved_IOPS_External_N) based on any current delta or change in FTS workload (Delta_IOPS_N) and the previous total FTS reserved workload from the prior iteration (Total_Reserved_IOPS_External_N−1). In other words, Total_Reserved_IOPS_ExternalN may be determined as follows:

Total_Reserved_IOPS_External$N$=
Total_Reserved_IOPS_External$N$−1+
Delta_IOPS_$N$            EQUATION 8 where

Delta_IOPS_N is determined in step 1706 of this current Nth iteration, and

Total_Reserved_IOPS_ExternalN-1 is the total reserved I/O workload for the FTS tier from the previous iteration, N−1.

At step 1710, processing may be performed to ensure that the Total_Reserved_IOPS_ExternalN is within any specified I/O workload range. In one embodiment, a range may be defined having a range minimum, MIN, and range maximum, MAX, of I/O workload that may be reserved for the FTS tier. If Total_Reserved_IOPS_ExternalN is less than the MIN, then Total_Reserved_IOPS_ExternalN is increased to have the value MIN. Similarly if Total_Reserved_IOPS_ExternalN is more than MAX, Total_Reserved_IOPS_ExternalN is reduced to have the value MAX. Values for MIN and MAX may vary with embodiment. For example, in one embodiment MIN may be 1 I/O per second and MAX may be 50% of the current total I/O workload of the data storage system (as observed).

In connection with processing performed herein, various values may be stored for use between iterations. For example, values for Total_Reserved_IOPS_ExternalN and Delta_IOPS_N from the current iteration N are saved for use in the next subsequent iteration.

At step 1712 processing is performed to execute the predictive algorithm (as previously executed in step 1704) to distribute I/O workload among the non-FTS storage tiers with the difference that the workload distributed in step 1712 may be represented as the total I/O workload for the data storage system without (or less) the reserved I/O workload of FTS tier determined in step 1708 and possibly revised in step 1710.

In step 1714, data movements are determined and implemented based on the histogram determined in step 1712.

Figure 24:
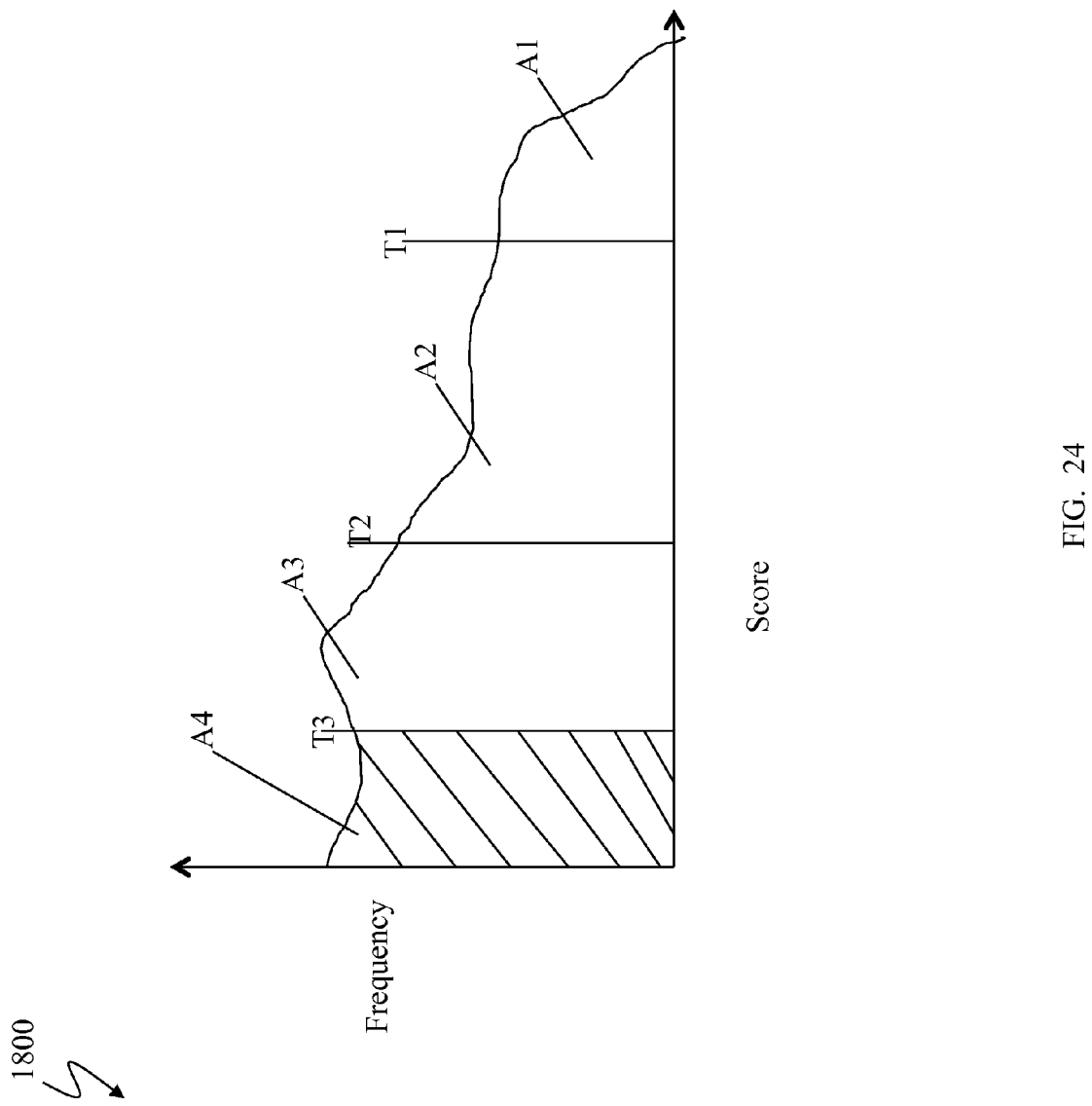
FIG. 24 is an example of a histogram that may be used in an embodiment in accordance with techniques herein.

Referring to FIG. 24, shown is an example of a histogram that may be produced using techniques described herein. The example 1800 illustrates a histogram produced as a result of the processing described herein such as in connection with determining various promotion thresholds (e.g., FIGS. 14-18) partitioning the I/O workload. In this example, assume there are 4 storage tiers including one FTS tier and 3 non-FTS tiers. The 3 non-FTS tiers may be an EFD tier, a tier of rotating FC drives and a tier of rotating SATA drives. The four storage tiers may be ranked relatively in a performance classification ranking, from highest performing to lowest performing, as EFD, FC, SATA and FTS. T1 may represent the threshold promotion score partitioning the workload A1 of the EFD storage tier and the workload A2 of the FC storage tier. T2 may represent the threshold promotion score partitioning the workload A2 of the FC storage tier and A3 of the SATA tier. T3 may represent the threshold promotion score partitioning the workload A3 the SATA tier and the workload A4 of FTS tier. Prior to performing processing to generate the histogram of 1800, the I/O workload A4 may be determined and reserved for the FTS tier. Since the FTS tier is the lowest ranked tier of the performance classification, the data portions having the lowest scores may be candidates for storing in the FTS tier. In this manner, when the histogram is first generated, the threshold T3 may be determined based on I/O workload reserved for the FTS tier as determined in steps 1708 and 1710. Those data portions having the scores denoted in A4 may have their data stored on the FTS storage tier. Subsequently, processing described elsewhere herein may be performed to determine promotion and/or demotion thresholds as described herein and distribute the remaining I/O workload associated with A1, A2 and A3 among the remaining 3 non-FTS tiers. In a similar manner, other portions or areas under the histogram curve may be accordingly reserved for the FTS tier if the FTS tier had a different position in the performance classification ranking. As described herein, data movements may be determined and implemented based on the histogram 1800 and current storage tier locations of data for the different data portions.

In this manner with reference to FIG. 24, an embodiment in accordance with techniques herein may determine data to move in or out of the FTS storage tier. One embodiment may use a histogram to model data placement into particular storage tiers (of different performance) based on how "hot" or "cold" (in terms of activity or workload) such data portions are. The histogram may then be adapted to partition some data portions for placement on the FTS storage tier.

What will now be described in more detail is how to determine the change or delta amount of I/O workload reserved for FTS tier, Delta_IOPS_N, as noted in step 1706.

Figure 25:
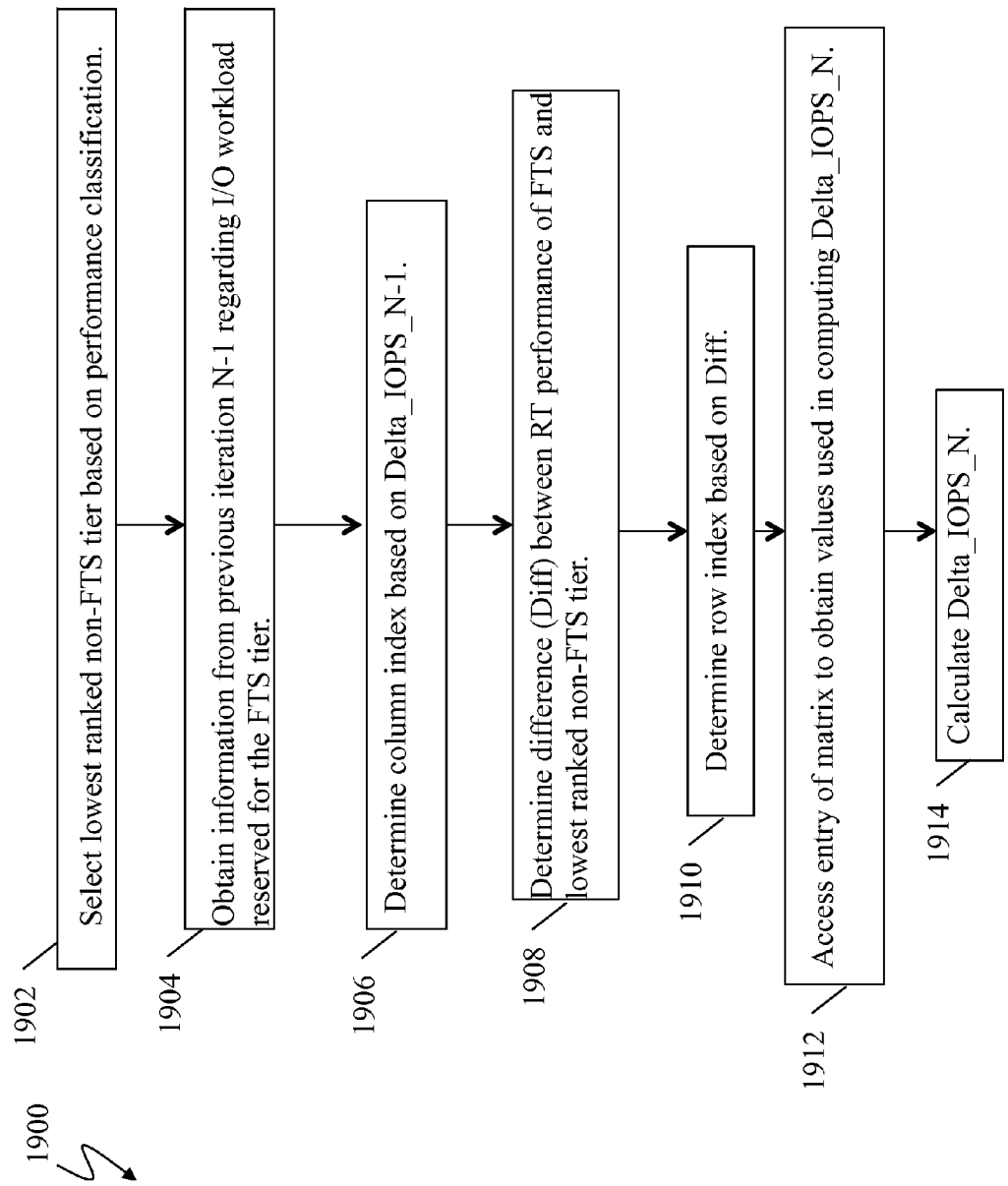

Referring to FIG. 25, shown is a flowchart 1900 of processing steps that may be performed to determine the change or delta amount of I/O workload reserved for FTS tier, Delta_IOPS_N, in an embodiment in accordance with techniques herein.

At step 1902, lowest ranked non-FTS tier is selected based on performance classification ranking denoting relative expected performance of storage tiers. For example, a ranking of EFD, FC, SATA, and FTS may be specified as described above denoting the performance classification ranking from highest to lowest. In this example, SATA is selected since it is the lowest ranked non-FTS tier. It should be noted that any tier for which I/Os are not projected (as result of step 1704 in FIG. 23) may be excluded. A tier may be excluded, for example, if no I/Os or workload are projected for that tier.

At step 1904, values determined from the previous iteration N−1 of FIG. 23 processing (e.g., I/O workload distribution algorithm) for FTS tier are obtained. Such values include the reserved I/O workload for FTS on the previous iteration (Total_Reserved_IOPS_External_N−1) and also the delta or change in reserved I/O workload for FTS from the previous iteration (Delta_IOPS_N−1, denoting the delta or change with respect to the reserved I/O workload for FTS as determined in the previous iteration of the I/O distribution algorithm for the FTS tier).

To further illustrate, for example, if the Nth iteration is currently executing, the information obtained in step 1904 is related to iteration N−1. Using this notation, assume the Nth iteration is currently executing to determine Total_Reserved_IOPS_ExternalN, which is the total amount of reserved I/O workload for the FTS tier for the current iteration n, and Delta_IOPS_N, which represents a change (e.g., increase or decrease or zero) with respect to Total_Reserved_IOPS_ExternalN−1, which is the total amount of reserved I/Os for the FTS tier of the previous n−1 iteration. Using this notation, step 1904 obtains the values Delta_IOPS_N−1 and Reserved_IOPS_ExternalN−1 previously stored from the prior iteration (N−1).

If this is the first iteration executing the I/O distribution algorithm, there is no prior iteration. Therefore, processing may determine values as follows: Delta_IOPS_N=0 and Total_Reserved_IOPS_ExternalN is set to the current workload or amount of I/Os (IOPS) currently executing in the FTS tier. Processing may then continue with step 1708 of FIG. 23.

At step 1906, the column index based on Delta_IOPS_N−1 is determined. The column index, along with row index determined in a subsequent step 1910, are used to identify a cell in a matrix whereby the cell includes values used to calculate Delta_IOPS_N. An example of the matrix and values included therein is described in more detail elsewhere herein.

Below is a pseudo-code representation of steps performed to determine column index.
If Delta_IOPS_N−1>0 then column index=0
If Delta_IOPS_N−1<0 then column index=1
If Delta_IOPS_N−1=0 then column index=2

At step 1908, the difference (Diff) between the average RT performance for FTS (denoted RT(FTS)) and the predicted or modeled RT of the lowest ranked non-FTS tier in the performance classification ranking of storage tiers (denoted RT(L)) is determined. Diff may be determined as expressed in the following:

$$\text{Diff}=RT(L)-RT(FTS) \quad \text{EQUATION 9}$$

It should be noted that the value for RT(FTS) may be the moving average RT as determined using EQUATION 7 described elsewhere herein. RT(L) may be an output of a modeled RT produced in step 1704 using predictive techniques described herein.

In step 1910, the row index is determined based on Diff (as determined in step 1908). If Diff is greater than 0, then row index may be assigned 0 meaning that RT of the lowest ranked non-FTS tier is more than RT of the FTS tier. In this case, FTS has a better RT than the lowest ranked non-FTS tier. (e.g., FTS tier has an average RT performance that is better than the lowest ranked non-FTS tier).

If Diff is less than 0, then row index may be assigned 1 meaning that RT of the lowest ranked non-FTS tier is less than RT of the FTS tier. In this case, FTS has a higher average RT (denoting worse performance) than the average modeled or predicted RT of the lowest ranked non-FTS tier.

If Diff is equal to zero, then row index may be assigned 2 meaning that the RT performance of FTS and the lowest ranked non-FTS tier are approximately the same.

It should be noted that an embodiment may introduce one or more threshold values used in determining whether there is any significant difference in RT performance between the FTS and lowest ranked non-FTS tier. Otherwise, if the actual difference (Diff) in RT performance between the FTS tier and lowest ranked non-FTS tier does not meet specified threshold criteria, the Diff is determined to be zero meaning that the row index is 2 and there is no significant difference in RT performance between the FTS tier and lowest ranked non-FTS tier. For example, an embodiment may specify two threshold values, ThVal representing an absolute RT performance value such as, for example, 4 milliseconds and PcntVal, representing a threshold percentage of difference whereby the percentage may be, for example, 50% of the maximum value between the two values being compared (e.g. largest of (RT(L) and RT(FTS)).

For example, as described above, to determine Diff is not equal to 0 may also mean that Diff has to be a value meeting at least the minimum threshold criteria. Otherwise Diff is determined to be zero. Based on the foregoing, Diff>0 means: RT(L)−RT(FTS)>=ThVal and also
(RT(L)−RT(FTS))/max(RT(L), RT(FTS))>=PcntVal
Diff<0 means: Rt(FTS)−Rt(L)>=ThVal and also
(RT(FTS)−RT(L))/max(RT(L), RT(FTS))>=PcntVal At step 1912, an entry of the matrix identified by the column index (determined in step 1906) and row index (determined in step 1910) is accessed to obtain values used in computing Delta_IOPS_N, for the current iteration.

At step 1914, Delta_IOPS_N may be calculated based on the following:

$$\text{Delta\_IOPS\_}N = [(A \times \text{Delta\_IOPS\_}N-1) + (P \times (\text{IO}^{fts} + \text{IO}^{lowtech}))] \times B \times (\text{Zone}^{lowtech}+1) \times \text{Sign} \quad \text{EQUATION 10}$$

Where:

Delta_IOPS_N−1 denotes a change in FTS reserved I/O workload previously determined for iteration N−1, the prior iteration.

$\text{IO}^{fts}$—Total I/O workload (under management of optimizer) currently running in the FTS tier.

$\text{IO}^{lowtech}$—Total I/O workload (under management of optimizer) currently running in the non-FTS tier having the lowest performance classification ranking $\text{Zone}^{lowtech}$—Current performance zone of non-FTS tier having the lowest performance classification ranking A, B, and P are constants obtained from the matrix entry. A is a constant denoting a weight associated with Delta_I-OPS_N−1. P is a constant denoting a weight associated with the quantity $\text{IO}^{FTS}+\text{IO}^{lowtech}$. B is a constant denoting an overall scaling factor, and Sign represents the sign of the quantity of the Delta_I-OPS_N as either positive or negative.

Zone in EQUATION 10 refers to a performance zone number currently selected for the denoted tier. It should be noted that exemplary performance zones described elsewhere herein are one-based (e.g., start with 1) and may include a total of 7 zones. In connection with EQUATION 10 as may be used in an embodiment, multiple zones may be defined for possible selection as described herein. However, for purposes of EQUATION 10 and computing the Delta_I-OPS_N it is assumed that zones may be zero-based, starting with 0, and may include a multiple zones, such as a total of 10 zones whereby such zones are numbered 0 through 9, inclusively. The particular number of zones and whether they are zero-based or one-based may vary with embodiment and EQUATION 10 may be accordingly adjusted based on the particular zone notation and number of zones used in an embodiment.

Referring to FIG. 26, shown is an example of 1600 of a matrix that may be used in connection with techniques herein. The example 1600 illustrates a matrix includes 9 cells or entries whereby each entry is identified by a row index 1610 and a column index 1612. Different values for the row 1610 and column 1612 may correspond, respectively, to the row and column indices determined by processing described above used to access an entry in the matrix to obtain values for sign, A, B and P as used in EQUATION 10 to calculate Delta_IOPS_N. Additionally, in this example, each entry of the matrix may include multiple sets of values for A, B, P and sign whereby each set of values in an entry further includes a value for Pos denoting a position in the performance classification ranking of FTS storage tier whose Delta_IOPS_N is computed via EQUATION 10. As described herein, a relative ranking or classification of all storage tiers may be specified denoting a relative ranking in terms of expected performance relative to other storage tiers. The ranking may denote the relative performance classification ranking of all storage tiers—including FTS and non-FTS tiers. The relative performance classification ranking may denote expected performance of the different tiers relative to one another. For example, there may be a total of 3 tiers—2 non-FTS tiers and the FTS tier whereby the 2 non-FTS tiers may be EFD and SATA and the FTS tier may be ranked lower than the SATA tier. In connection with the use of Pos denoting position in the performance classification ranking, 0 may denote the highest ranked performance tier and 2 may denote the lowest ranked performance tier. In addition to selecting an entry in the matrix, the position POS in the performance classification ranking of the FTS tier may denote the particular set of values in an entry of the matrix to use for obtaining values for sign, A, B and P. For example, if FTS is ranked last in the performance classification ranking as just mentioned, FTS may have a position of 2 in the ranking, SATA may have a position of 1 in the ranking, and EFD may have a position of 0 in the ranking An entry such as 0,0 may be selected from the matrix in 1500 and the last set of values (2,1,0,0,0) specifying, respectively, values for Pos, sign, A, B and P, may be selected.

The ranking of an FTS tier in the performance classification ranking may be specified in any suitable manner. For example, the ranking of FTS, and also other storage tiers, may be specified with user-provided inputs, in a configuration file, using default(s), or automatically determined. For example, by default, FTS may be the lowest ranked performance tier such as may be the case when the performance information of the FTS tier is unknown or incomplete prior to acquiring sufficient observed performance data. At a later point in time, if the behavior of the FTS tier is analyzed (either through automated analysis as described elsewhere herein or through visual inspection of observed performance data for FTS), it may be determined to modify the relative ranking of the FTS tier with respect to the other storage tiers. Depending on the relative ranking of the FTS tier, different values may be used for the coefficients thereby affecting the amount by which the FTS I/O workload may increase or decrease.

An embodiment may also not have an initial performance classification provided for the FTS tier relative to the other tiers. In this case, an embodiment may omit POS from the matrix and may only include a single set of values in the matrix. In this manner, the set of values in each matrix cell may correspond to an amount of adjustment to the I/O workload (IOPS) based on the level of aggressiveness desired. Such values in the matrix may be user-specified or configurable thereby affecting the amount by which the workload of the FTS tier may be increased or decreased in accordance with the index values.

Each of the different entries in the matrix 1500 will now be described in more detail.

Entry (0,0) is associated with a case where the FTS tier has higher performance than the lowest ranked non-FTS tier in the performance classification ranking and the last execution of the algorithm for I/O distribution increased the I/O workload reserved for the FTS tier. A sign value of 1 indicates that the I/O workload for the FTS tier will further increased in the current iteration.

Entries (0,1) and (0,2) are each associated with a case where the FTS tier has higher performance than the lowest ranked non-FTS tier in the performance classification ranking and the last execution of the algorithm for I/O distribution did not increase the I/O workload reserved for the FTS tier enough. A sign value of 1 indicates that the I/O workload for the FTS tier will further increased in the current iteration.

Entry (1,0) is associated with a case where the FTS tier has lower performance than the lowest ranked non-FTS tier in the performance classification ranking and the last execution of the algorithm for I/O distribution increased the I/O workload reserved for the FTS tier. A sign value of −1 indicates that the I/O workload for the FTS tier will be further decreased in the current iteration.

Entry (1,1) is associated with a case where the FTS tier has lower performance than the lowest ranked non-FTS tier in the performance classification ranking and the last execution of the algorithm for I/O distribution decreased the I/O workload reserved for the FTS tier. A sign value of −1 indicates that the I/O workload for the FTS tier will be further decreased in the current iteration.

Entry (1,2) is associated with a case where the FTS tier has lower performance than the lowest ranked non-FTS tier in the performance classification ranking and the last execution of the algorithm for I/O distribution did not decrease the I/O workload reserved for the FTS tier by enough. A sign value of −1 indicates that the I/O workload for the FTS tier will further decreased in the current iteration.

Entry (2,0) is associated with a case where the FTS tier is determined to have the same level of observed performance as the lowest ranked non-FTS tier in the performance classification ranking and the last execution of the algorithm for I/O distribution increased the I/O workload reserved for the FTS tier. A sign value of 0 indicates that the I/O workload reserved for the FTS tier will remain the same in the current iteration.

Entry (2,1) is associated with a case where the FTS tier is determined to have the same level of observed performance as the lowest ranked non-FTS tier in the performance classification ranking and the last execution of the algorithm for I/O distribution decreased the I/O workload reserved for the FTS tier. For tier POS 2, a sign value of 0 indicates that the I/O workload reserved for the FTS tier will remain the same in the current iteration. For tier POS 0 and 1, a sign value of 1 means that the I/O workload reserved for the FTS tier will be increased in this iteration.

Entry (2,2) is associated with a case where the FTS tier is determined to have the same level of observed performance as the lowest ranked non-FTS tier in the performance classification ranking A sign value of 0 indicates that the I/O workload reserved for the FTS tier will remain the same in the current iteration.

It should be noted that the relative ranking or classification and positions in the ranking (as denoted by Pos) may be performance based as described herein. However, more generally, the ranking may be based on performance and/or other ranking criteria such as other storage tier attribute(s) which may cause one tier to be ranked higher than another. For example, there may be two storage tiers including PDs having the same performance characteristics and same technology drive by the same vendor such as the two storage tiers including 10K FC disk drives by the same vendor. However, a first tier of 10K FC drives may be configured using a first RAID configuration (e.g., RAID-1) and the second tier of 10 FC drives may be configured using a second RAID configuration (e.g., RAID-6) different than the first RAID configuration. It may be desirable to rank the second tier higher than the first tier, for example, since RAID-6 provides a higher level of robustness in terms of data protection than RAID-1 (e.g., RAID-6 can sustain a 2 drive member failure and perform an internal RAID group rebuild without requiring data recovery from a backup and RAID-1 (which is mirroring data) cannot). In this manner, the criteria for ranking may rank a tier higher than another based on the number of sustainable drive member failures without requiring data restoration or recovery from a backup or other complete copy of the data.

Although a matrix is the exemplary structure illustrated and used in connection with techniques herein, more generally as will be appreciated by those skilled in the art, the particular values used in determining the reserved I/O workload for the FTS storage tier may be determined in any suitable manner using any known data structures.

It should be noted that this relative ranking or classification of the tiers such as with respect to performance classification may be further characterized as predetermined based on expected overall relative performance at different workloads. Such a predetermined performance classification is different from relatively ranking storage tiers based on currently observed performance that may vary with different workloads at different points in time.

In accordance with techniques herein, storage tiers in a data storage system may be partitioned into an FTS tier and one or more other non-FTS tiers. The total JO workload reserved for FTS may be determined based on performance feedback thereby causing the FTS workload to dynamically adapt over time as discovered through observed performance data. The remaining non-FTS tiers may have I/O workload projected using predictive techniques using modeled performance curves.

As described herein, the reserved I/O workload for the FTS tier may depend on one or more factors or criteria including, for example, the previous change in reserved I/O workload for the FTS tier as determined in a previous iteration of processing (e.g., IOPS Delta N−1), the RT performance comparison between the FTS tier and the non-FTS tier having the lowest relative performance classification ranking, the total workload currently running in the FTS tier, the total workload currently running in the non-FTS tier having the lowest relative performance classification ranking, the current performance zone position of the non-FTS tier having the lowest relative performance classification ranking, and an amount of data movements performed as a result of implementing data movement policies.

An embodiment in accordance with techniques herein may have an FTS tier whose performance characteristics are generally unknown, incomplete and/or otherwise unstable. At a first point in time, the particular nature and performance aspects of the FTS tier may be unknown and the techniques described herein may be performed as described. At some later point in time, processing may be performed to dynamically assess whether the observed performance for different workloads of the FTS tier are characteristic of an unstable and/or unknown existing non-FTS tier. In other words, observed performance data over time may be collected regarding various I/O workloads and resulting observed RTs of the FTS tier. An assessment may be made at a later point in time to use such observed data to determine whether the observed performance illustrates a suitable level of stability and/or matches performance characteristics of any existing known non-FTS storage tier. A suitable level of stability may be determined, for example, using statistics. For example, a mean I/O RT, standard deviation and/or variance with respect to the mean I/O RT may be determined using the collected performance data for the FTS tier. The FTS tier may be determined as stable if the standard deviation and/or variance are within predetermined limits or thresholds. In this case, the FTS tier may be reclassified as a non-FTS or known tier having expected performance characteristics as demonstrated based on the mean I/O RT, and/or within some defined range of the mean I/O RT. The range may be determined based on, for example, one standard deviation from the mean RT. If an FTS demonstrates such stability, its performance curves may be used with a certain amount of confidence and reliability in consistently predicting RT values for given I/O workloads. As a second consideration, the performance data collected for the FTS tier may also correspond sufficiently to behavior associated with a known drive technology, such as EFD, rotating FC drives, or rotating SATA drives. In this case, the performance data for the FTS tier may be used to form performance curves denoting different observed RTs for different I/O workloads (e.g., different I/O rates, read/write mixtures, I/O sizes). The FTS performance curves may be compared to other known performance curves of different storage tiers and associated drive technologies and other storage tier attributes to determine whether the PDs of FTS tier exhibit performance curves similar to those of other PDs, such as EFD, rotating FC drives, and the like. In this manner, the FTS tier may be dynamically assessed for possible classification as a new known non-FTS tier.

With reference back to FIGS. 20 and 21, the techniques herein may be used with a storage tier including physical devices of one or more external data storage systems whereby such external physical devices may be subject to data movement optimizations performed by the data storage optimizer (or other component used by the data storage optimizer) such as included, for example, in the first data storage system 2804 of FIG. 20 and the appliance 2904 (which may also generally be referred to as a data storage system) of FIG. 21. For example, as described elsewhere herein, the one or more LUNs and backing external PDs of the external storage system may include some or all of the provisioned storage for a set of one or more logical devices to which I/Os are directed. The storage management and data storage optimizations (such as data movement optimizations) of the PDs of the external data storage system may be performed by a data storage optimizer located in another different data storage system.

The techniques herein may be used in an embodiment where the data storage optimizer performing the optimizations (such as data movements) is located in a first (or primary) data storage system and PDs including data subject to data movement may be located in the first data storage system and also another second external data storage system. Performing such techniques on the primary data storage system or component other than the data storage systems being managed provides for a global view whereby the data movement optimizations may be performed viewing multiple data storage systems as a single entity for data movement where the source may be any device location in the single entity or aggregated view, and the target may be any device location in the single entity or aggregated view (e.g. may perform data movement optimizations within a single or same data storage system and/or across or between different multiple data storage systems within a data center or federation).

As described herein, an embodiment in accordance with techniques herein may perform any one or more of the above-mentioned techniques alone, or in combination with others. For example, an embodiment may use the techniques for data storage optimizations described herein such as to evaluate which data portions are subject to data movements in connection with storage on one or more data storage systems where the optimizer performing such optimizations is located on a component external from the data storage system(s) to which the optimizations are being applied. In some embodiments, the data storage systems may be further characterized as different unitary storage systems, and the data storage movements and evaluation of candidate data portions for such data movements may include performing such optimizations spanning multiple physical data storage systems, such as data storage arrays. The different physical data storage systems to which the data movement optimization may be applied may be heterogeneous such as from different data storage vendors, having different PD technologies and performance classifications, and the like. As also described herein, an embodiment may have the primary data storage system perform data storage movement optimizations using its own local PDs as well as PDs of an external data storage system whereby the primary data storage system may store data on the external data storage system and may also perform data storage optimizations with respect to its local PDs and also those PDs of the external system.

With reference to FIGS. 20 and 21, although techniques herein are described with reference to an external data storage system having external LUNs and backing external PDs whose performance characterizations are unknown, incomplete and/or not well-behaved so as to be able to use predictive techniques to model performance. More generally, techniques herein may be used with any storage tier having PDs which are unknown, incomplete and/or not well-behaved so as to be able to use predictive techniques to model performance and may not be located in a data storage system different from the optimizer performing techniques herein. For example, with reference to FIG. 20, it may be that PDs within the primary DS 2804 are included in such a storage tier. In this manner, the DS 2804 may include the data storage optimizer 2801 and may also include PDs of the external storage tier, or more generally, storage tier whose performance classification and/or characteristics are unknown, incomplete, and/or otherwise are not able to be modeled using well-defined performance models for various I/O workloads.

The techniques herein may be used in an embodiment having a heterogeneous storage environment in which such techniques are performed to facilitate dynamically adapting to any changes that may occur in the external storage tier, for example, due to ongoing modifications of the external storage tier such as to the underlying external PDs used to provision storage for the external LUNs (e.g., addition of new PDs, removal of PDs, replacement of PDs), creation and/or removal of LUNs, addition and/or removal of entire data storage systems, and the like. The techniques herein may be performed in an ongoing manner in an embodiment to monitor and detect any such changes over time and accordingly obtain current updated information based on any changes. In this manner, the techniques herein provide for adaptive optimal I/O or workload distribution among multiple storage tiers including a storage tier whose performance classification and characteristics may be incomplete, unknown, and/or otherwise may not be modeled using a well-defined performance response model for various given I/O workloads such as, for example, due to the changing performance model of the external storage tier.

The techniques herein may be performed by executing code which is stored on any one or more different forms of computer-readable media. Computer-readable media may include different forms of volatile (e.g., RAM) and non-volatile (e.g., ROM, flash memory, magnetic or optical disks, or tape) storage which may be removable or non-removable.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method for performing data storage optimizations comprising:
   determining a reserved workload for a first of a plurality of storage tiers, each of the plurality of storage tiers characterized by a set of one or more attributes, wherein said first storage tier includes performance characteristics which are any of incomplete, unknown, and unable to be predictively modeled for various workloads, said plurality of storage tiers including the first tier and a remaining set of one or more additional storage tiers;
   modeling performance of a first workload distributed among the remaining set of storage tiers, wherein said first workload represents a total workload less the reserved workload;
   determining one or more data movements in accordance with said modeling, each of said one or more data movements moving a data portion from a first physical device of one of the plurality of storage tiers to a second physical device of another of the plurality of storage tiers; and
   performing at least a first of the one or more data movements that moves a data portion between two of the plurality of storage tiers, and wherein said determining the reserved workload further comprises:
   selecting a second storage tier from the remaining set, wherein said second storage tier is ranked as having a minimum classification ranking of all storage tiers in the remaining set; and
   determining a difference between a first average observed response time for the first storage tier and a modeled average response time for the second storage tier.

2. The method of claim 1, wherein response time performance of the first tier is unable to be predictively modeled for various I/O workloads and response time performance of each storage tier in the remaining set is predictively modeled for various I/O workloads in said modeling.

3. The method of claim 2, wherein the minimum classification ranking represents that the second storage tier includes physical devices which are expected to have lower response time performance characteristics for a given workload than any other storage tier in the remaining set.

4. The method of claim 1, wherein said reserved workload is determined in accordance with one or more criteria including said difference.

5. The method of claim 4, wherein said reserved workload for a current processing iteration is equal to a previous reserved workload and a delta amount, said previous reserved workload having been determined for the first storage tier at a second processing iteration performed prior to the current processing iteration, a previous delta amount being determined in said second processing iteration.

6. The method of claim 5, wherein said criteria includes said previous delta amount.

7. The method of claim 6, wherein said criteria includes any of a total workload running in the first storage tier and a total workload running in the second storage tier.

8. The method of claim 5, wherein said determining the reserved workload further comprises:
   determining a column index of an entry in a matrix using said previous delta amount;
   determining a row index of an entry in a matrix based on said difference; and
   accessing an entry of the matrix identified by the column index and said row index.

9. The method of claim 8, wherein said entry includes a plurality of values including constants used in determining said delta amount.

10. The method of claim 1, further comprising:
    modeling performance of the total workload distributed among the remaining set of storage tiers.

11. The method of claim 10, wherein said modeling performance of the total workload is performed prior to said steps of determining a reserved workload for a first of a plurality of storage tiers, modeling performance of a first workload distributed among the remaining set of storage tiers, and determining one or more data movements in accordance with said modeling, each of said one or more data movements moving a data portion from a first physical device of one of the plurality of storage tiers to a second physical device of another of the plurality of storage tiers, and wherein said modeled average response time is determined in said modeling performance of the total workload.

12. The method of claim 1, wherein said modeling performance of a first workload includes using a histogram of scores representing modeled activity levels of data portions of the remaining set of storage tiers.

13. The method of claim 1, wherein said one or more data movements are data movement optimizations and wherein one of said data movement optimizations is a promotion if a data portion is moved from the first physical device to the second physical device and the second physical device has a second performance classification denoting a higher level of expected response time performance than a first performance classification associated with the first physical device, and said one data movement optimization is otherwise a demotion if the first performance classification is associated with a higher level of performance than said second performance classification.

14. The method of claim 1, wherein each of the plurality of storage tiers is characterized by a unique set of one or more properties different from any other unique set of one or more properties characterizing another of the plurality of storage tiers.

15. The method of claim 14, wherein at least one of the properties of the unique set relates to a physical device characteristic of physical devices of one of the plurality of storage tiers characterized by said unique set.

16. The method of claim 1, wherein said modeling uses performance curves to model response time performance of storage tiers in the remaining set for various I/O workloads.

17. A method for performing data storage optimizations comprising:
   determining a reserved workload for a first of a plurality of storage tiers, each of the plurality of storage tiers characterized by a set of one or more attributes, wherein said first storage tier includes performance characteristics which are any of incomplete, unknown, and unable to be predictively modeled for various workloads, said plurality of storage tiers including the first tier and a remaining set of one or more additional storage tiers;
   modeling performance of a first workload distributed among the remaining set of storage tiers, wherein said first workload represents a total workload less the reserved workload;
   determining one or more data movements in accordance with said modeling, each of said one or more data movements moving a data portion from a first physical device of one of the plurality of storage tiers to a second physical device of another of the plurality of storage tiers; and
   performing at least a first of the one or more data movements that moves a data portion between two of the plurality of storage tiers, wherein said modeling performance of a first workload includes using a histogram of scores representing modeled activity levels of data portions of the remaining set of storage tiers, and wherein one or more thresholds identify performance score thresholds and are dynamically determined using any of a capacity limit and a performance limit.

18. A non-transitory computer readable medium comprising code, that when executed, performs a method of data storage optimizations comprising:
   determining a reserved workload for a first of a plurality of storage tiers, each of the plurality of storage tiers characterized by a set of one or more attributes, wherein said first storage tier includes performance characteristics which are any of incomplete, unknown, and unable to be predictively modeled for various workloads, said plurality of storage tiers including the first tier and a remaining set of one or more additional storage tiers;
   modeling performance of a first workload distributed among the remaining set of storage tiers, wherein said first workload represents a total workload less the reserved workload;
   determining one or more data movements in accordance with said modeling, each of said one or more data movements moving a data portion from a first physical device of one of the plurality of storage tiers to a second physical device of another of the plurality of storage tiers; and
   performing at least a first of the one of the one or more data movements that moves a data portion between two of the plurality of storage tiers, and wherein said determining the reserved workload further comprises:
   selecting a second storage tier from the remaining set, wherein said second storage tier is ranked as having a minimum classification ranking of all storage tiers in the remaining set; and
   determining a difference between a first average observed response time for the first storage tier and a modeled average response time for the second storage tier.

19. A system comprising:
   a host which sends I/O requests to a first data storage system;
   said first data storage system comprising a memory including code stored therein that performs processing comprising:
      determining a reserved workload for a first of a plurality of storage tiers, each of the plurality of storage tiers characterized by a set of one or more attributes, wherein said first storage tier includes performance characteristics which are any of incomplete, unknown, and unable to be predictively modeled for various workloads, said plurality of storage tiers including the first tier and a remaining set of one or more additional storage tiers; and
      modeling performance of a first workload distributed among the remaining set of storage tiers, wherein said first workload represents a total workload less the reserved workload;
      determining one or more data movements in accordance with said modeling, each of said one or more data movements moving a data portion from a first physical device of one of the plurality of storage tiers to a second physical device of another of the plurality of storage tiers; and
      performing at least a first of the one or more data movements that moves a data portion between two of the plurality of storage tiers, and wherein said determining the reserved workload further comprises:
      selecting a second storage tier from the remaining set, wherein said second storage tier is ranked as having a minimum classification ranking of all storage tiers in the remaining set and
      determining a difference between a first average observed response time for the first storage tier and a modeled average response time for the second storage tier; and
   a second data storage system including physical devices of the first storage tier, wherein a first I/O request sent from the host to the first data storage system accesses data stored on a physical device of the first storage tier.

* * * * *